(12) United States Patent
Wang et al.

(10) Patent No.: US 8,344,434 B2
(45) Date of Patent: Jan. 1, 2013

(54) SEMICONDUCTOR DEVICE HAVING FERROELECTRIC CAPACITOR

(75) Inventors: Wensheng Wang, Kawasaki (JP); Yoshimasa Horii, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/100,511

(22) Filed: May 4, 2011

(65) Prior Publication Data

US 2011/0204479 A1    Aug. 25, 2011

Related U.S. Application Data

(62) Division of application No. 11/939,707, filed on Nov. 14, 2007, now Pat. No. 7,960,228.

(30) Foreign Application Priority Data

Nov. 14, 2006    (JP) .................................. 2006-308161

(51) Int. Cl.
*H01L 21/02* (2006.01)
*H01L 27/108* (2006.01)
*H01L 29/94* (2006.01)
*H01L 21/00* (2006.01)
*H01L 21/8242* (2006.01)

(52) U.S. Cl. . 257/295; 257/296; 257/306; 257/E27.104; 257/E21.663; 257/E21.664; 438/3; 438/256

(58) Field of Classification Search .................... None
See application file for complete search history.

(56) References Cited

U.S. PATENT DOCUMENTS

| | | | |
|---|---|---|---|
| 5,998,819 A | 12/1999 | Yokoyama et al. | |
| 6,146,906 A | 11/2000 | Inoue et al. | |
| 6,203,608 B1 | 3/2001 | Sun et al. | |
| 6,531,726 B1 | 3/2003 | Takamatsu | |
| 6,586,790 B2 | 7/2003 | Kanaya et al. | |
| 6,855,974 B2 | 2/2005 | Matsuura et al. | |
| 6,887,716 B2 | 5/2005 | Fox et al. | |
| 7,078,242 B2 | 7/2006 | Matsuura et al. | |
| 2002/0075631 A1 | 6/2002 | Singh et al. | |
| 2004/0155272 A1 | 8/2004 | Shin et al. | |
| 2005/0136556 A1 | 6/2005 | Matsuura et al. | |
| 2006/0043445 A1 | 3/2006 | Wang | |
| 2006/0073613 A1 | 4/2006 | Aggarwal et al. | |
| 2006/0183250 A1 | 8/2006 | Choi et al. | |
| 2007/0231927 A1* | 10/2007 | Yamakawa et al. ............... 438/3 |

FOREIGN PATENT DOCUMENTS

| | | |
|---|---|---|
| JP | 05-347391 A | 12/1993 |
| JP | 9-260612 A | 10/1997 |
| JP | 11-292626 A | 10/1999 |

(Continued)

*Primary Examiner* — N Drew Richards
*Assistant Examiner* — Michael Jung
(74) *Attorney, Agent, or Firm* — Westerman, Hattori, Daniels & Adrian, LLP

(57) ABSTRACT

The present invention provides a method for manufacturing a semiconductor device, including the steps of: forming a first ferroelectric film on a first conductive film by a film-forming method including at least a step of forming a film by a sol-gel method; forming a second ferroelectric film on the first ferroelectric film by a sputtering method; forming a second conductive film on the second ferroelectric film; and forming a capacitor provided with a lower electrode, a capacitor dielectric film and an upper electrode by patterning the first conductive film, the first and second ferroelectric films and the second conductive film.

6 Claims, 44 Drawing Sheets

FOREIGN PATENT DOCUMENTS

| | | |
|---|---|---|
| JP | 2000-031403 A | 1/2000 |
| JP | 2000-082792 A | 3/2000 |
| JP | 2000-91270 A | 3/2000 |
| JP | 2001-127262 A | 5/2001 |
| JP | 2001-237392 A | 8/2001 |
| JP | 2002-246564 A | 8/2002 |
| JP | 2003-218325 A | 7/2003 |
| JP | 2004-153006 A | 5/2004 |
| JP | 2004-214569 A | 7/2004 |
| JP | 2004-296735 A | 10/2004 |
| JP | 2005-183842 A | 7/2005 |
| JP | 2006-73648 A | 3/2006 |

* cited by examiner

SEMICONDUCTOR DEVICE HAVING FERROELECTRIC CAPACITOR

CROSS-REFERENCE TO RELATED APPLICATIONS

This application is a divisional of U.S. application Ser. No. 11/939,707, filed on Nov. 14, 2007 which is based on and claims priority of Japanese Patent Application No. 2006-308161 filed on Nov. 14, 2006, the entire contents of which are incorporated herein by reference.

TECHNICAL FIELD

The present invention relates to a semiconductor device and a method for manufacturing the same.

BACKGROUND

Recently, nonvolatile memories capable of storing a large volume of data at a high speed have been developed along with the development of digital technologies.

A flash memory and a ferroelectric memory are well-known as such nonvolatile memories.

Among these nonvolatile memories, the flash memory includes a floating gate embedded in a gate insulating film of an insulated-gate field-effect transistor (IGFET), and stores information by accumulating electric charges indicating recording information, in the floating gate. However, there is a drawback that a relatively high voltage needs to be provided to such a flash memory since it is necessary to flow a tunnel current to the gate insulating film of the flash memory at the time of writing and erasing the information.

In contrast, the ferroelectric memory, which is also referred to as a ferroelectric random access memory (FeRAM), stores information by utilizing the hysteresis characteristic of a ferroelectric film formed in a ferroelectric capacitor. The ferroelectric film causes polarization in response to a voltage applied between upper and lower electrodes of the capacitor, and spontaneous polarization remains even after the voltage is removed. When the polarity of the applied voltage is reversed, the polarity of the spontaneous polarization is also reversed. By causing directions of the polarity to correspond respectively to "1" and "0," the information is written in the ferroelectric film. Advantages of the FeRAM are that the voltage required for writing in the FeRAM is lower than that required for writing in the flash memory, and that it is possible to write information in the FeRAM at a higher speed than that of the flash memory. A system on chip (SOC), on which a FeRAM and a logic circuit are mixedly mounted, has been examined to be used for an IC card and the like by utilizing the above advantages.

A capacitor dielectric film provided to the ferroelectric capacitor is made of, for example, a PZT (Lead Zirconate Titanate: $PbZrTiO_3$) film. There are various kinds of methods for forming the capacitor dielectric film.

For example, in Japanese Patent Application Laid-open Publication Hei 11-292626, the PZT film is formed by a sol-gel method using a solution in which an organometallic compound is dissolved in an organic solvent such as butanol. The sol-gel method has an advantage that costs for forming a film is lower than those of a sputtering method, a metal organic chemical vapor deposition (MOCVD) method or the like. Hence, the sol-gel method has been widely studied and developed.

In addition, when the ferroelectric capacitor is formed, thermal treatment is generally carried out in an oxygen atmosphere for the purpose of recovering damages and defects caused in the ferroelectric film. For this reason, an iridium oxide film is used as an upper electrode of the ferroelectric capacitor in some cases, because the iridium oxide film is not easily oxidized even in the oxygen atmosphere.

However, it is known that huge crystals made of abnormally-grown iridium oxide are easily generated on a surface of an iridium oxide film. The huge crystals deteriorate electric characteristics of the ferroelectric capacitor, and this may finally cause a decrease in yield of semiconductor devices.

To solve such a problem, in Japanese Patent Application Laid-open Publication No. 2001-127262, a two-step sputtering method is used to suppress generation of the aforementioned huge crystals. Two-step sputtering method includes the first step of forming a film by low sputtering power, and the second step of growing the film by high sputtering power, and these two steps are sequentially carried out (paragraph 0025).

In Japanese Patent Application Laid-open Publication No. 2000-91270 (JP No. 2000-91270 A), a laminated film which is configured by forming an iridium oxide film and an iridium film in this order, is used as an upper electrode. According to JP No. 2000-91270 A, the iridium oxide film of the lower layer prevents deterioration of capacitance characteristics, and the iridium film of the upper layer reduces resistance of the upper electrode (paragraph 0027).

In Japanese Patent Application Laid-open Publication No. 2002-246564, a PZT film formed by a sputtering method is crystallized by performing the first anneal on the PZT film (paragraph number 0035). Then, after an upper electrode made of iridium oxide is formed on the PZT film, the second anneal is carried out on the upper electrode (paragraph 0038).

In Japanese Patent Application Laid-open Publication No. 2005-183842, a laminated film formed of first and second conductive metal oxide films, both of which are made iridium oxide, is used as an upper electrode (paragraph 0035 to 0037).

Similarly, in Japanese Patent Application Laid-open Publication No. 2006-73648, a two-layered iridium oxide film is formed as an upper electrode (paragraph 0033).

On the other hand, in Japanese Patent Application Laid-open Publication No. 2001-237392, the PZT film is formed by a physical vapor deposition (PVD) method, a CVD method, the sol-gel method or the like, and an iridium film and an iridium oxide film are used as upper and lower electrodes (paragraph 0020 and 0021).

In Japanese Patent Application Laid-open Publication No. 2003-218325, a first PZT film in an amorphous state is formed by a sputtering method, and the PZT film is annealed to be crystallized. After that, a second PZT film is formed on the first PZT film by a MOCVD method (paragraph 0024 to 0027).

In Japanese Patent Application Laid-open Publication No. 2004-153006, a platinum oxide film is formed between an iridium oxide film constituting a lower electrode and a PZT film, in order to prevent iridium of the lower electrode from diffusing into the PZT film due to anneal at the time of crystallizing the PZT film (paragraph 0074).

In Japanese Patent Application Laid-open Publication No. 2004-296735, an oxygen-containing film and a barrier film are formed on a PZT film. Thereby, oxygen is supplied from the oxygen-containing film to the PZT film at the time of anneal the PZT film, and the barrier film prevents this oxygen from escaping upward (paragraph 0046).

Then, according to Japanese Patent Application Laid-open Publication No. 2004-214569, a decrease in switching charge of a capacitor is relieved by stacking a PZT film formed by the MOCVD method and a PZT film formed by the sputtering method in this order (paragraph 0049 and 0060).

On the other hand, in Japanese Patent Application Laid-open Publication No. Hei 9-260612, a capacitor dielectric film formed by stacking an SBT film, an SBTN film, and an SBT film in this order maintains residual spontaneous polarization and switching charge, and keeps coercive electric field and a leak current low (paragraph 0059).

In addition, in Japanese Unexamined Patent Application Publication No. Hei 5-347391 (JP No. Hei 5-347391 A), and Japanese Patent Application Laid-open Publications Nos. 2000-82792 and 2000-31403, a crystallized first ferroelectric film and an amorphous second ferroelectric film are formed in this order as a capacitor dielectric film (see, for example, paragraph 0007 in JP No. Hei 5-347391 A).

SUMMARY

According to one aspect of the present invention, there is provided a semiconductor device, having a semiconductor substrate, an interlayer insulating film formed over the semiconductor substrate, a capacitor formed on the interlayer insulating film, wherein the capacitor including a lower electrode, a capacitor dielectric film made of a ferroelectric material, and an upper electrode, wherein the capacitor dielectric film is made by forming a first ferroelectric film and a second ferroelectric film in this order, where the second ferroelectric film being doped with an additive element and being thinner than the first ferroelectric film, and an interface between the second ferroelectric film and the upper electrode being substantially flat.

According to another aspect of the present invention, there is provided a method for manufacturing a semiconductor device, having the steps of: forming a first interlayer insulating film over a semiconductor substrate, forming a first conductive film on the first interlayer insulating film, forming a first ferroelectric film on the first conductive film by a film-forming method including at least a film forming step using a sol-gel method, forming a second ferroelectric film on the first ferroelectric film by a sputtering method, forming a second conductive film on the second ferroelectric film, and forming a capacitor including a lower electrode, a capacitor dielectric film and an upper electrode by patterning the first conductive film, the first and second ferroelectric films and the second conductive film.

DETAILED DESCRIPTION OF THE EMBODIMENTS (1) First Embodiment

Figure 1A:
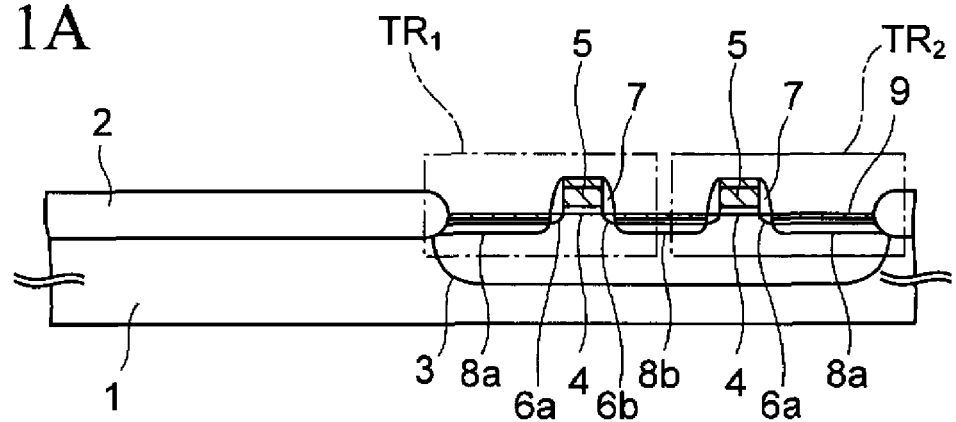
FIGS. 1A to 1O are cross-sectional views showing processes of manufacturing a semiconductor device according to a first embodiment of the present invention.

FIGS. 1A to 1O are cross-sectional views showing processes of manufacturing a semiconductor device according to a first embodiment of the present invention.

Firstly, steps for obtaining a cross-sectional structure shown in FIG. 1A will be described.

A device isolation insulating film 2 is formed by thermally oxidizing a surface of an n-type or a p-type silicon (semiconductor) substrate 1, and an active region of a transistor is defined by the device isolation insulating film 2. Such a device isolation structure is referred to as local oxidation of silicon (LOCOS). However, instead of this structure, shallow trench isolation (STI) may be used.

Next, after introducing p-type impurities, such as boron, into the active region of the silicon substrate 1 to form a p-well 3, a thermal oxidation film to be a gate insulating film 4 is formed with a thickness of approximately 6 to 7 nm by thermally oxidizing the surface of the active region.

Subsequently, an amorphous silicon film with a thickness of approximately 50 nm and a tungsten silicide film with a thickness of approximately 150 nm are sequentially formed on an entire upper surface of the silicon substrate 1. Instead of the amorphous silicon film, a polysilicon film may be formed. After that, these films are patterned by photolithography to form a gate electrode 5 on the silicon substrate 1.

Two of the gate electrodes 5 are formed parallel to each other on the p-well 3, and each of the gate electrodes 5 forms a part of a word line.

Moreover, phosphorus as n-type impurities is introduced into a portion of the silicon substrate 1 beside the gate electrodes 5 by ion implantation using the gate electrodes 5 as a mask. Thereby, first and second source/drain extensions 6a and 6b are formed.

After that, an insulating film is formed on the entire upper surface of the silicon substrate 1, and the insulating film is etched back to be left as insulating sidewalls 7 beside the gate electrodes 5. As the insulating film, a silicon oxide film is formed by a chemical vapor deposition (CVD) method, for example.

Subsequently, by carrying out again the ion implantation to introduce n-type impurities, such as arsenic, into the silicon substrate 1 while using the insulating sidewalls 7 and the gate electrodes 5 as a mask, first and second source/drain regions (first and second impurity diffusion regions) 8a and 8b are formed on the silicon substrate 1 beside the gate electrodes 5.

Furthermore, a refractory metal film, such as a cobalt film, is formed by a sputtering method on the entire upper surface of the silicon substrate 1. Then, the refractory metal film is heated, and thereby caused to react with silicon. Accordingly, a refractory metal silicide layer 9, such as a cobalt silicide layer, is formed in the first and second source/drain regions 8a and 8b on the silicon substrate 1. By this refractory metal silicide layer 9, resistance of the first and second source/drain regions 8a and 8b is made lowered.

Thereafter, the refractory metal layer left unreacted on the device isolation insulating film 2 and the like is removed by wet etching.

With the steps described so far, first and second MOS transistors $TR_1$ and $TR_2$ constructed from the gate insulating films 4, the gate electrodes 5, the first and second source/drain regions 8a and 8b, and the like, are formed in the active region of the silicon substrate.

Figure 1B:
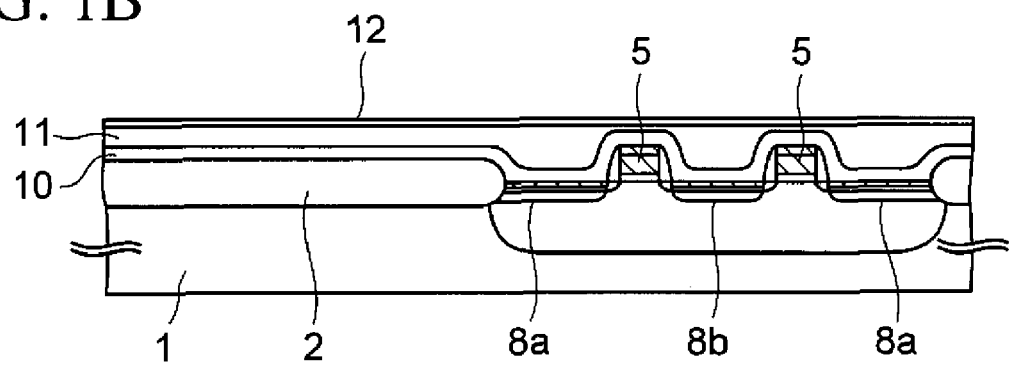

Next, as shown in FIG. 1B, a silicon oxynitride (SiON) film is formed with a thickness of approximately 200 nm on the entire upper surface of the silicon substrate 1 by a plasma CVD method. The silicon oxynitride film thus formed is used as a cover insulating film 10.

Furthermore, a silicon oxide ($SiO_2$) film is formed as a first interlayer insulating film 11 with a thickness of approximately 600 nm on the cover insulating film 10, by the plasma CVD method using a TEOS (tetra ethoxy silane) gas. When the first interlayer insulating film 11 is formed, hydrogen degradation in the gate insulating films 4 is prevented by the cover insulating film 10.

Thereafter, approximately 20 nm of the first interlayer insulating film 11 is polished by using a chemical mechanical polishing (CMP) method to planarize the upper surface of the first interlayer insulating film 11.

Subsequently, anneal with a substrate temperature of 650° C. is carried out on the first interlayer insulating film 11 for 30 minutes so as to degas the first interlayer insulating film 11.

Moreover, by use of the sputtering method, an alumina ($Al_2O_3$) film is formed with a thickness of about 20 nm on the first interlayer insulating film 11 as a lower electrode adhesion film 12. In place of the alumina film, a titanium film or a titanium oxide film may be formed as the lower electrode adhesion film 12. Of these two films, the titanium film can be formed by setting a substrate temperature to be 150° C.

Figure 1C:
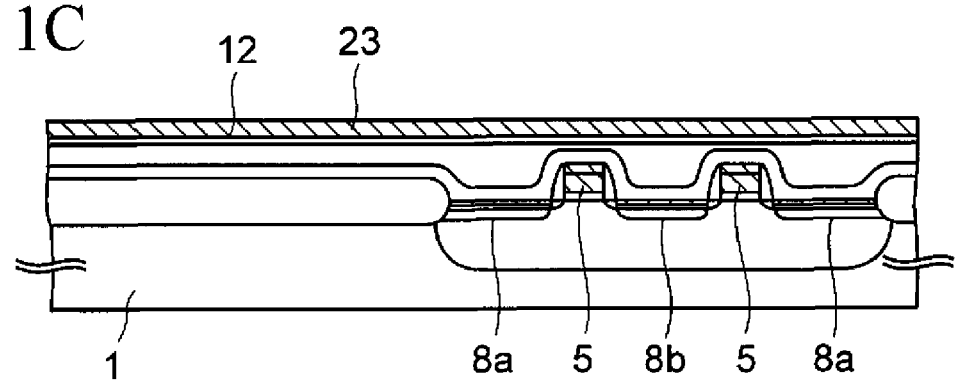

Next, as shown in FIG. 1C, a platinum film is formed by the sputtering method as a first conductive film 23 on the lower electrode adhesion film 12. The first conductive film 23 will be patterned later to be a capacitor lower electrode. Moreover, the first conductive film 23 is formed at a film-forming temperature of 100° C. or 350° C. to have a thickness of approximately 150 nm.

Note that in the case where a titanium film with a thickness of approximately 20 nm is formed as the lower electrode adhesion film 12, the thickness of the first conductive film 23 made of platinum is set at approximately 180 nm.

Since the lower electrode adhesion film 12 is formed before the first conductive film 23 is formed, adhesion between the first conductive film 23 and the first interlayer insulating film 11 increases.

Figure 1D:
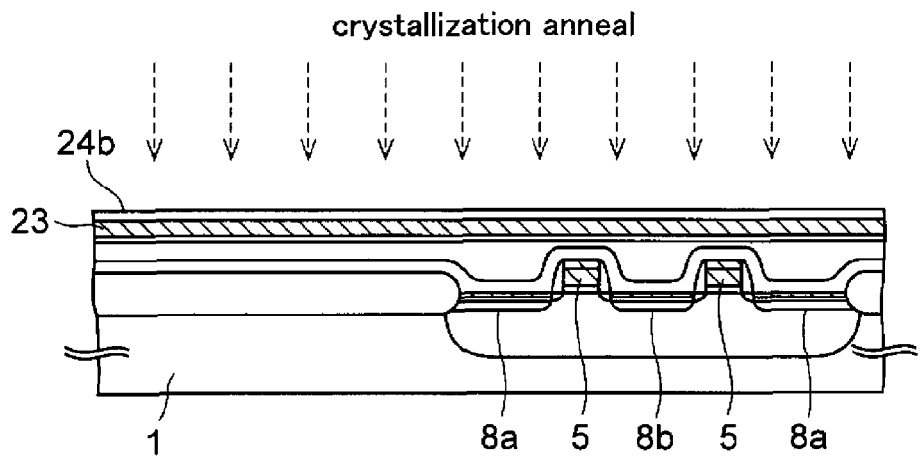

Next, as shown in FIG. 1D, by using the sol-gel method, a PLZT film made by doping La into the PZT film is formed on the first conductive film 23 as a first ferroelectric film 24b.

The sol-gel method is carried out as follows.

Firstly, a PLZT-coating film is formed by applying a PLZT solution (ferroelectric solution) onto a first conductive film 23 for 30 seconds by a spin coating method with a rotational frequency of 5000 rpm in an atmosphere with humidity of 40%.

The PLZT solution is not particularly limited. However, present embodiment employs a solution obtained by dissolving each of precursors of Pb, La, Zr, and Ti in a butanol solvent, with a concentration of 10 weight %. Such a solution is commercially available from material manufacturers. For example, a solution made by Mitsubishi Materials Corporation, of which composition ratio after film-forming is adjusted to be Pb:La:Zr:Ti=110:2:40:60, may be used.

Next, anneal with a substrate temperature of 200 to 450° C., for example, 240° C., is carried out for approximately 5 minutes on the PLZT-coating film in an oxygen atmosphere of atmospheric pressure.

With this process, the butanol solvent in the PLZT-coating film is evaporated, and volume of the PLZT-coating film shrinks. Thereby, concentration of gel including molecules constituting a ferroelectric substance increases, and this makes it easier to crystallize the PLZT-coating film later. The anneal carried out for evaporating a solvent in this manner is also referred to as bake.

Then, the ferroelectric film 24 made of PLZT is formed with a thickness of 100 nm by repeating formation of such a PLZT-coating film and bake predetermined times, for example, 3 times.

Incidentally, the ferroelectric film 24 formed by the sol-gel method is not limited to a PLZT film.

The first ferroelectric film 24b may be formed of a ferroelectric material having an $ABO_3$-type perovskite structure (A represents any one of Bi, Pb, Ba, Sr, Ca, Na, K, and rare-earth elements, and B represents any one of Ti, Zr, Nb, Ta, W, Mn, Fe, Co, and Cr).

Furthermore, Bi layer structure compounds such as $(Bi_{1-x}R_x)Ti_3O_{12}$ (R represents a rare-earth element with $0<x<1$), $SrBi_2Ta_2O_9$ (SBT) and $SrBi_4Ti_4O_{15}$ is also made from an $ABO_3$-type perovskite structure when viewed as a single unit of crystals. Therefore, the Bi layer structure compounds can also be adopted as a material constituting the first ferroelectric film 24b.

Note that in order to improve crystallinity of the first ferroelectric film 24b, it is preferable that the first conductive film 23 be made of a material having a lattice constant close to that of the PZLT constituting the first ferroelectric film 24b. Example of such a material includes palladium, $SrRuO_3$ and $LaSrCoO_3$ having the same perovskite structure as that of the PLZT, in addition to the above-described platinum.

Furthermore, the first conductive film 23 is not limited to the single-layered film, and it may be a laminated film in which any one of platinum, palladium, $SrRuO_3$ and $LaSrCoO_3$ is exposed on the upper surface.

On the other hand, ruthenium, iridium and oxides of these materials have a lattice constant far from that of the PLZT. Therefore, when the first conductive film 23 is made of these materials, the crystallinity of the first ferroelectric film 24b may possibly be deteriorated due to lattice mismatch.

Here, the first ferroelectric film 24b formed by the sol-gel method is not crystallized at the time the first ferroelectric film 24b is formed.

To deal with this problem, atmospheric-pressure RTA (Rapid Thermal Anneal) is carried out on the first ferroelectric film 24b in an atmosphere containing an oxidizing gas so as to crystallize the first ferroelectric film 24b in a (111) direction in which an amount of polarization charges becomes the largest. Such anneal is referred to as crystallization anneal.

The atmosphere used for the crystallization anneal is not particularly limited as long as it is an atmosphere containing an oxidizing gas. In the present embodiment, the crystallization anneal is carried out in an atmosphere of 100% oxygen. In place of the oxygen gas, an ozone gas or a nitrogen dioxide gas may be used as an oxidizing gas. In addition, these gases may be diluted with an inert gas such as an argon gas.

A speed of raising the temperature used for the crystallization anneal is also not limited. However, in the present embodiment, the speed of raising the temperature is set at 40 to 150° C. per minute. To improve the crystallinity of the first ferroelectric film 24b, it is preferable that the speed of raising the temperature be made as fast as possible, for example, 125° C. per minute.

When a maximum substrate temperature is too high in this crystallization anneal, crystallization develops from the upper surface of the first ferroelectric film 24b. Therefore, an interface, in which PZT crystal grains are discontinuous, may be formed in a vicinity of the upper surface of the first ferroelectric film 24b. The layer above this interface is referred to as a surface layer. Unevenness due to the crystal grains is formed on the upper surface of the surface layer. Such unevenness is one of factors for not being able to uniformly apply a voltage to the first ferroelectric film 24b.

Accordingly, to suppress formation of the surface layer, it is preferable that the lower limit of the maximum substrate temperature used for the above-described crystallization anneal be set at the crystallization temperature of the first ferroelectric film 24b, and that the upper limit thereof be set at 60° C. higher than the crystallization temperature. In the present embodiment, the maximum substrate temperature is set at 500 to 560° C., for example 550° C.

By setting the upper limit of the maximum substrate temperature to be a relatively low temperature in this manner, crystallization develops from the lower surface of the first ferroelectric film 24b. Hence, the crystal grains of the first ferroelectric film 24b take over crystallinity of the first conductive film 23. Accordingly, the above-described surface layer is not easily formed, and the unevenness of the first ferroelectric film 24b is suppressed.

Note that this crystallization anneal also makes it possible to obtain an advantage that interdiffusion of platinum and oxygen is suppressed in the vicinity of the interface between the first conductive film 23 and the first ferroelectric film 24b, since the platinum film constituting the first conductive film 23 is made dense by the crystallization anneal.

In addition, instead of the atmospheric-pressure RTA, this crystallization anneal may be carried out by reduced-pressure RTA. The first ferroelectric film 24b is more easily crystallized by the reduced-pressure RTA than by the atmospheric-pressure RTA. Therefore, with the reduced-pressure RTA, the upper and lower limits of the substrate temperature can be lower by respectively about 10° C. and 5° C. than with the atmospheric pressure RTA.

Figure 1E:
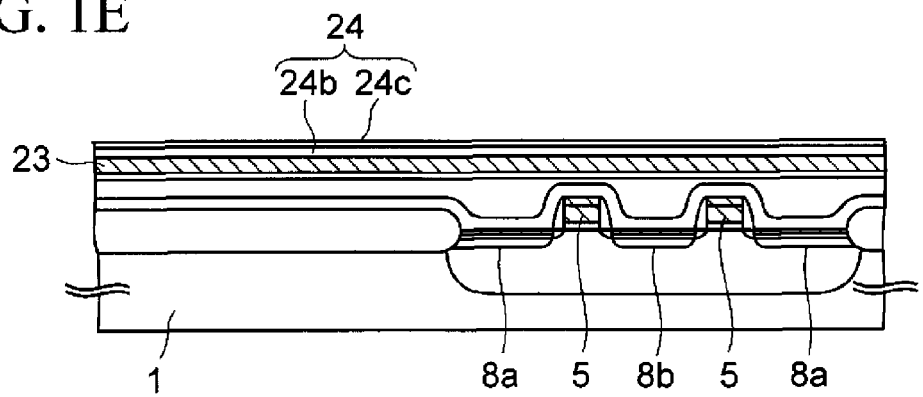

Next, as shown in FIG. 1E, a PZT film is formed with a thickness of about 1 to 50 nm, more preferably 10 to 30 nm, on the first ferroelectric film 24b by the sputtering method. This PZT film is used as a second ferroelectric film 24c.

Here, the sputtering method has an advantage that a small amount of an additive element can easily be doped to the second ferroelectric film 24c.

Utilizing this advantage, it is preferable that any one of strontium, calcium, niobium, iridium, and lanthanum be added to the PZT as an additive element with a concentration of 0.1 to 5 mol %. By applying the second ferroelectric film 24c into which these elements are doped to a capacitor described later, the effects, such as an improvement in fatigue resistance characteristics and in imprint characteristics of the capacitor, reduction of a leak current, and reduction of an operating voltage, can be achieved.

In the present embodiment, calcium, lanthanum, and strontium are respectively doped into the PZT with concentrations of 5 mol %, 2 mol %, and 2 mol %, and thereby the switching charge of the second ferroelectric film 24c is increased. Note that the PZT to which calcium, lanthanum and strontium are added in this manner is written as CSPLZT.

As in the case of the first ferroelectric film 24b, a material of the second ferroelectric film 24c is not limited to the PZT, as long as the material is a ferroelectric material having an $ABO_3$-type perovskite structure (A represents any one of Bi, Pb, Ba, Sr, Ca, Na, K and rare-earth elements, and B represents any one of Ti, Zr, Nb, Ta, W, Mn, Fe, Co and Cr).

Furthermore, the second ferroelectric film 24c may be constructed from Bi layer structure compounds such as $(Bi_{1-x}R_x)Ti_3O_{12}$ (R represents a rare-earth element with $0<x<1$), $SrBi_2Ta_2O_9$ (SBT) and $SrBi_4Ti_4O_{15}$.

By these steps, a ferroelectric film 24 made of the first and second ferroelectric films 24b and 24c is formed on the first conductive film 23.

Of these films 24b and 24c, the first ferroelectric film 24b is formed by the sol-gel method with which costs for forming a film is low, and which thus contributes to cost reduction for a semiconductor device.

On the other hand, the second ferroelectric film 24c contributes to planarizing the upper surface of the entire ferroelectric film 24 by burying the unevenness of the upper surface of the first ferroelectric film 24b which is generated due to the PZT crystal grains. In this manner, the second ferroelectric film 24c is formed to achieve planarization rather than to gain a film thickness of the ferroelectric film 24. Therefore, it is preferable that the second ferroelectric film 24c be formed thinner than the first ferroelectric film 24b to burden the first ferroelectric film 24b with the most of the ferroelectric characteristics of the ferroelectric film 24.

Figure 1F:
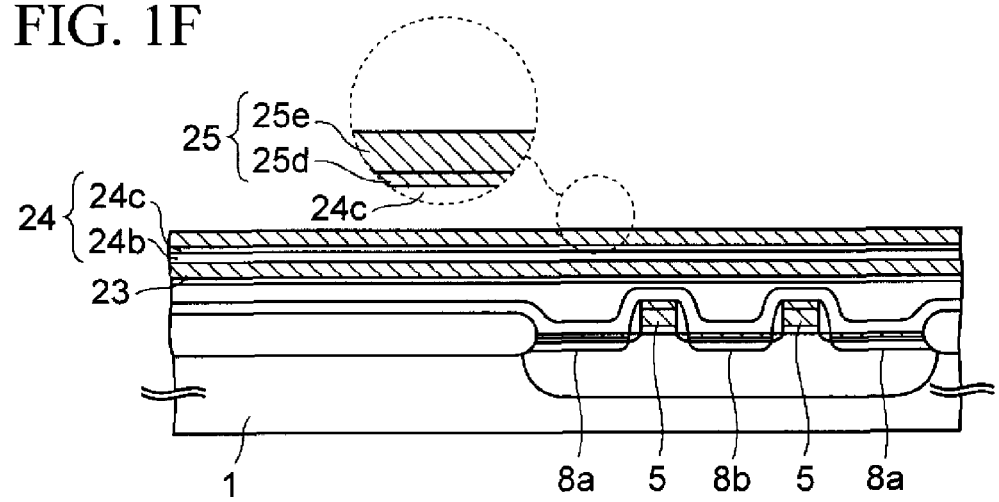

Next, steps for obtaining a cross-sectional structure shown in FIG. 1F will be described.

Firstly, an iridium oxide film, which is already crystallized at the time of depositing, is formed with a thickness of approximately 25 nm on the above-described ferroelectric film 24, by the sputtering method which uses the mixed gas of oxygen and argon as a sputtering gas, and which uses an iridium target. This iridium oxide film is used as a first conductive metal oxide film 25d.

Here, it was made apparent that an interface between the second ferroelectric film 24c and the first conductive metal oxide film 25d is made substantially flat by forming the second ferroelectric film 24c by the sputtering method as described above. Accordingly, a paraelectric layer due to interdiffusion of these films 24c and 25d is less likely to be formed in the interface, and thus it is possible to prevent an occupying ratio of the ferroelectric substance in the ferroelectric film 24 from being reduced.

Furthermore, since the first conductive metal oxide film 25d is already crystallized at the time of forming thereof, an interface between the first conductive metal oxide film 25d and the second ferroelectric film 24c is clearly formed, and thus the above-described paraelectric film is less likely to be formed in the vicinity of the interface.

To form the iridium oxide film which is surely crystallized at the time of depositing, it suffices that a substrate temperature be set at 300° C. or more. When the iridium oxide film is formed at a temperature lower than 300° C., crystallization does not sufficiently develop at the time of film forming, so that the iridium oxide film may possibly be in an amorphous state.

In the present embodiment, a flow rate of argon is set at 140 sccm, and a flow rate of oxygen is set at 60 sccm. Sputtering power is set at 1 to 2 kW.

Thereafter, under conditions that a substrate temperature is 725° C. and a processing time is 60 seconds, RTA is carried out on the first conductive metal oxide film 25d in the mixed atmosphere of an oxygen gas and an argon gas. The gas flow rate in this RTA is not particularly limited. In the present embodiment, the flow rate of oxygen is set at 20 sccm, and the flow rate of argon is set at 2000 sccm.

With such RTA, the ferroelectric film 24 is completely crystallized, and damages received in the ferroelectric film 24 at the time of forming the first conductive metal oxide film 25d by the sputtering method are recovered. Moreover, the oxygen loss in the ferroelectric film 24 is also compensated by this RTA, and ferroelectric characteristics of the ferroelectric film 24 improve.

In particular, by carrying out the anneal in the state where the entire surface of the ferroelectric film 24 is covered with the first conductive metal oxide film 25d in this manner, lead atoms essential for maintaining the ferroelectric characteristics of the ferroelectric film 24 does not easily escape from the ferroelectric film 24 to the anneal atmosphere. Thus, this anneal is more effective as compared with the case where anneal is carried out after patterning the capacitor.

This anneal also provides an advantage in that a voltage can be uniformly applied from an upper electrode to be described later, to the ferroelectric film 24, since the interface between the first conductive metal oxide film 25d and the ferroelectric film 24 is made flat.

Note that the anneal atmosphere at this time is not particularly limited as long as it is an atmosphere containing an oxidizing gas. The examples of the oxidizing gas include an ozone gas and a nitrogen dioxide gas, in addition to the above-described oxygen gas.

After that, by the sputtering method, an iridium oxide film is formed with a thickness of approximately 200 nm as a second conductive metal oxide film 25e on the first conductive metal oxide film 25d. In this sputtering method, an iridium target is used, and the mixed gas of oxygen and argon is used as a sputtering gas.

Unlike the first conductive metal oxide film 25d, an iridium oxide film constituting the second conductive metal oxide film 25e needs not be crystallized at the time of film forming. In the present embodiment, a substrate temperature at the time of forming the second conductive metal oxide film 25e is set to be room temperature (20° C.) so as to form an iridium oxide film in an amorphous state.

Incidentally, in the above-described sputtering of iridium oxide, iridium atoms flying from the iridium target is oxidized in the sputtering atmosphere, and thereby, iridium oxide is deposited on the substrate. Therefore, the deposited iridium oxide includes iridium atoms which are not sufficiently oxidized in the atmosphere, so that an entire iridium oxide film is easily set in a state where the amount of oxygen is less than that of stoichiometry composition ($IrO_2$).

However, when the amount of oxygen is insufficient in the second conductive metal oxide film 25e, catalysis of the second conductive metal oxide film 25e increases. Accordingly, moisture on the outside comes in contact with the second conductive metal oxide film 25e to generate hydrogen. Since there is a problem that hydrogen reduces the ferroelectric film 24 to deteriorate the ferroelectric characteristics the ferroelectric film 24, it is required to suppress generation of hydrogen as low as possible in the process of manufacturing a FeRAM.

Therefore, from a viewpoint of preventing the generation of hydrogen, it is preferable that an oxidation number of the second conductive metal oxide film 25e be larger than that of the first conductive metal oxide film 25d.

Accordingly, in the present embodiment, by setting the flow rate ratio of oxygen at the time of forming the second conductive metal oxide film 25e to be larger than that at the time of forming the first conductive metal oxide film 25d, the composition of iridium oxide is brought close to stoichiometry composition ($IrO_2$), so that the catalysis of the second conductive metal oxide film 25e would be suppressed.

Incidentally, the flow rate ratio of oxygen in the present specification is defined as a percentage of a flow rate of oxygen in an entire flow rate of the sputtering gas.

With the above steps, a second conductive film 25 constructed from the first and second conductive metal oxide films 25d and 25e is formed on the ferroelectric film 24.

Note that the material constituting the first and second conductive metal oxide films 25d and 25e is not limited to iridium oxide. The first and second conductive metal oxide films 25d and 25e may be formed of an oxide of any one of iridium, ruthenium, rhodium, rhenium, and osmium. Furthermore, these oxides may be stacked as the second conductive film 25.

Figure 1G:
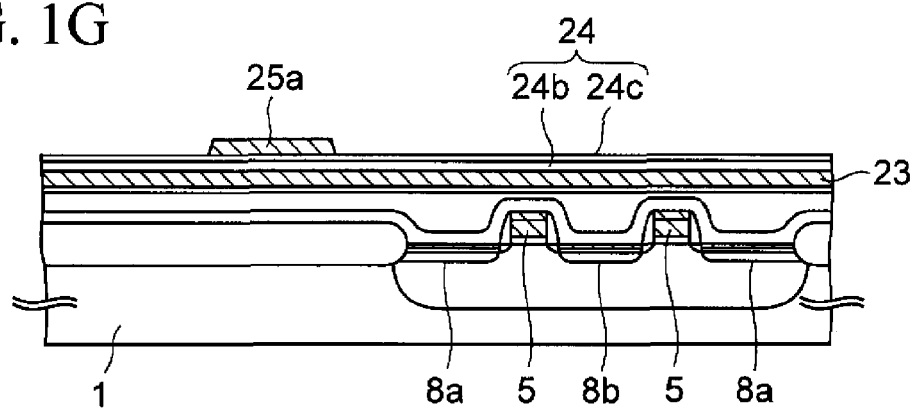

Next, as shown in FIG. 1G, after the back surface of the silicon substrate 1 is cleaned, the first conductive film 25 is patterned by photolithography and etching to form an upper electrode 25a. Then, to recover damages received in the ferroelectric film 24 due to this patterning, recovery anneal is carried out on the ferroelectric film 24 in a vertical furnace. This recovery anneal is carried out in an atmosphere containing oxygen, and conditions thereof are, for example, a substrate temperature of 650° C., and a processing time of 60 minutes.

Figure 1H:
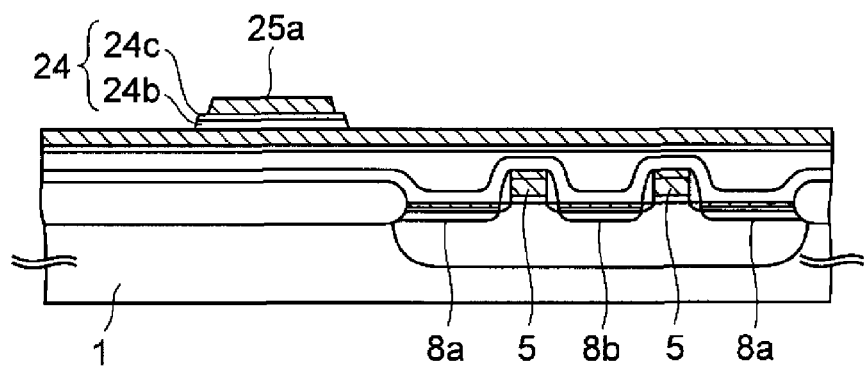

Subsequently, as shown in FIG. 1H, the ferroelectric film 24 is patterned by photolithography and etching to form a capacitor dielectric film 24a made of a ferroelectric material such as PLZT. Damages received in the capacitor dielectric film 24a due to this patterning are recovered by recovery anneal. As in the case described above, this recovery anneal is carried out by using the vertical furnace in an atmosphere containing oxygen, and adopted conditions thereof are a substrate temperature of 350° C. and a processing time of 60 minutes.

Figure 1I:
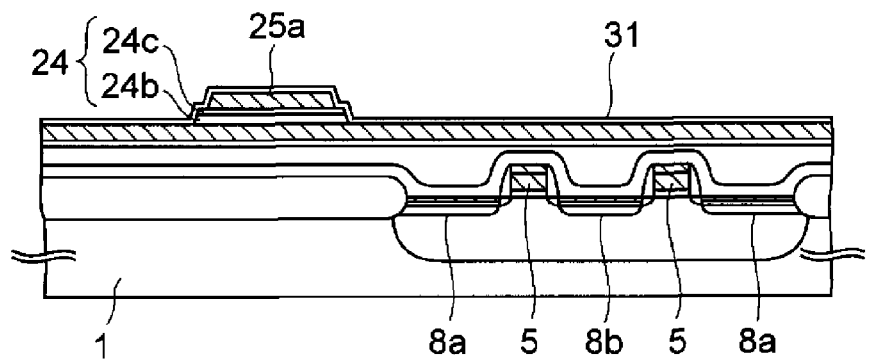

Next, as shown in FIG. 1I, a first alumina film 31 for protecting the capacitor dielectric film 24a from reductants such as hydrogen and moisture is formed with a thickness of approximately 50 nm on the entire upper surface of the silicon substrate 1 by the sputtering method.

Here, since the recovery anneal described in FIG. 1H is carried out in advance, the first alumina film 31 is less likely to be peeled off.

Then, to recover damages received in the capacitor dielectric film 24a at the time of forming the first alumina film 31, recovery anneal is carried out in the atmosphere containing oxygen with a substrate temperature of 550° C. for approximately 60 minutes. This recovery anneal is carried out by using, for example, a vertical furnace.

Figure 1J:
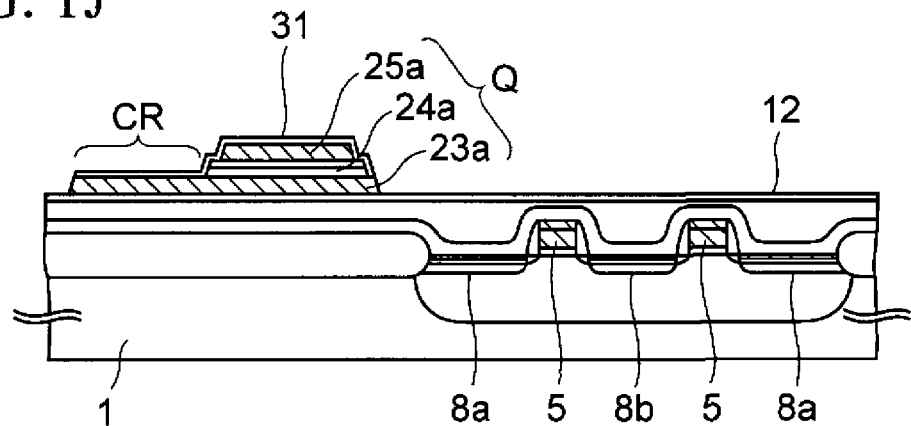

Thereafter, as shown in FIG. 1J, the first conductive film 23 and the first alumina film 31 are patterned by photolithography and etching, and thereby the first conductive film 23 below the capacitor dielectric film 24a is used as a lower electrode 23a. The first alumina film 31 is left to cover the lower electrode 23a.

The lower electrode 23a has a contact region CR protruding from the capacitor dielectric film 24a. In this contact region CR, a metal wiring to be described later, and the lower electrode 23a are electrically connected to each other.

After that, to recover damages received in the capacitor dielectric film 24a during the manufacturing process, the recovery anneal is carried out to the capacitor dielectric film 24a in the atmosphere containing oxygen in the vertical furnace under conditions with a substrate temperature of 550° C. and a processing time of 60 minutes.

With the steps described above, a capacitor Q formed by stacking the lower electrode 23a, the capacitor dielectric film 24a, and the upper electrode 25a in this order, is formed in a cell region of the silicon substrate 1.

Figure 1K:
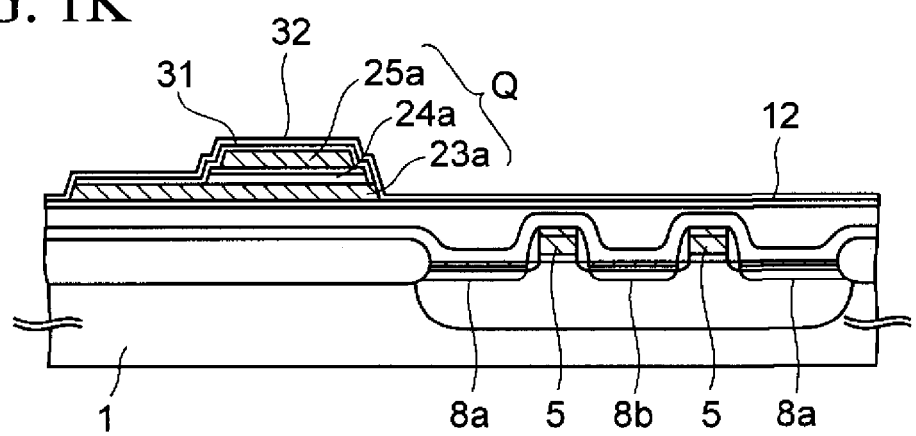

Next, as shown in FIG. 1K, a second alumina film 32 for protecting the capacitor dielectric film 24a is formed with a thickness of approximately 20 nm on the entire upper surface of the silicon substrate 1 by the sputtering method. This second alumina film 32, together with the first alumina film 31 thereunder, prevents reductants, such as hydrogen and moisture, from coming in contact with the capacitor dielectric film 24a, and has a function of suppressing deterioration of ferroelectric characteristics of the capacitor dielectric film 24a due to reduction thereof.

Thereafter, the recovery anneal is carried out on the capacitor dielectric film 24a in the vertical furnace with the atmosphere containing oxygen, under conditions with a substrate temperature of 550° C. and a processing time of 60 minutes.

This recovery anneal also provides an advantage that a leak current of the capacitor Q is reduced.

Figure 1L:
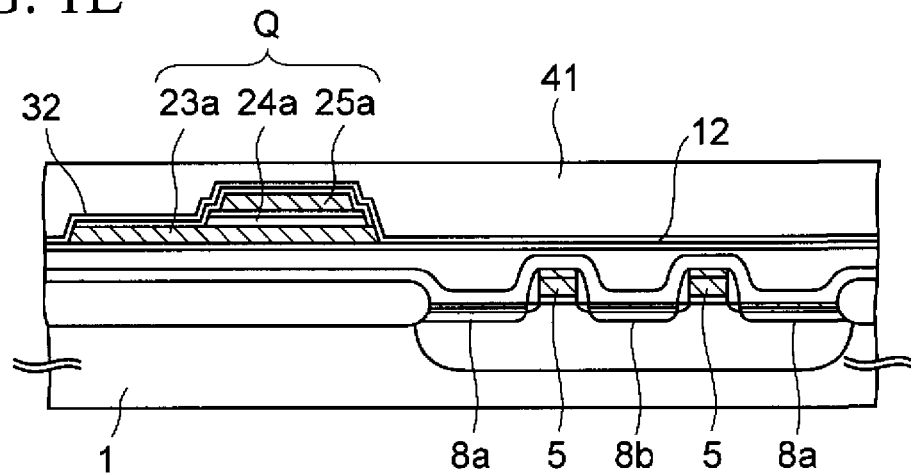

Moreover, as shown in FIG. 1L, a silicon oxide film is formed with a thickness of approximately 1500 nm on the above-described second alumina film 32 by a high-density plasma CVD (HDPCVD) method using a silane ($SiH_4$) gas, and the silicon oxide film is used as a second interlayer insulating film 41. Thereafter, an upper surface of the second interlayer insulating film 41 is polished and planarized by the CMP method.

After that, the second interlayer insulating film 41 is dehydrated by performing $N_2O$ plasma processing on the second interlayer insulating film 41, and the upper surface of the second interlayer insulating film 41 is slightly nitrided, and thereby moisture is prevented from being absorbed again into the second interlayer insulating film 41.

Figure 1M:
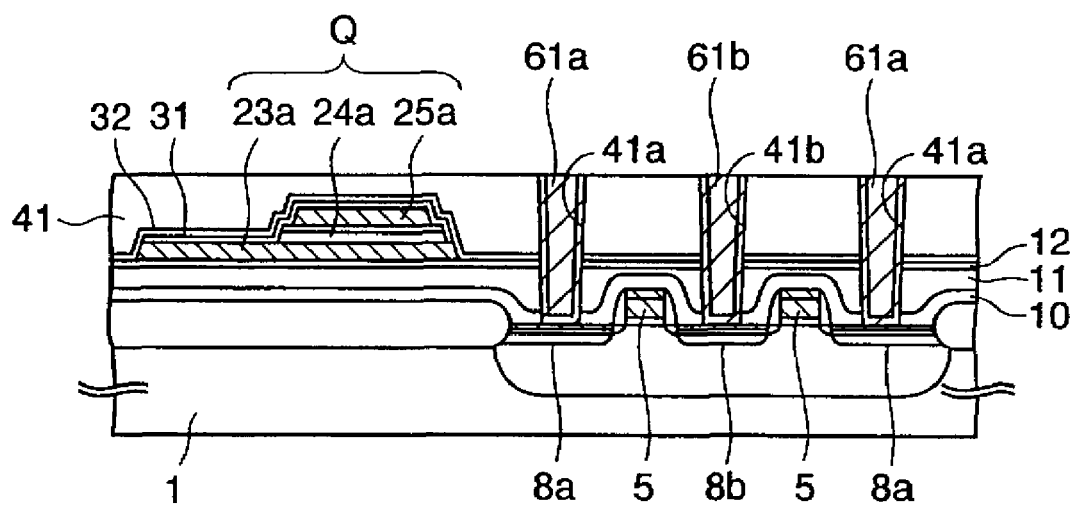

Next, steps for obtaining a cross-sectional structure shown in FIG. 1M will be described.

Firstly, insulating films 10 to 12, 31, 32, and 41 are patterned by photolithography and dry etching to form first and second contact holes 41a and 41b in these films on the first and second source/drain regions 8a and 8b.

Thereafter, on each of inner surfaces of the first and second contact holes 41a and 41b and the upper surface of the second interlayer insulating film 41, a titanium film and a titanium nitride film are formed respectively with thicknesses of 20 nm and 50 nm, by the sputtering method, and these films are used as a glue film (an adhesion film). Subsequently, a tungsten film is formed on the glue film by a CVD method using a tungsten hexafluoride gas, and the first and second contact holes 41a and 41b are completely embedded with this tungsten film.

After that, the excessive glue film and tungsten film on the second interlayer insulating film 41 are polished and removed by the CMP method, and these films are left only inside the first and second contact holes 41a and 41b as first and second conductive plugs 61a and 61b. The first and second conductive plugs 61a and 61b are electrically connected to the first and second source/drain regions 8a and 8b, respectively.

Here, the first and second conductive plugs 61a and 61b are mainly formed of tungsten which is oxidized very easily. Therefore, the first and second conductive plugs 61a and 61b are easily oxidized in the atmosphere containing oxygen, so that these plugs may possibly induce contact defect.

Figure 1N:
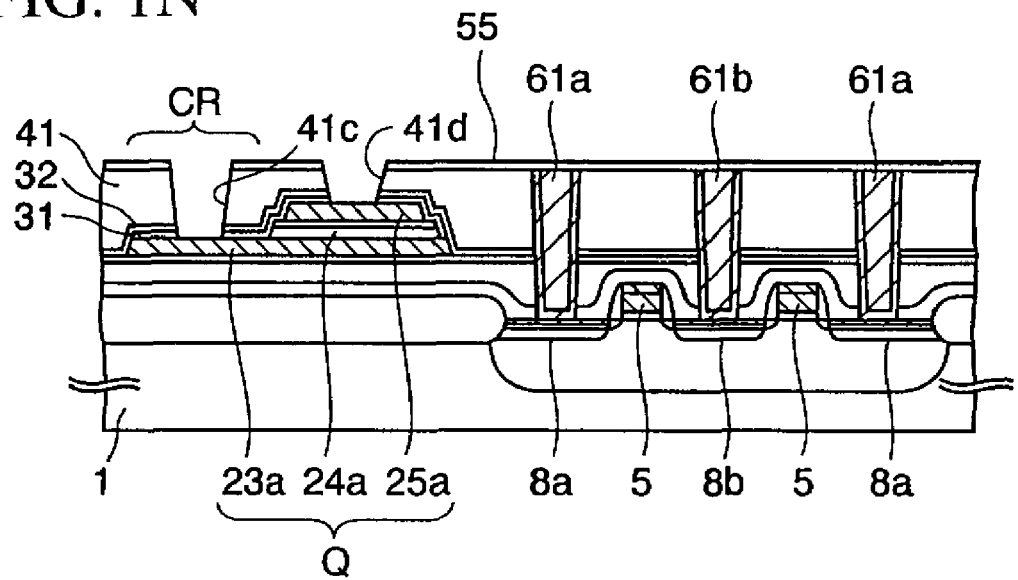

To deal with this problem, in the next step, as shown in FIG. 1N, a silicon oxynitride film is formed by the CVD method with a thickness of approximately 100 nm as an antioxidant insulating film 55 on the entire upper surface of the silicon substrate 1. The antioxidant insulating film 55 protects the first and second conductive plugs 61a and 61b from being oxidized.

After that, patterning is carried out on layers from the antioxidant insulating film 55 down to the first alumina film 31 by photolithography and etching. Thereby, a third hole 41c is formed in these insulating films in the contact region CR of the lower electrode 23a, and a fourth hole 41d is formed on the upper electrode 25a.

Thereafter, to recover damages received in the capacitor dielectric film 24a in the course of the above steps, the silicon substrate 1 is put in the vertical furnace with the atmosphere containing oxygen, and the recovery anneal is carried out on the capacitor dielectric film 24a under conditions with a substrate temperature of 500° C. and a processing time of 60 minutes.

Next, steps for obtaining a cross-sectional structure shown in FIG. 1O will be described.

Firstly, a metal laminated film is formed by the sputtering method on each of the upper surfaces of the second interlayer insulating film 41 and the first and second conductive plugs 61a and 61b. In the present embodiment, to form the metal laminated film, a titanium nitride film with a thickness of approximately 150 nm, a copper-containing aluminum film with a thickness of approximately 550 nm, a titanium film with a thickness of approximately 5 nm, and a titanium nitride film with a thickness of approximately 150 nm are formed in this order. This metal laminated film is also formed in the third and fourth holes 41c and 41d on the capacitor Q.

Then, the metal laminated film is patterned by photolithography and etching to form a metal wiring 62 electrically connected to the capacitor Q and to the conductive plugs 61a and 61b.

After that, anneal is carried out to dehydrate the second interlayer insulating film 41 under conditions with a substrate temperature of 350° C., a flow rate of $N_2$ at 20 liter per minute, and a processing time of 30 minutes, by using the vertical furnace with, for example, a nitrogen atmosphere.

With the above steps, a basic structure of the semiconductor device according to the present embodiment is completed.

In the above-described present embodiment, as shown in FIG. 1E, the PZT film is formed by the sputtering method as the second ferroelectric film 24c.

Accordingly, as shown in the dotted circle in FIG. 1O, the interface between the second ferroelectric film 24c and the first conductive metal oxide film 25d is made substantially flat. Thus, a paraelectric layer due to interdiffusion of these films 24c and 25d is less likely to be formed in the above interface. As a result, the occupying ratio of the above-described paraelectric layer in the capacitor dielectric film 24a can be reduced, so that the most of the capacitor dielectric film 24a can be formed of a ferroelectric substance. Accordingly, it is made possible to increase the switching charge of the capacitor Q, and to form the capacitor Q which is extremely useful for a next-generation FeRAM capable of being operated at a low voltage.

Moreover, since the first conductive metal oxide film 25d formed on the second ferroelectric film 24c is crystallized at the time of film forming, the interface between the second ferroelectric film 24c and the first conductive metal oxide film 25d is made stable. Thereby, it is made possible to effectively prevent the formation of an interface layer due to the inter-diffusion of these films 24c and 25d.

(2) Second Embodiment

Figure 2A:
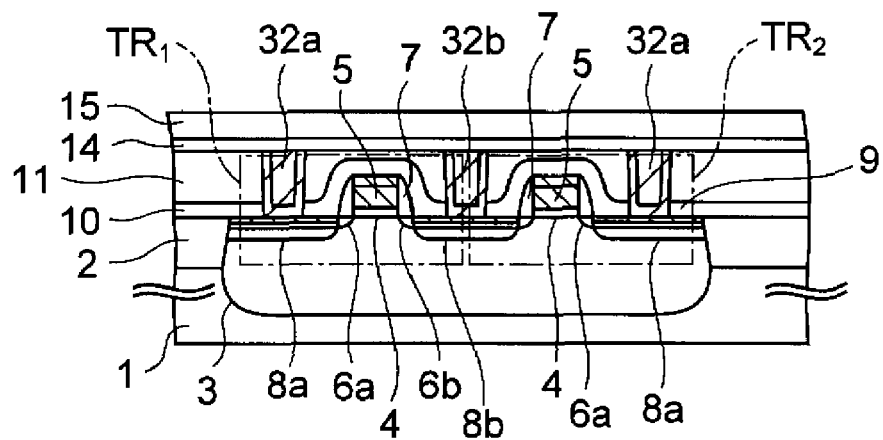
FIGS. 2A to 2X are cross-sectional views showing processes of manufacturing a semiconductor device according to a second embodiment of the present invention.
Figure 2B:
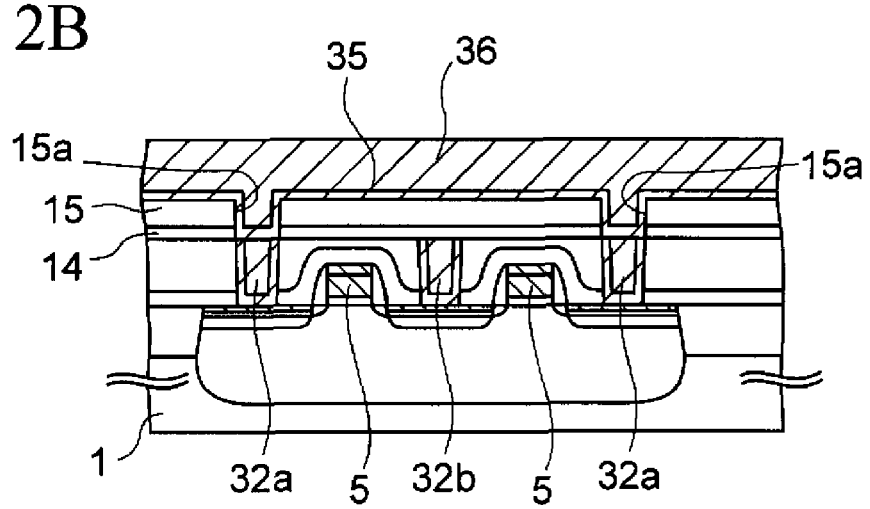
Figure 2C:
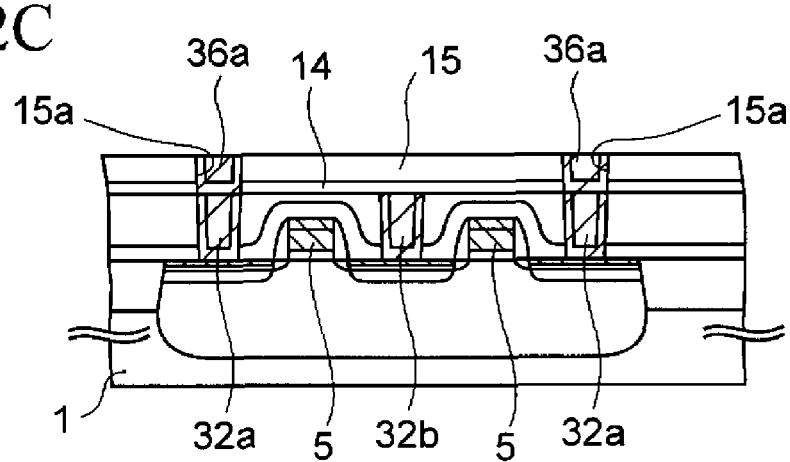
Figure 2D:
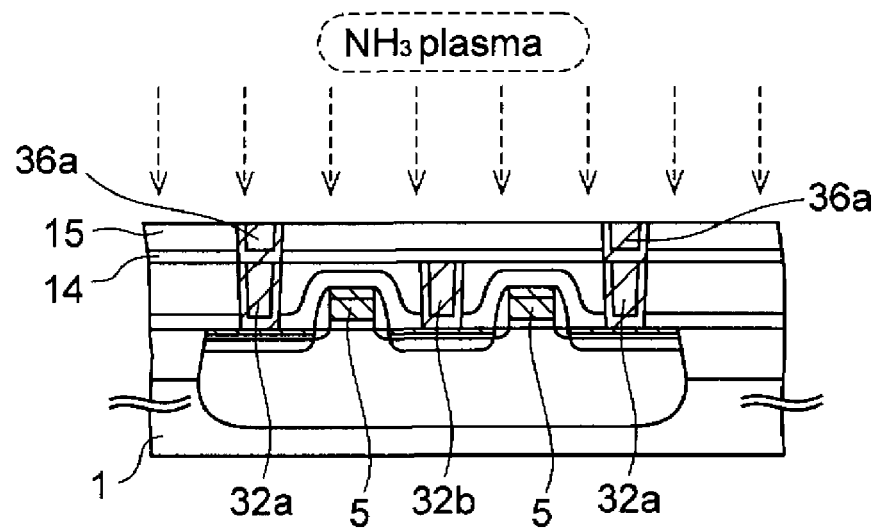
Figure 2E:
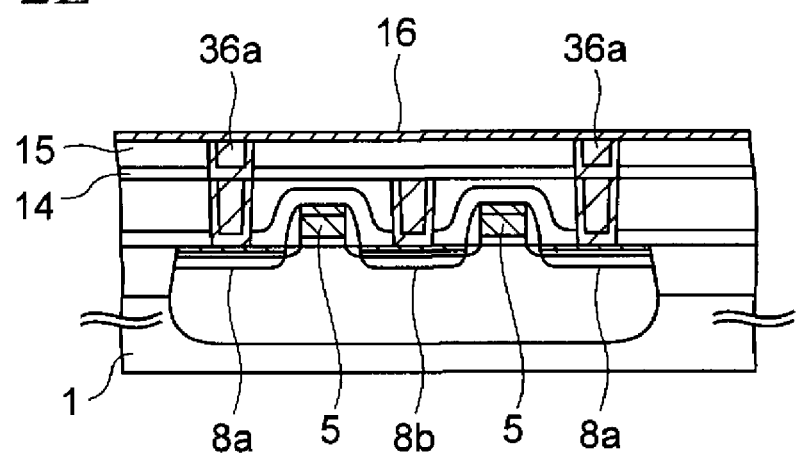
Figure 2F:
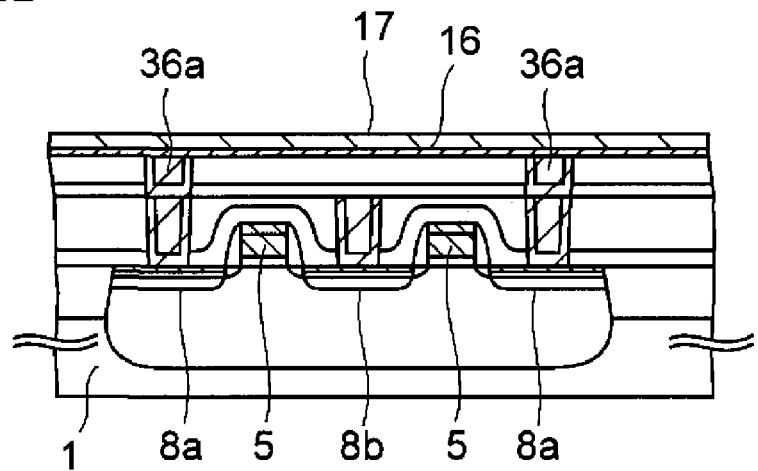
Figure 2G:
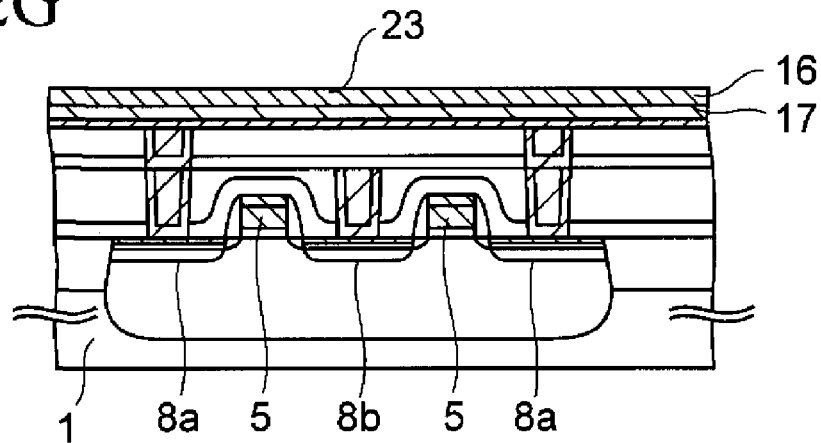
Figure 2H:
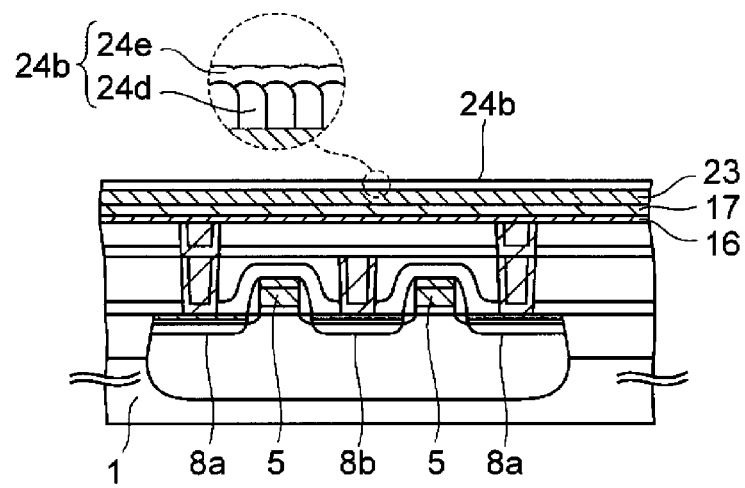
Figure 2I:
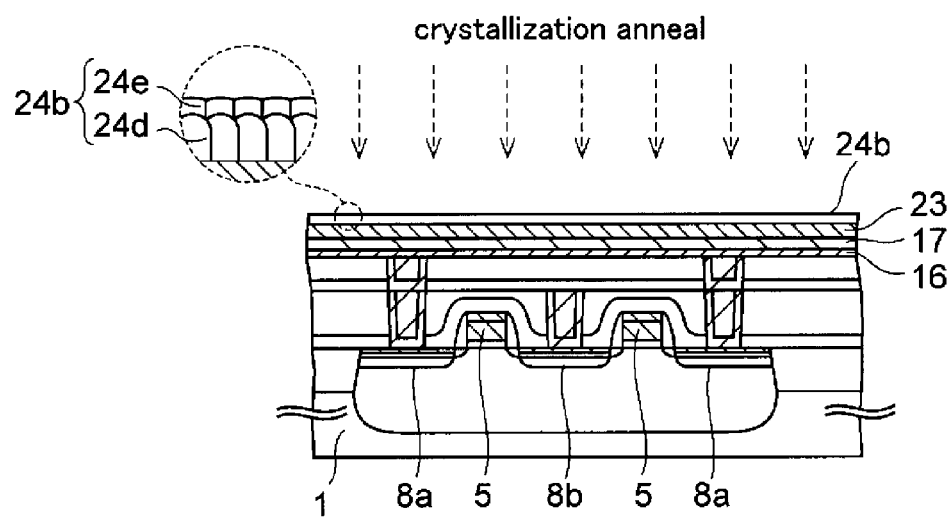
Figure 2J:
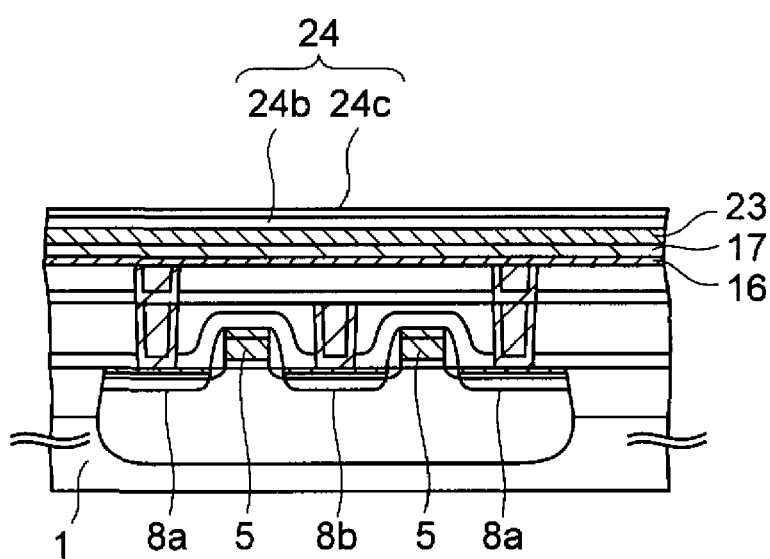
Figure 2K:
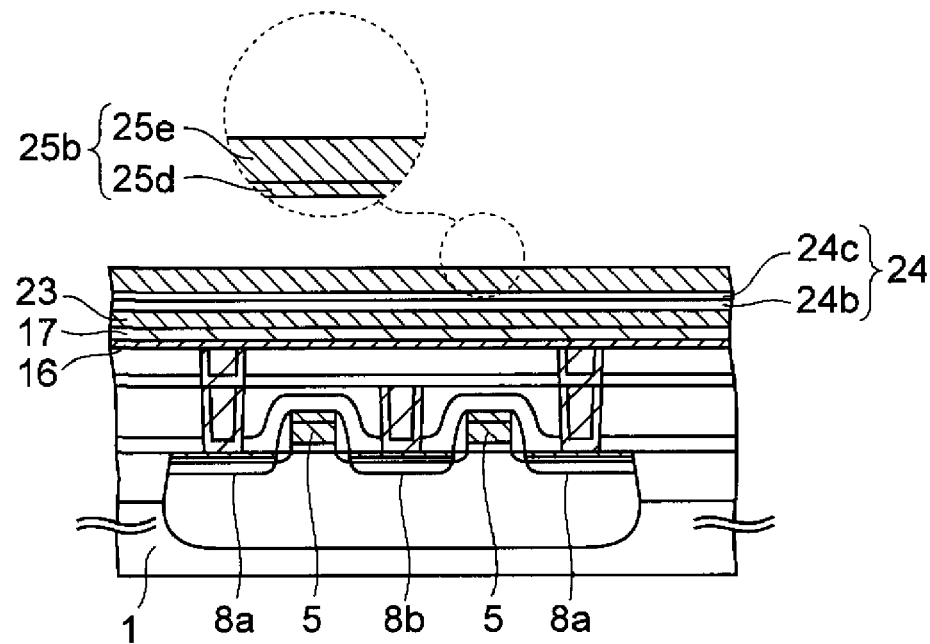
Figure 2L:
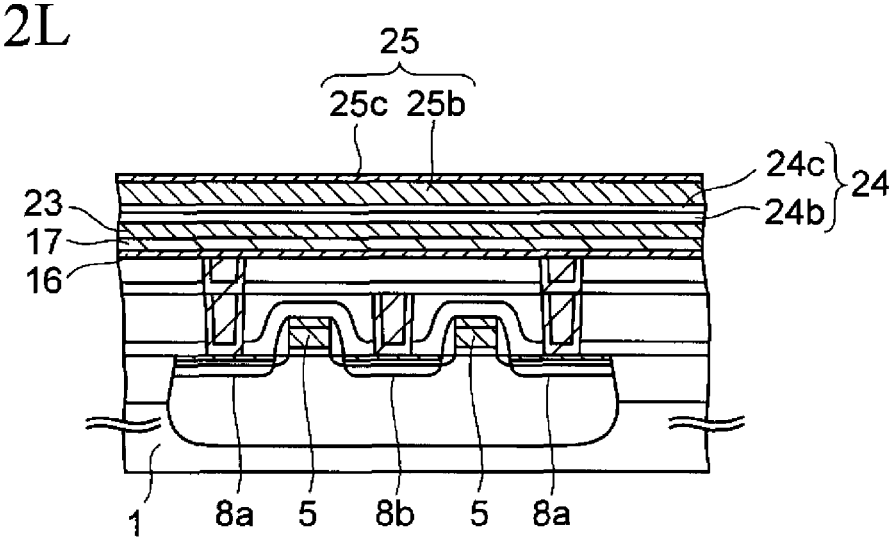
Figure 2M:
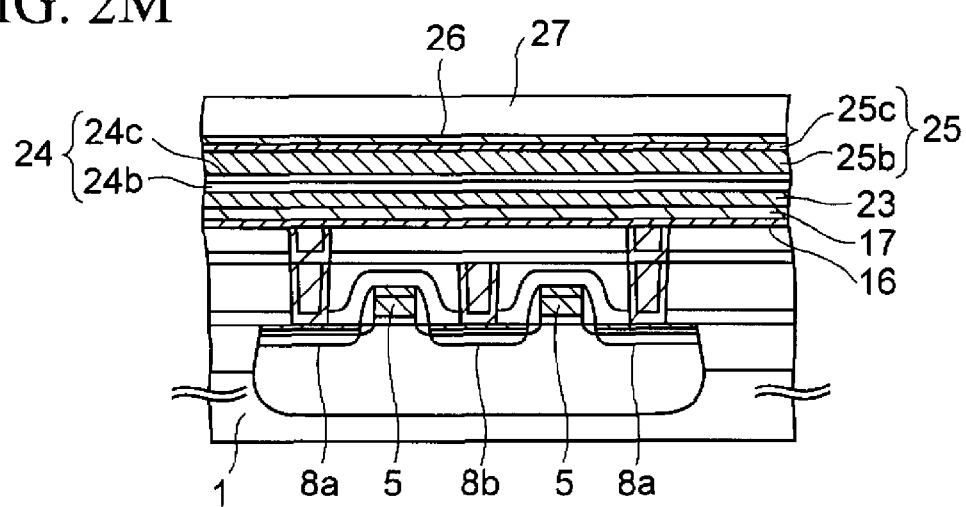
Figure 2N:
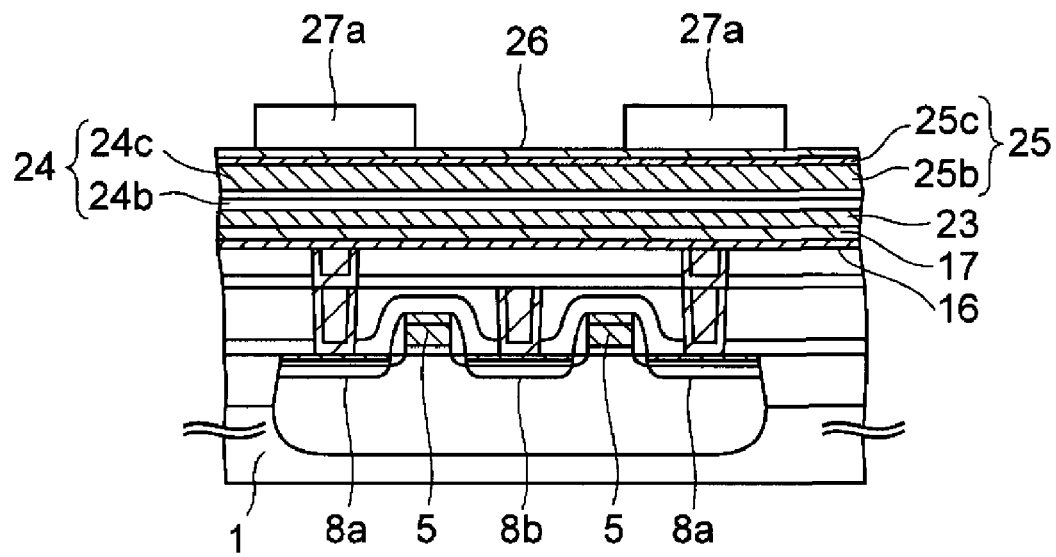
Figure 2O:
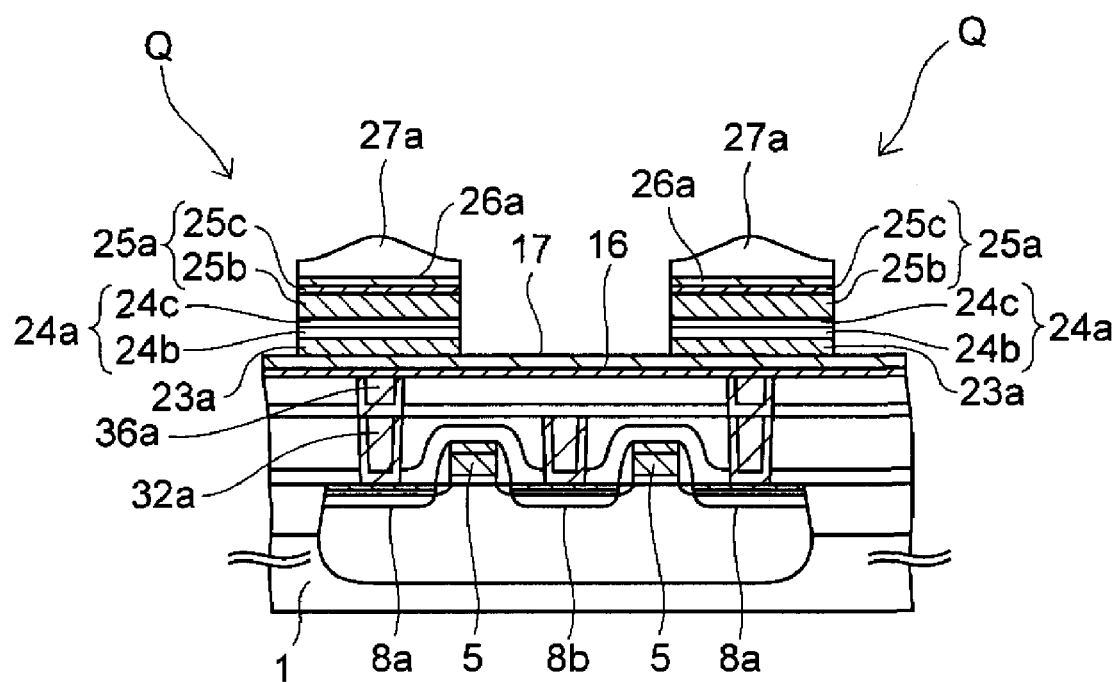
Figure 2P:
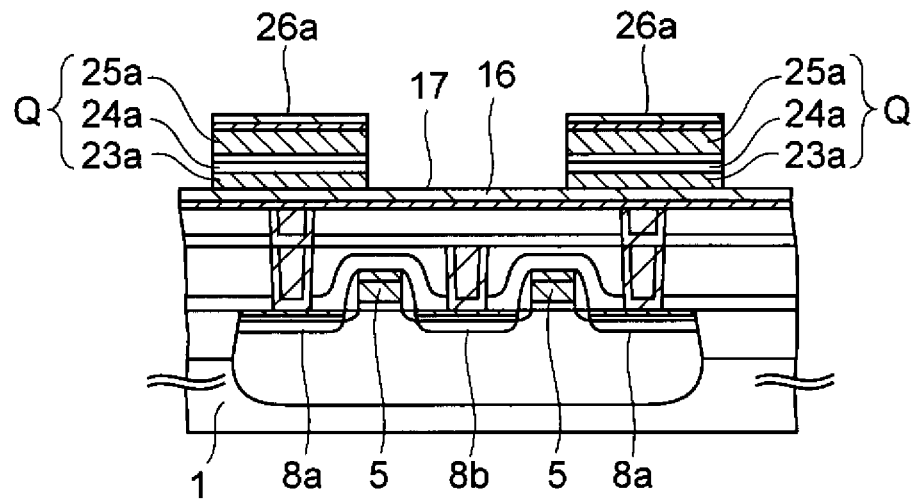
Figure 2Q:
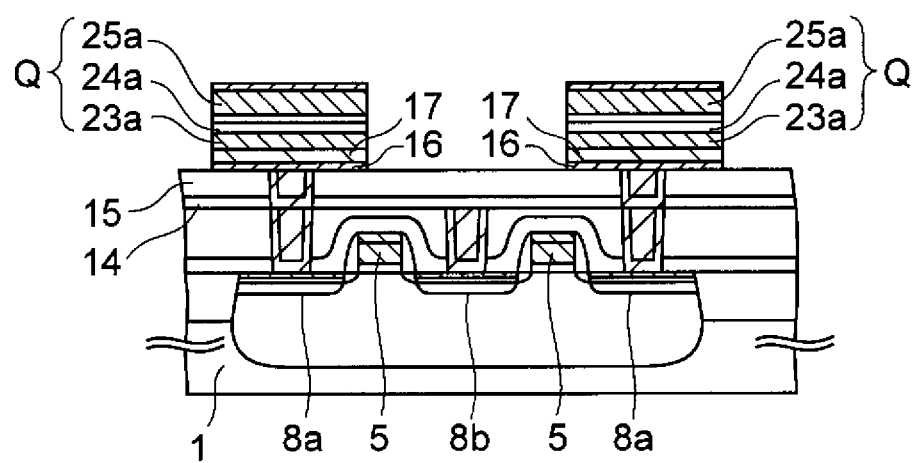
Figure 2R:
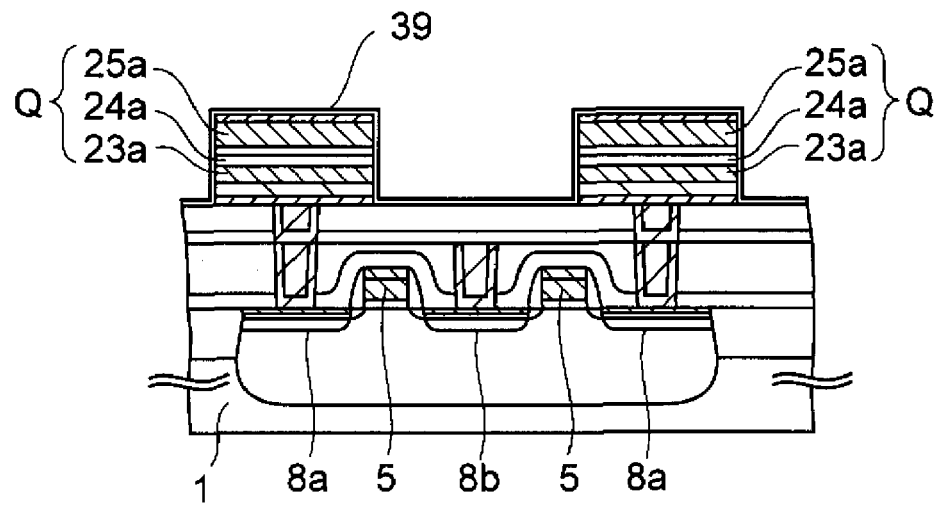
Figure 2S:
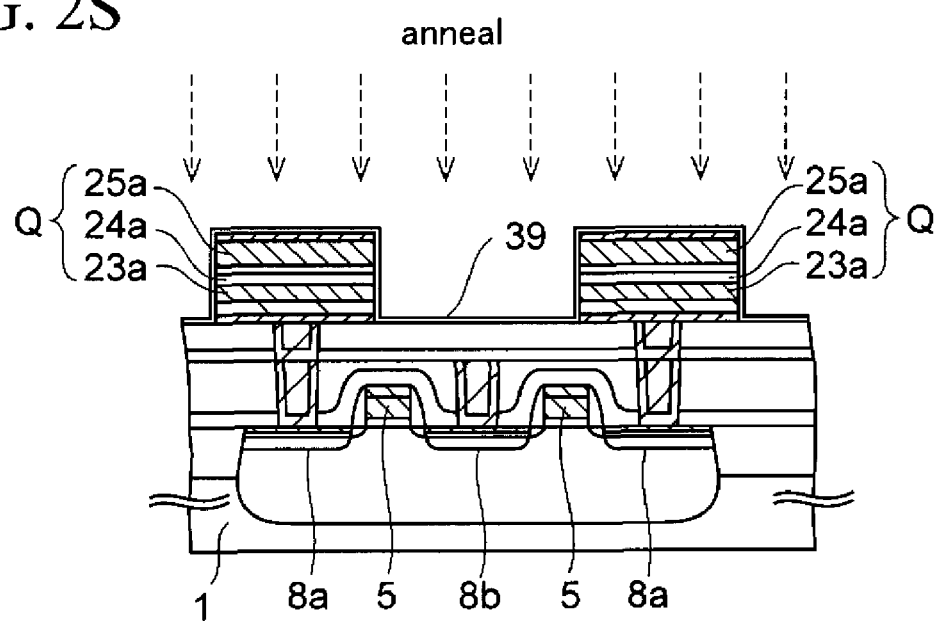
Figure 2T:
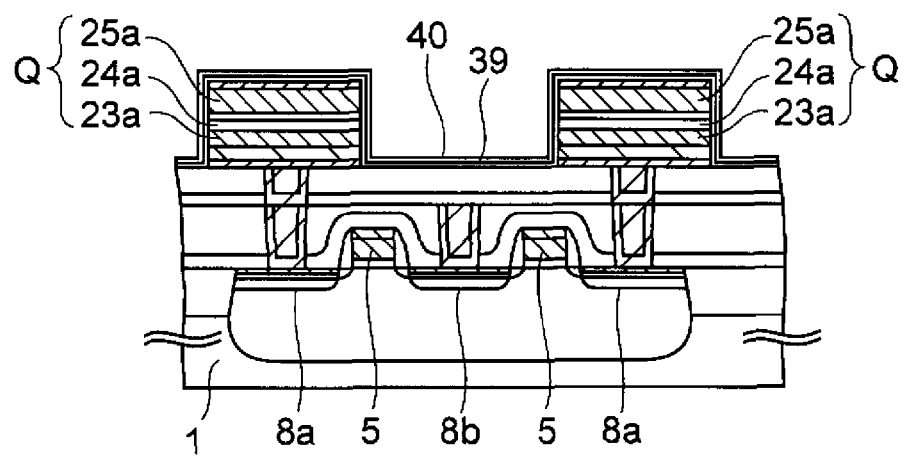
Figure 2U:
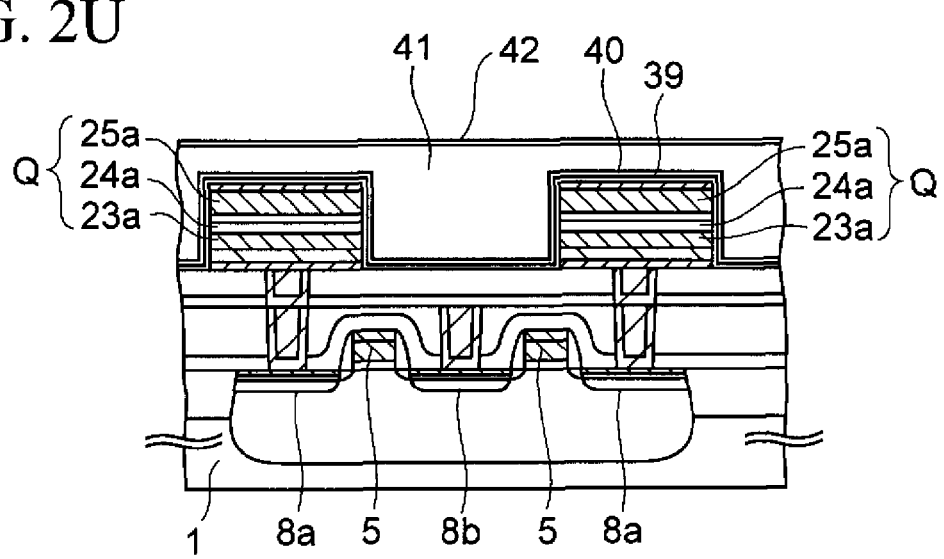
Figure 2V:
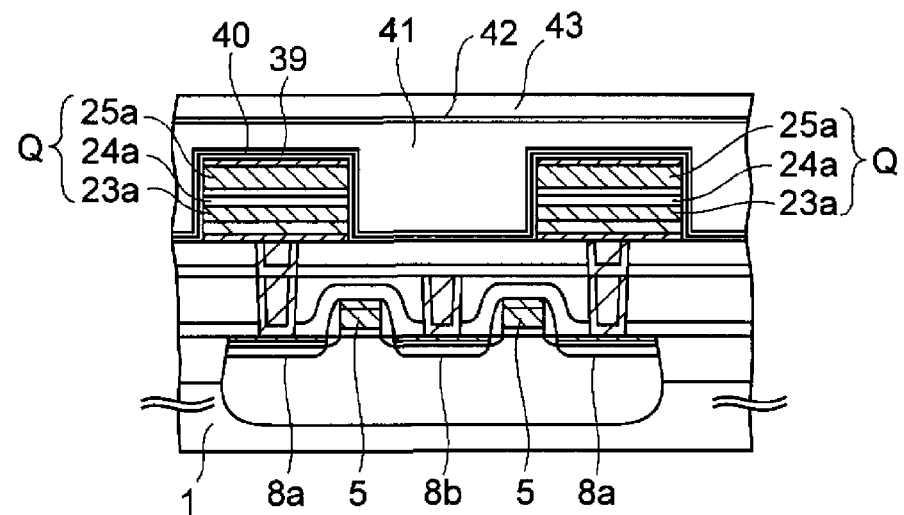
Figure 2W:
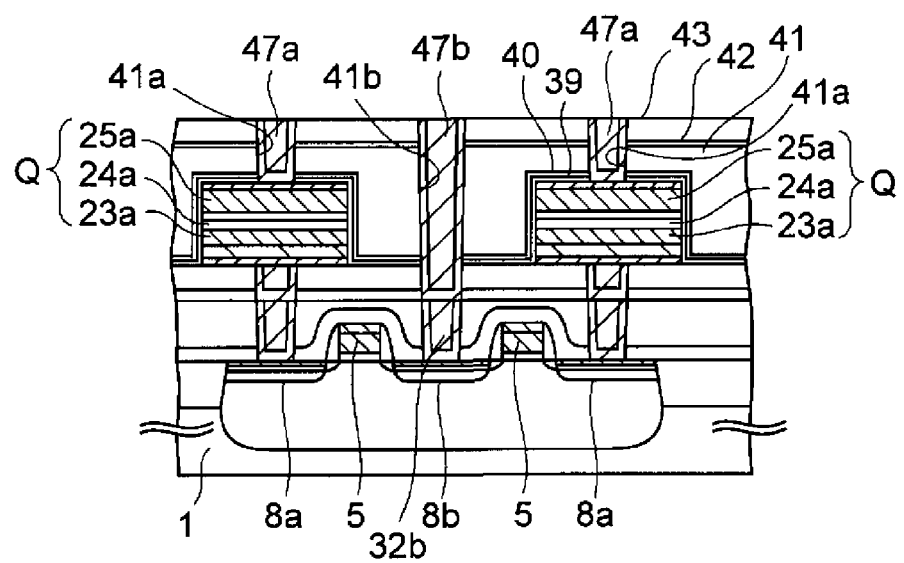
Figure 2X:
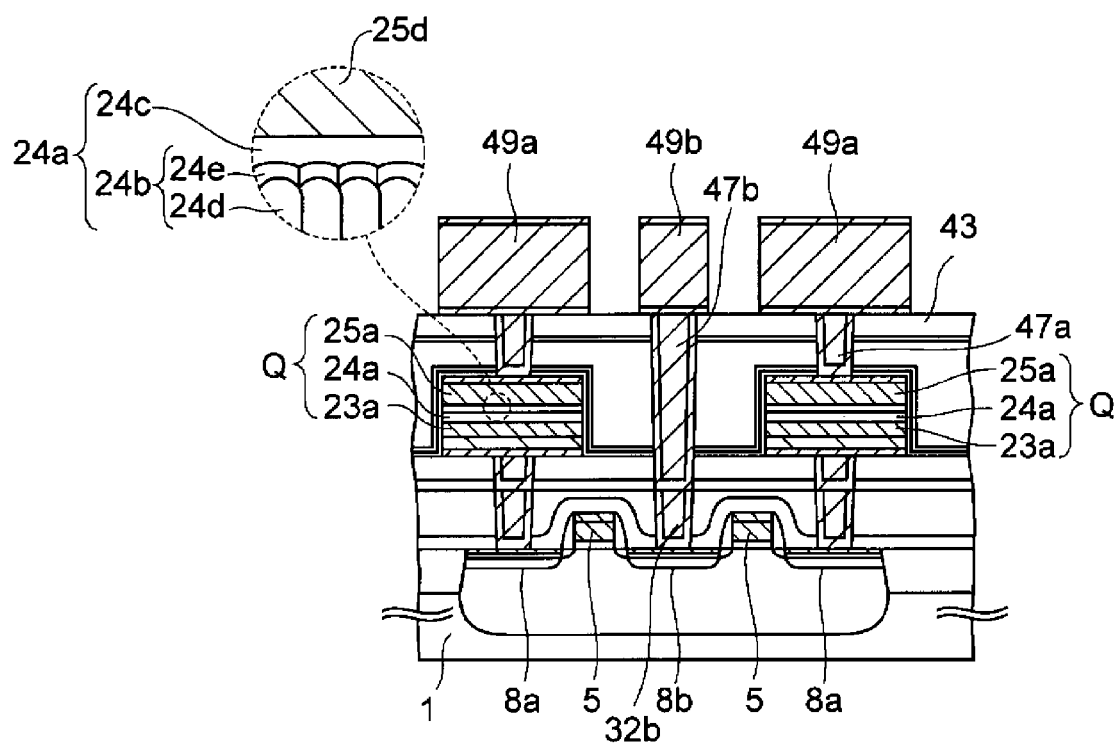

FIGS. 2A to 2X are cross-sectional views showing processes of manufacturing a semiconductor device according to the present embodiment.

This semiconductor device is a stacked-type FeRAM advantageous for miniaturization, and is formed as follows.

Firstly, steps for obtaining a cross-sectional structure shown in FIG. 2A will be described.

A groove for STI, which defines an active region of a transistor, is initially formed on a surface of an n-type or p-type silicon substrate 1. Then, an insulating film such as silicon oxide film is embedded therein as a device isolation insulating film 2. Note that a device isolation structure is not limited to STI, and a device isolation insulating film 2 may be formed by a LOCOS method.

Next, by carrying out the same step as that of FIG. 1A of the first embodiment, first and second MOS transistors $TR_1$ and $TR_2$ formed of gate insulating films 4, gate electrodes 5, first and second source/drain regions 8a and 8b, and the like, are formed in the active region of the silicon substrate 1.

Subsequently, a silicon nitride (SiN) film is formed with a thickness of approximately 80 nm on an entire upper surface of the silicon substrate 1 by a plasma CVD method, and is set to be a cover insulating film 10. Next, on this cover insulating film 10, a silicon oxide film is formed with a thickness of approximately 1000 nm, as a first interlayer insulating film 11 by a plasma CVD method using a TEOS gas.

Next, the upper surface of the first interlayer insulating film 11 is polished and planarized by a chemical mechanical polishing (CMP) method. As a result of this CMP, the thickness of the first interlayer insulating film 11 is approximately 700 nm on the flat surface of the silicon substrate 1.

Then, the cover insulating film 10 and the first interlayer insulating film 11 are patterned by photolithography to form contact holes each with a diameter of 0.25 μm on the first and second source/drain regions 8a and 8b. Furthermore, a glue film and a tungsten film are sequentially formed in each of the contact holes. After that, the excessive glue film and tungsten film on the first interlayer insulating film 11 are polished and removed by the CMP method, and these films are left only in the contact holes as first and second conductive plugs 32a and 32b.

The first and second conductive plugs 32a and 32b are electrically connected to the first and second source/drain regions 8a and 8b, respectively.

Incidentally, the above-described glue film is made by forming a titanium film with a thickness of approximately 30 nm and a titanium nitride film with a thickness of approximately 20 nm in this order. The tungsten film before the CMP has a thickness of approximately 300 nm on the first interlayer insulating film 11.

Here, since the first and second conductive plugs 32a and 32b are mainly formed of tungsten which is easily oxidized, contact defect may be caused when the first and second conductive plugs 32a and 32b are oxidized during the manufacturing processes.

To deal with this problem, as an antioxidant insulating film 14 for preventing the conductive plugs 32a and 32b from being oxidized, a silicon oxynitride film is formed with a thickness of approximately 130 nm on the conductive plugs 32a and 32b and on the first interlayer insulating film 11 by the plasma CVD method.

Note that instead of the silicon oxynitride film, a silicon nitride film or an alumina film may be formed as the antioxidant insulating film 14.

After that, a silicon oxide film is formed with a thickness of approximately 300 nm on the antioxidant insulating film 14 by the plasma CVD method using a TEOS gas. This silicon oxide film is used as a base insulating film 15.

Next, steps for obtaining a cross-sectional structure shown in FIG. 2B will be described.

Firstly, the base insulating film 15 and the antioxidant insulating film 14 are patterned, and thus first holes 15a are formed in these insulating films above the first conductive plugs 32a.

Next, a titanium nitride film is formed as a glue film 35 in the first contact holes 15a and on the base insulating film 15 by the sputtering method.

Moreover, a tungsten film is formed on this glue film 35 as a plug conductive film 36 by the CVD method, and then the first holes 15a are completely embedded with the plug conductive film 35.

Subsequently, as shown in FIG. 2C, the excessive glue film 35 and plug conductive film 36 on the base insulating film 15 are polished and removed by the CMP method. By this process, the glue film 35 and the plug conductive film 36 are left in the first holes 15a as third conductive plugs 36a electrically connected to the first conductive plugs 32a.

In this CMP, such a slurry is used that a polishing speed for the glue film 35 and for the plug conductive film 36 are faster than that for the base insulating film 15. For example, W2000 manufactured by Cabot Microelectronics Corporation is used. Moreover, in order not to leave polishing residuals on the base insulating film 15, a polishing amount in this CMP is set thicker than the total film thickness of the films 35 and 36, so that over-polishing is performed in this CMP.

Next, as shown in FIG. 2D, the base insulating film 15 made of silicon oxide is exposed to plasma containing nitrogen, such as ammonia ($NH_3$) plasma, to bond an NH group with each oxygen atom on the surface of the base insulating film 15.

Equipment used for this ammonia plasma processing is, for example, a parallel plate-type plasma processing equipment having an opposing electrode in a position away from the silicon substrate by approximately 9 mm (350 mils). Then, this processing is carried out in the following manner. Specifically, while maintaining a substrate temperate at 400° C. under the pressure of 266 Pa (2 Torr), an ammonia gas is supplied to the inside of a chamber with a flow rate of 350 sccm, and high frequency power of 13.56 MHz and 350 kHz are respectively supplied, for 60 seconds, to the silicon substrate 1 with power of 100 W and to the above-described opposed electrode with power of 55 W.

Subsequently, as shown in FIG. 2E, a titanium film is formed with a thickness of approximately 20 nm on each of the base insulating film 15 and the third conductive plugs 36a. This titanium film is used as a conductive adhesion film 16.

The film-forming conditions for the conductive adhesion film 16 are not particularly limited. In the present embodiment, the substrate temperature is set at 20° C. in the argon atmosphere of 0.15 Pa by using a sputtering chamber in which a distance between the silicon substrate 1 and a titanium target is set to be 60 mm. Then, DC power at 2.6 kW is supplied to the chamber for 5 seconds to form the conductive adhesion film 16 made of titanium.

Here, the ammonia plasma processing (see FIG. 2D) is carried out in advance to bond the NH group with each oxygen atom on the surface of the base insulating film 15. Therefore, titanium atoms deposited on the base insulating film 15 are less likely to be captured by the oxygen atoms on the surface of the base insulating film 15. For this reason, the titanium atoms can freely move on the surface of the base insulating film 15, and thus it is made possible to form the conductive adhesion film 16 made of titanium whose crystalline orientation is strongly self-oriented in a (002) direction.

After that, rapid thermal anneal (RTA) is carried out on the conductive adhesion film 16 in the nitrogen atmosphere with a substrate temperature of 650° C. and a processing time of 60 seconds. With this process, the conductive adhesion film 16 made of titanium is nitrided, and the conductive adhesion film 16 of titanium nitride, whose crystalline orientation is oriented in a (111) direction, is formed.

Incidentally, a material of the conductive adhesion film 16 is not limited to titanium nitride. The conductive adhesion film 16 may be formed of any one of titanium, titanium nitride, platinum, iridium, rhenium, ruthenium, palladium, rhodium, and osmium, or an alloy thereof. In addition, the conductive adhesion film 16 may be formed of any one of platinum oxide, iridium oxide, ruthenium oxide and palladium oxide.

Next, as shown in FIG. 2F, a titanium aluminum nitride (TiAlN) film is formed by a reactive sputtering method with a thickness of 100 nm as a conductive oxygen barrier film 17 on the conductive adhesion film 16.

The conductive oxygen barrier film 17 made of titanium aluminum nitride is superior in a function of preventing oxygen from being permeated, and plays a role of preventing occurrence of contact defect due to oxidation of the third conductive plugs 36a thereunder.

The film-forming conditions for the conductive oxygen barrier film 17 are not particularly limited. In the present embodiment, an alloy target of titanium and aluminum is used, and the mixed gas of an argon gas and a nitrogen gas is used for a sputtering gas. Then, the conductive oxygen barrier film 17 is formed under conditions with the flow rates of the argon gas and the oxygen gas at respectively 40 sccm and 100 sccm, pressure at 253.3 Pa, a substrate temperature at 400° C., and sputtering power at 1.0 kW.

Moreover, the material of the conductive oxygen barrier film 17 is not limited to titanium aluminum nitride. The conductive oxygen barrier film 17 may be made of any one of titanium aluminum nitride, titanium aluminum oxynitride (TiAlON), tantalum aluminum nitride (TaAlN), and tantalum aluminum oxynitride (TaAlON).

The adhesion strength of the conductive oxygen barrier film 17 with the base is increased with the conductive adhesion film 16. If adhesion strength is not considered to be a problem, the conductive adhesion film 16 may be omitted. In this case, the conductive oxygen barrier film 17 is directly formed on each of the upper surfaces of the third conductive plugs 36a and the base insulating film 15.

Next, as shown in FIG. 2G, an iridium film is formed with a thickness of approximately 100 nm as a first conductive film 23 on the conductive oxygen barrier film 17 by the sputtering method. The film-forming conditions of the iridium film are not particularly limited. In the present invention, the iridium film is formed by using an argon gas as a sputtering gas, and by applying sputtering power of 0.5 kW to the sputtering atmosphere under pressure of 0.11 Pa with a substrate temperature of 500° C.

After that, RTA with a substrate temperature of 650° C. or more is carried out on the first conductive film 23 in the argon atmosphere for 60 seconds. By this RTA, adhesion between the first conductive film 23 and the conductive oxygen barrier film 17 improves, and crystallinity of the first conductive film 23 also improves. Instead of the argon atmosphere, this RTA may be carried out in a nitrogen atmosphere.

Next, steps for forming a cross-sectional structure shown in FIG. 2H will be described.

Firstly, a PZT film is formed with a thickness of approximately 80 nm on the first conductive film 23 by the MOCVD method, and the PZT film is used as a main ferroelectric film 24d.

The MOCVD method is carried out as follows.

Firstly, the silicon substrate 1 is mounted on a susceptor in an unillustrated reaction chamber.

Next, oxygen is introduced into the reaction chamber, and a temperature of the silicon substrate 1 is increased to be stabilized at about 620° C.

Then, a vaporized THF solvent is introduced into the reaction chamber. Thereby, the first conductive film 23 is exposed to the atmosphere of the solvent gas.

By supplying the solvent gas before a source gas in this manner, the source gas is prevented from being solidified in a vaporizer or in a pipe. Thus, problems, such as clogging of the pipe, can be avoided. Instead of THF, vaporized butyl acetate may be used as the solvent gas.

Then, each of liquid sources of Pb, Zr, and Ti is vaporized in the vaporizer to form the source gas, and the forming of the PZT film is started by introducing each source gas into the reaction chamber.

Here, each liquid source may be made, for example, by dissolving each of $Pb(DPM)_2$ (chemical formula: $Pb(C_{11}H_{19}O_2)_2$), $Zr(dmhd)_4$ (chemical formula: $Zr(C_8H_{15}O_2)_4$), and $Ti(O-iOr)_2(DPM)_2$ (chemical formula: Ti $(C_3H_7O)_2(C_{11}H_{19}O_2)_2$) into a TFH (Tetra Hydro Furan: $C_4H_8O$) solvent with a concentration of 0.3 mol/l. In addition, a flow rate of the vaporized source gas is not particularly limited. In the present embodiment, the source gases of Pb, Zr, and Ti are obtained by supplying the above-described liquid sources to the vaporizer respectively with the flow rates of 0.32 ml per minute, 0.200 ml per minute, and 0.200 ml per minute, and then by vaporizing thereof.

Then, such a state is maintained under the pressure of 665 Pa (5 Torr) for approximately 620 seconds. Thereby, the above-described PZT film is formed with a thickness of 80 nm.

The main ferroelectric film 24d formed by the MOCVD method in this manner is already crystallized at the time of film forming, and the crystalline orientation thereof is aligned in the (111) direction. Accordingly, crystallization anneal for crystallizing the main ferroelectric film 24d is not necessary.

In addition, the use of the MOCVD method prevents ferroelectric characteristics of the main ferroelectric film 24d from being deteriorated even when the main ferroelectric film 24d is made thinner. This is an advantage in fabricating highly-integrated semiconductor devices. Such an advantage is easily obtained particularly in the stacked-type FeRAM of the present embodiment, which is advantageous for higher integration of capacitors.

Here, the silicon substrate 1 needs to be heated to high temperature for forming the film by the MOCVD method. However, when the constituting materials of the first conductive film 23 are thermally diffused to the main ferroelectric film 24d due to the heat, the ferroelectric characteristics, such as the switching charge, of the main ferroelectric film 24d are deteriorated. Such a problem is notably caused in the case where a platinum film is formed as the first conductive film 23. Therefore, it is preferable to avoid forming a platinum film as the first conductive film 23.

In contrast, when the first conductive film 23 is made of iridium as in the present embodiment, the deterioration of the main ferroelectric film 24d due to the thermal diffusion is hardly observed. In addition, the deterioration of the main ferroelectric film 24d due to thermal diffusion can be also prevented by forming the first conductive film 23 of ruthenium.

Accordingly, in the case where the main ferroelectric film 24d is formed by the MOCVD method, it is preferable that a conductive film of which any one of iridium and ruthenium is exposed onto the upper surface be formed as the first conductive film 23. Alternatively, the above-described deterioration of the main ferroelectric film 24d can be also prevented by forming, as the first conductive film 23a, conductive film of which any one of $SrRuO_3$ and $LaSrCoO_3$ is exposed on the upper surface.

Incidentally, when the main ferroelectric film 24d is crystallized as described above, unevenness due to crystal grains of the main ferroelectric film 24d is formed on the upper surface of the film 24d. When such unevenness remains formed, such a disadvantage arises that a voltage cannot be uniformly applied from an upper electrode to be described later, to the main ferroelectric film 24d.

To deal with this problem, in the present embodiment, an auxiliary ferroelectric film 24e is formed by the sol-gel method with a thickness of approximately 20 nm on the main ferroelectric film 24d, and thus the unevenness of the upper surface of the main ferroelectric film 24d is buried with the auxiliary ferroelectric film 24e.

In the sol-gel method, a film is formed by applying a solution. Therefore, as shown in the figure, the unevenness of the upper surface of the auxiliary ferroelectric film 24e becomes smaller than that of the upper surface of the main ferroelectric film 24d which is formed by the MOCVD method. Although the RMS (surface roughness) of the main ferroelectric film 24d is typically about 10 nm, the RMS of the auxiliary ferroelectric film 24e becomes about 6 to 7 nm.

The auxiliary ferroelectric film 24e is formed by the sol-gel method under the same conditions as the first ferroelectric film 24b described in the first embodiment, and the solution obtained by dissolving each of precursors of Pb, La, Zr and Ti in a butanol solvent with a concentration of 10 weight % is used. Then, the solution is applied onto the main ferroelectric film 24d by the spin coating method, so that one layer of PLZT-coating film is formed. After that, bake is carried out in the oxygen atmosphere of atmospheric pressure with a substrate temperature of 200 to 450° C., for example, 240° C., for approximately 5 minutes. Thereby, the above-described auxiliary ferroelectric film 24e is obtained.

By these steps, the first ferroelectric film 24b constructed from the main ferroelectric film 24d and the auxiliary ferroelectric film 24e is formed on the first conductive film 23.

Of these films 24d and 24e, the auxiliary ferroelectric film 24e formed by the sol-gel method is formed for the purpose of embedding the unevenness of the upper surface of the main ferroelectric film 24d. Therefore, it is preferable that the auxiliary ferroelectric film 24e have a thickness thinner than that of the main conductive ferroelectric film 24d, so that the first ferroelectric film 24b is mainly formed of the main ferroelectric film 24d.

Note that the auxiliary ferroelectric film 24e formed by the sol-gel method is not limited to the PLZT film.

The auxiliary ferroelectric film 24e may be formed of a ferroelectric material having an $ABO_3$-type perovskite structure (A represents any one of Bi, Pb, Ba, Sr, Ca, Na, K, and rare-earth elements, and B represents any one of Ti, Zr, Nb, Ta, W, Mn, Fe, Co, and Cr) as in PLZT.

Furthermore, Bi layer structure compounds such as $(Bi_{1-X}R_X)Ti_3O_{12}$ (R is a rare-earth element with 0<x<1), $SrBi_2Ta_2O_9$ (SBT) and $SrBi_4Ti_4O_{15}$ may be used as a material forming the auxiliary ferroelectric film 24e.

In addition, the main ferroelectric film 24d may be formed by the metal organic deposition (MOD) method.

Here, the auxiliary ferroelectric film 24e formed by the sol-gel method is not crystallized at the time of film forming. For this reason, auxiliary ferroelectric film 24e has poor ferroelectric characteristics in this state.

To deal with this problem, in the next step, as shown in FIG. 2I, crystallization anneal is carried out on the auxiliary ferroelectric film 24e in the atmosphere containing oxygen to crystallize the auxiliary ferroelectric film 24e.

The crystallization anneal is carried out by atmospheric-pressure RTA. Then, oxygen and argon, both of which have a flow rate of 1000 sccm, are supplied to the anneal atmosphere to carry out crystallization anneal for a processing time of 30 to 120 seconds, for example, 90 seconds.

In addition, a speed of raising a temperature for the crystallization anneal is also not particularly limited. In the present embodiment, the speed of raising a temperature is set at 40 to 150° C. per minute. To improve crystallinity of the auxiliary ferroelectric film 24e, it is preferable that the speed of raising the temperature be set to be as fast as possible, for example, 125° C. per minute.

In contrast, when the maximum substrate temperature in this crystallization anneal is too high, the surface layer described in the first embodiment is formed in the auxiliary ferroelectric film 24e. As a result, the crystal grains of the auxiliary ferroelectric film 24e and the crystal grains of the main ferroelectric film 24d may possibly not be bonded with each other.

Therefore, in order to suppress the formation of the surface layer, it is preferable that the lower limit of the maximum substrate temperature for the above-described anneal be set at a crystallization temperature of the auxiliary ferroelectric film 24e, and that the upper limit thereof be set to be a temperature 60° C. higher than the crystallization temperature. In the present embodiment, the maximum substrate temperature is set at 500 to 560° C., for example 550° C.

By setting the lower limit of the maximum substrate temperature to be relatively low in this manner, the crystallization develops from the lower surface of the auxiliary ferroelectric film 24e. Thus, the crystal grains of the auxiliary ferroelectric film 24e take over the crystal grains of the main ferroelectric film 24d. Accordingly, an interface is not easily formed between the ferroelectric films 24d and 24e, and unevenness of the auxiliary ferroelectric film 24e is suppressed.

Next, as shown in FIG. 2J, a PZT film is formed as a second ferroelectric film 24c on the first ferroelectric film 24b by the sputtering method. It is preferable that a thickness of the second ferroelectric film 24c be set at 1 to 50 nm, more preferably 10 to 30 nm, which is thinner than the thickness of the first ferroelectric film 24b.

Here, as described in the first embodiment, it is preferable that any one of strontium, calcium, niobium, iridium, and lanthanum be used as an additive element to be added to the PZT, with a concentration of 0.1 to 5 mol %, at the time of forming the second ferroelectric film 24c in order to improve the ferroelectric characteristics of the second ferroelectric film 24c. In the present embodiment, the PZT is doped with calcium, lanthanum and strontium respectively with concentrations of 5 mol %, 2 mol %, and 2.5 mol %.

With the above processes, a ferroelectric film 24 constructed from the first and second ferroelectric films 24b and 24c is formed on the first conductive film 23.

The reason why the second ferroelectric film 24c is formed thinner than the first ferroelectric film 24b as described above is that, as described in the first embodiment, the first ferroelectric film 24b is burdened with the most of the ferroelectric characteristics of the ferroelectric film 24, and the second ferroelectric film 24c suffices to planarize the upper surface of the ferroelectric film 24.

Subsequently, as shown in FIG. 2K, an iridium oxide film is formed with a thickness of approximately 25 nm as a first conductive metal oxide film 25d on the ferroelectric film 24 by the sputtering method, while heating the silicon substrate 1. As described in the first embodiment, the iridium oxide film formed by the sputtering method in which the silicon substrate 1 is heated is already crystallized at the time of forming thereof without carrying out a process for crystallization of the iridium oxide film.

The film-forming conditions of the first conductive metal oxide film 25d are not particularly limited. In the present embodiment, conditions are as follows. Specifically, while maintaining the substrate temperature at 300° C., the iridium target is used, and the mixed gas of an oxygen gas at the flow rate of 140 sccm and the argon gas at the flow rate of 60 sccm is used as a sputtering gas. In addition, the sputtering power is set at 1 to 2 kW.

Here, the ferroelectric film 24 may have been damaged by the sputtering gas at the time of forming the first conductive metal oxide film 25d by the sputtering method, and have insufficient oxygen concentration in the film. Therefore, ferroelectric characteristics of ferroelectric film 24 may possibly be deteriorated.

To deal with this problem, by carrying out RTA in the mixed atmosphere of argon and oxygen after the above-described first conductive metal oxide film 25d is formed, the damages received in the ferroelectric film 24 due to the sputtering are recovered, and the oxygen loss in the ferroelectric film 24 is compensated.

The conditions for this RTA are not particularly limited. In the present embodiment, a substrate temperature is set at 725° C., and a processing time is set to be 60 seconds. In addition, flow rates of argon and oxygen are respectively set at 2000 sccm and 20 sccm. As in the case of the first embodiment, the examples of the oxidizing gas in this RTA includes an ozone gas or a nitrogen dioxide gas, in addition to an oxygen gas.

Here, the first conductive metal oxide film 25d is crystallized at the time of film forming.

Therefore, unevenness is formed in an interface between the first conductive metal oxide film 25d and the ferroelectric film 24, due to the crystal grains of the first conductive metal oxide film 25d. This RTA can also provide an advantage that such unevenness can be planarized.

Next, while maintaining the substrate temperature at room temperature, an iridium oxide film is formed by the sputtering method with a thickness of approximately 100 to 300 nm, for example, 200 nm, as a second conductive metal oxide film 25e on the first conductive metal oxide film 25d. The second conductive metal oxide film 25e is formed in the argon atmosphere having pressure of 0.8 Pa with the sputtering power set at 1.0 kW and a film-forming time for 79 seconds.

Here, unlike the first conductive metal oxide film 25d crystallized at a high film-forming temperature, the second conductive metal oxide film 25e formed by the sputtering method with a substrate temperature at room temperature is made to be in an amorphous state.

This second conductive metal oxide film 25e is formed in order to prevent the ferroelectric film 24 from being deteriorated. Therefore, it is preferable that an oxidation number of iridium oxide constituting the second conductive metal oxide film 25e be set as large as possible so as to suppress the reducing action of the second conductive metal oxide film 25e against water. To increase the oxidation number in this manner, it suffices that a flow rate ratio of oxygen in the sputtering gas be increased in comparison with that in the case of forming the first conductive metal oxide film 25d. With this process, iridium grains flying from the iridium target are sufficiently oxidized in the sputtering atmosphere. Thus, it is made possible to form an iridium oxide film with an oxidation number close to that of stoichiometry composition ($IrO_2$).

A conductive metal oxide film 25b is constructed from the second conductive metal oxide film 25e and the first conductive metal oxide film 25d as shown in FIG. 5K.

Incidentally, the material constituting the first and second conductive metal oxide films 25d and 25e is not limited to iridium oxide. The first and second conductive metal oxide films 25d and 25e may be formed of an oxide of any one of iridium, ruthenium, rhodium, rhenium, and osmium. Furthermore, these oxides may be stacked as the conductive metal oxide film 25b.

Next, as shown in FIG. 2L, an iridium film is formed with a thickness of 50 to 100 nm on the conductive metal oxide film 25b as a conductivity enhancing film 25c by the sputtering method. The sputtering method is carried out in the argon atmosphere with the pressure of 1 Pa, and the sputtering power of 1.0 kW is applied to the sputtering atmosphere.

Together with the conductive metal oxide film 25b, the conductivity enhancing film 25c constitutes a second conductive film 25, and plays a role of compensating the conductivity of the second conductive film 25, which tends to be insufficient when the film 25 is constructed from the conductive metal oxide film 25b alone.

The conductivity enhancing film 25c is not limited to the iridium film. The conductivity enhancing film 25c may be formed of any one of iridium, platinum, ruthenium, rhodium, rhenium, osmium, and palladium, or an oxide thereof.

After that, the back surface of the silicon substrate 1 is cleaned.

Next, as shown in FIG. 2M, a titanium nitride film is formed on the second conductive film 25 by the sputtering method, and the titanium nitride film is set to be a first mask material layer 26.

Furthermore, a silicon oxide film is formed as a second mask material layer 27 on the first mask material layer 26 by using the plasma CVD method using a TEOS gas.

Subsequently, as shown in FIG. 2N, the second mask material layer 27 is patterned to form second hard masks 27a of an island-shape.

Next, steps for obtaining a cross-sectional structure shown in FIG. 2O will be described.

Firstly, a first hard mask 26a is formed by etching the first mask material layer 26 while using the second hard mask 27a as a mask.

Subsequently, portions of the films 23 to 25 not covered with the first and second hard masks 26a and 27a are patterned by dry etching.

By these steps, the first conductive film 23, the ferroelectric film 24, and the second conductive film 25 are respectively made to be a lower electrode 23a, a capacitor dielectric film 24a, and an upper electrode 25a, which form ferroelectric capacitor Q.

A gas for the dry etching is not particularly limited, and the mixed gas of HBr and oxygen is used as the etching gas for the first and second conductive films 23 and 25. On the other hand, the mixed gas of chlorine and argon is used as the etching gas for the ferroelectric film 24. Note that a $C_4F_8$ gas may be added to these gases.

The conductive oxygen barrier film 17 has etching tolerance against the etching gas for the first conductive film 23. Therefore, the conductive oxygen barrier film 17 is left on the entire surface of the conductive adhesion film 16 even after the capacitors Q are formed.

Each of the capacitors Q formed in this manner is electrically connected to the corresponding first conductive plug 32a via the conductive oxygen barrier film 17, the conductive adhesion film 16, and the third conductive plug 36a.

Subsequently, as shown in FIG. 2P, by using the mixed solution of hydrogen peroxide ($H_2O_2$), ammonia, and water as an etching solution, the second hard mask 27a formed of silicon oxide is removed by wet etching. Note that the second hard mask 27a may be removed by dry etching.

Next, steps for obtaining a cross-sectional structure shown in FIG. 2Q will be described.

Firstly, while using the first hard masks 26a as masks, the conductive adhesion film 16 and the conductive oxygen barrier film 17 are etched, and these films are left only under each capacitor Q. This etching is carried out with dry etching, and the mixed gas of argon and chlorine, for example, is used as an etching gas.

In addition, the first hard masks 26a are also etched by the etching gas. As a result, the first hard masks 26a are removed when the etching is completed, and an upper surface of the upper electrode 25a is exposed.

Next, as shown in FIG. 2R, an alumina film covering each capacitor Q is formed with a thickness of approximately 20 nm, and this alumina film is used as a first capacitor protective insulating film 39. Alumina constituting the first capacitor protective insulating film 39 has an excellent capability of preventing hydrogen from permeated. Thus, hydrogen in the outside is blocked by this first capacitor protective insulating film 39, and thereby deterioration of the capacitor dielectric film 24a due to hydrogen can be prevented.

Here, the capacitor dielectric films 24a have received damages due to dry etching at the time of forming the capacitors Q (see FIG. 2O) and by the sputtering method at the time of forming the first capacitor protective insulating film 39.

To deal with this problem and to recover the damages in the capacitor dielectric films 24a, as shown in FIG. 2S, recovery anneal is carried out on the capacitor dielectric film 24a in the atmosphere containing oxygen. The conditions for this recovery anneal are not particularly limited. In the present embodiment, a substrate temperature is set at 550 to 700° C., for example, 650° C. in a furnace, and a processing time is set to be approximately 60 minutes.

Subsequently, as shown in FIG. 2T, an alumina film is formed with a thickness of approximately 20 nm on the first capacitor protective insulating film 39 by the CVD method. This alumina film is used as a second capacitor protective insulating film 40.

Next, steps for obtaining a cross-sectional structure shown in FIG. 2U will be described.

Firstly, a silicon oxide film is formed as a second interlayer insulating film 41 on the second capacitor protective insulating film 40 by plasma CVD using a TEOS gas as a reactant gas. The reactant gas includes an oxygen gas and a helium gas. In addition, the thickness of the second interlayer insulating film 41 is not particularly limited. In the present embodiment, the thickness on the flat surface of the silicon substrate 1 is set to be 1500 nm.

Instead of the silicon oxide film, an insulating inorganic film may be formed as the second interlayer insulating film 41.

After that, the surface of the second interlayer insulating film 41 is polished and planarized by the CMP method.

Furthermore, the surface of the second interlayer insulating film 41 is exposed to $N_2O$ plasma as dehydration processing to the second interlayer insulating film 41. With this $N_2O$ plasma, moisture remaining inside the second interlayer insulating film 41 is removed, and moisture is prevented from again absorbed into the second interlayer insulating film 41.

Note that $N_2$ plasma processing may be carried out as the dehydration processing.

Next, a flat alumina film is formed with a thickness of approximately 20 to 100 nm on the second interlayer insulating film 41 by the sputtering method. This alumina film is used as a third capacitor protective insulating film 42. The third capacitor protective insulating film 42 is formed on the planarized second interlayer insulating film 41. Hence, the third capacitor protective insulating film 42 does not need to have excellent coverage characteristics, and is formed by the low-cost sputtering method as described above. However, a method for forming the third capacitor protective insulating film 42 is not limited to the sputtering method, and the CVD method may be used.

Thereafter, as shown in FIG. 2V, a silicon oxide film is formed with a thickness of about 300 to 500 nm as a cap insulating film 43 on the third capacitor protective insulating film 42, by using the plasma CVD method using a TEOS gas. Note that a silicon oxynitride film or a silicon nitride film may be formed as the cap insulating film 43.

Next, steps for obtaining a cross-sectional structure shown in FIG. 2W will be described.

Firstly, the first to third capacitor protective insulating films 39, 40, and 42, the second interlayer insulating film 41, and the cap insulating film 43 are patterned to form second holes 41a in these films on the upper electrodes 25a.

Subsequently, to recover damages received in the capacitor dielectric film 24a during the above steps, the silicon substrate 1 is placed in an unillustrated furnace, and recovery anneal is carried out in the oxygen atmosphere with a substrate temperature of 550° C. for approximately 40 minutes.

Next, the first to third capacitor protective insulating films 39, 40, and 42, the second interlayer insulating film 41, the cap insulating film 43, the base insulating film 15, and the antioxidant insulating film 14 on the second conductive plug 32b are patterned to form a third hole 41b in these films.

Note that the second holes 41a are covered with a resist pattern at the time of patterning. The resist pattern protects the second holes 41a from the etching atmosphere.

Here, if these holes 41a and 41b are formed simultaneously, the following problem occurs. Specifically, the upper electrodes 25a in the second holes 41a are exposed to the etching atmosphere for a long time until the deep third hole 41b is opened, so that the capacitor dielectric films 24a are deteriorated.

In the present embodiment, since the second and third holes 41a and 41b with different depths are formed separately as described above, such a problem can be avoided.

Furthermore, the second conductive plug 32b on the second source/drain region 8b is covered with the antioxidant insulating film 14 until the present step is completed. Thereby, contact defect caused by oxidation of tungsten constituting the second conductive plug 32b is prevented.

Next, by the sputtering method, a titanium film and a titanium nitride film are formed in this order as a glue film on the cap insulating film 43 and in the second and third holes 41a and 41b.

Incidentally, the titanium nitride film may be also formed by the MOCVD method. In this case, it is preferable that anneal be carried out on the titanium nitride film in a plasma atmosphere of nitrogen and hydrogen to remove carbon from the titanium nitride film. Even when anneal is carried out in the atmosphere containing hydrogen in this manner, the conductivity enhancing film 25c (see FIG. 5L) made of iridium formed on the uppermost layer of the upper electrode 25a blocks hydrogen. Accordingly, the conductive metal oxide film 25b is not reduced by hydrogen.

Furthermore, a tungsten film is formed on the glue film by the CVD method, and the second and third holes 41a and 41b are completely embedded by this tungsten film.

Then, the excessive glue film and tungsten film on the cap insulating film 43 are polished and removed by the CMP method, and these films are left as fourth and fifth conductive plugs 47a and 47b only in the second and third holes 41a and 41b.

Of these conductive plugs 47a and 47b, the fourth conductive plugs 47a are electrically connected to the upper electrodes 25a of the capacitors Q. On the other hand, the fifth conductive plug 47b is electrically connected to the second conductive plug 32b to constitute one portion of a bit line together with the second conductive plug 32b.

After that, as shown in FIG. 2X, a metal laminated film is formed on each of the cap insulating film 43 and the conductive plugs 47a and 47b by the sputtering method. The metal laminated film is then patterned to form first layer metal wirings 49a and a conductive pad 49b for the bit line.

As the metal laminated film, films are formed in the order of a titanium film with a thickness of 60 nm, a titanium nitride film with a thickness of 30 nm, a copper-containing aluminum film with a thickness of 360 nm, a titanium film with a thickness of 5 nm, and a titanium nitride film with a thickness of 70 nm.

Thereby, a basic structure of the semiconductor device according to the present invention is completed.

Thereafter, a metal wiring and an interlayer insulating film are stacked, and steps for forming up to a metal wiring of the fifth layer are carried out. However, the detailed description thereof will be omitted.

In the above-described embodiment, as shown in the dotted circle in FIG. 2X, the auxiliary ferroelectric film 24e, which is formed by the sol-gel method, is formed on the main ferroelectric film 24d formed by the MOCVD method, and the first ferroelectric film 24b is constructed from these films 24d, 24e.

Of these films 24d and 24e, the main ferroelectric film 24d formed by the MOCVD method contributes to miniaturization of FeRAM, since the deterioration of the ferroelectric characteristics, such as the switching charge, is not easily deteriorated even when the main ferroelectric film formed by the MOCVD method is made thinner.

On the other hand, the auxiliary ferroelectric film 24e formed by the sol-gel method plays a role of causing a voltage to be uniformly applied from the upper electrode 25a to the capacitor dielectric film 24a, by embedding the unevenness formed in the upper surface of the main ferroelectric film 24d due to the PZT crystal grains.

Furthermore, as in the case of the first embodiment, the second ferroelectric film 24c is formed on the first ferroelectric film 24b by the sputtering method. Thus, an interface between the second ferroelectric film 24c and the first conductive metal oxide film 25d is made substantially flat. Accordingly, a paraelectric layer due to interdiffusion of these films 24c and 25d is less likely to be formed in the interface. Thereby, a ratio of the above-described paraelectric layer in the ferroelectric film 24 can be reduced, and the switching charge of the capacitors Q is made larger.

Moreover, since the first conductive metal oxide film 25d formed on the second ferroelectric film 24c is crystallized while being formed, the interface between the second ferroelectric film 24c and the first conductive metal oxide film 25d is made stable. Accordingly, the formation of the interface layer due to the interdiffusion of these films 24c and 25d can be more effectively prevented. Thus, it is made easier to increase the switching charge of the capacitors Q.

The inventors has carried out the following studies so as to check whether or not ferroelectric characteristics, such as switching charge, actually improved in the capacitor Q formed in accordance with the present embodiment.

Figure 3:
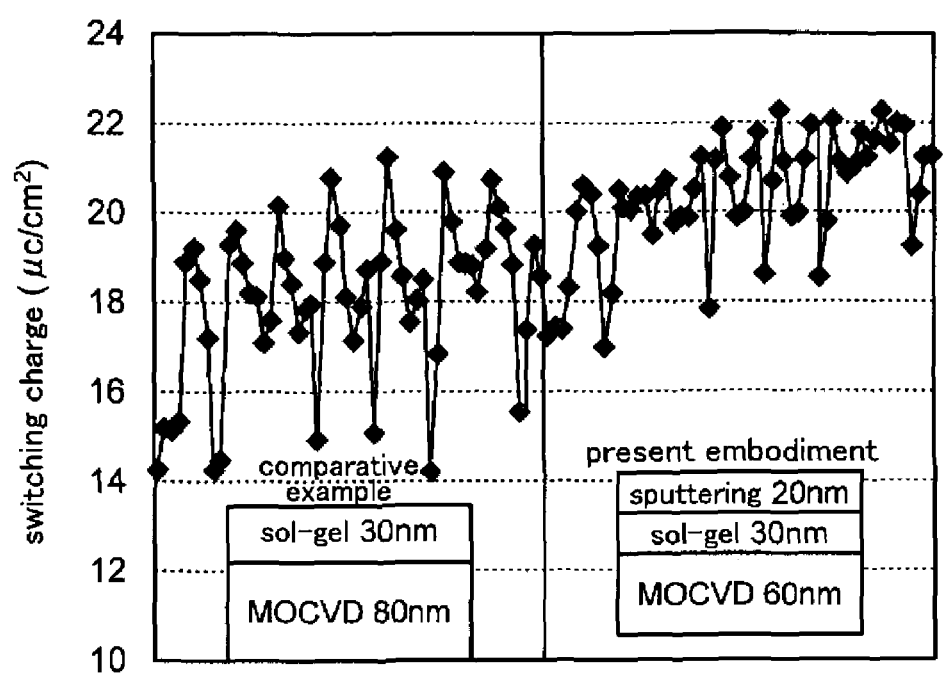
FIG. 3 is a graph showing switching charge of capacitors in a case where films are formed up to meal wirings of a first layer.

FIG. 3 is a graph showing switching charge Qsw of capacitors Q in the case where films are formed up to the first layer metal wirings 49a.

Note that the switching charge Qsw is defined by the following equation (1).

$$Q_{SW} = \frac{(N-U)+(P-D)}{2} \quad (1)$$

Figure 4:
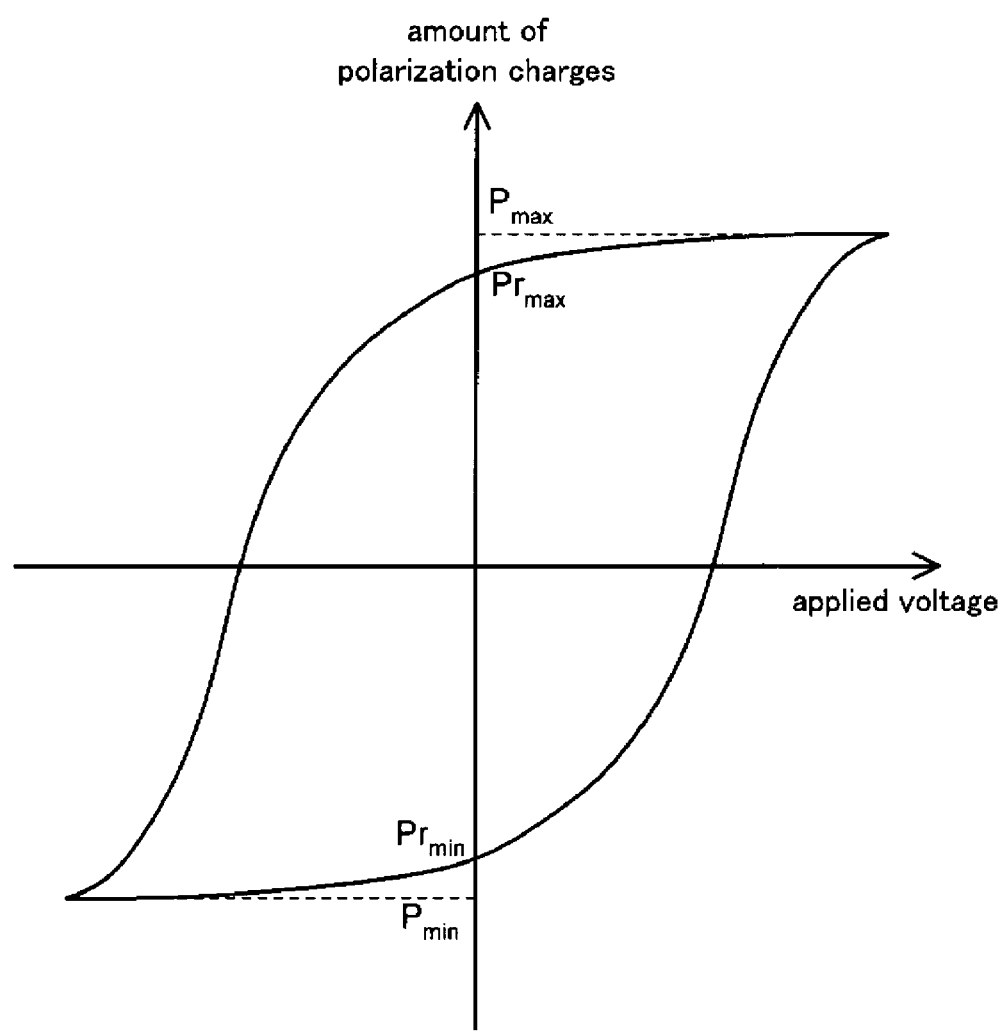
FIG. 4 is a graph showing a hysteresis loop of a ferroelectric substance.

Here, P, U, N and D in the equation 1 are defined as follows by using a hysteresis loop of a ferroelectric substance in FIG. 4.

$P=P_{max}-Pr_{min}$ $U=P_{max}-Pr_{max}$ $N=Pr_{max}-P_{min}$ $D=Pr_{min}-P_{nin}$ where $P_{max}$ ($P_{min}$) is the maximum (minimum) amount of polarization charges, and $Pr_{max}$ ($Pr_{min}$) is the maximum (minimum) amount of residual polarization charges.

In the study shown in FIG. 3, 5152 capacitors, each of which had a square planar shape with a length of one side thereof being 0.7 μm, were integrally formed in accordance with the present embodiment. The vertexes of each of the graphs in FIG. 3 respectively show values in 56 points in the surface of the silicon substrate.

Furthermore, this study also examined, as a comparative example, a sample obtained by constructing the capacitor dielectric film 24a from only the first ferroelectric film 24b without forming the second ferroelectric film 24c by the sputtering method.

As shown in FIG. 3, in the present embodiment in which the second ferroelectric film 24c was formed by the sputtering method, the switching charge increased as compared with those in the comparative example. Accordingly, it was confirmed that the second ferroelectric film 24c formed by the sputtering method actually contributed to the improvement in ferroelectric characteristics.

Figure 5:
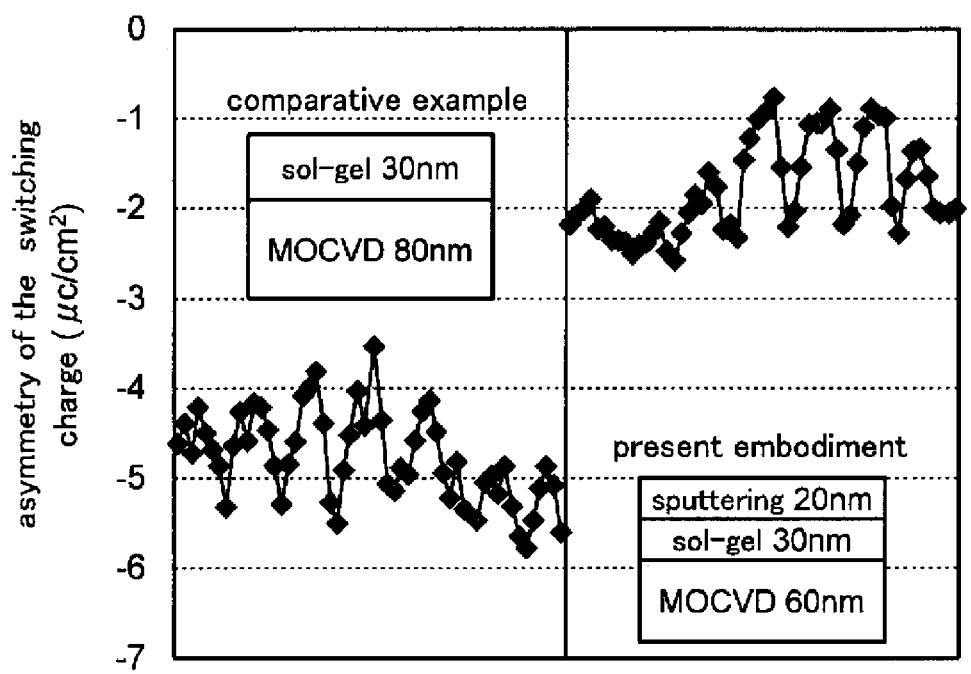
FIG. 5 is a graph obtained by checking asymmetry of the switching charge of the capacitors.

FIG. 5 is a graph obtained by checking asymmetry of the switching charge on the same sample as that shown in FIG. 3.

Incidentally, the asymmetry ASYM is defined by the following equation (2).

$$ASYM = \frac{(N-U)-(P-D)}{2} \quad (2)$$

The asymmetry is an index showing symmetry of the hysteresis loop, and when its value is closer to zero, imprint characteristic is understood to be excellent.

As shown in FIG. 5, the asymmetry of the present embodiment is closer to zero than that of the comparative example. From this result, it was understood that the hysteresis characteristic of the capacitor Q was improved by forming the second ferroelectric film 24c by the sputtering method.

Figure 6:
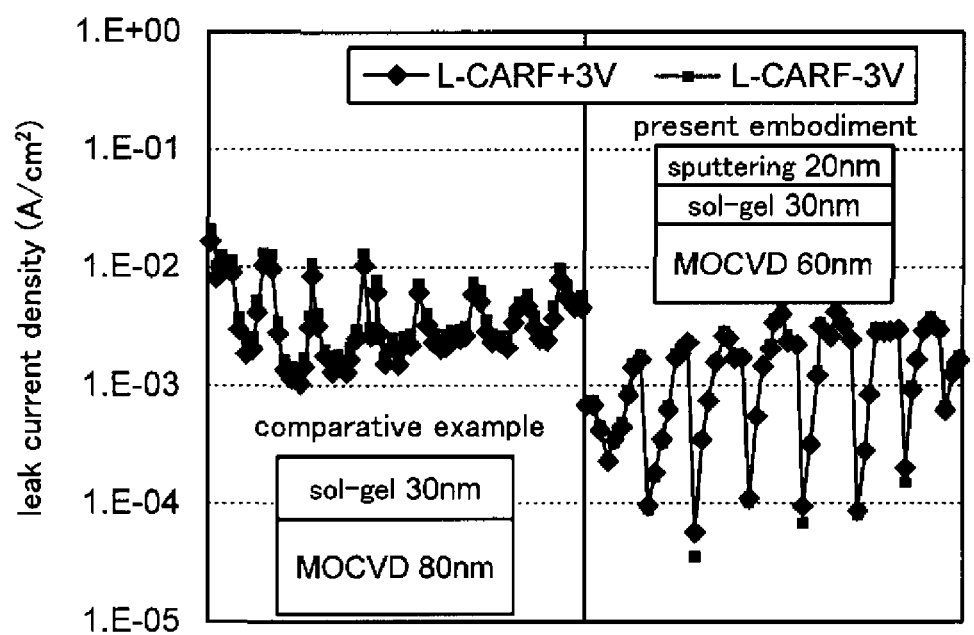
FIG. 6 is a graph obtained by checking leak current densities of the capacitors.

FIG. 6 is a graph obtained by checking leak current densities of each capacitor on the same sample as that shown in FIG. 3.

Note that "LCAPF+3V" and "LCAPF−3V" in FIG. 6 show that voltages of +3V and −3V were respectively applied to the upper electrode 25a when measured from the lower electrode 23a.

As shown in FIG. 6, the leak current density of the present embodiment, in which the second ferroelectric film 24c is formed by the sputtering method, was lower than that of the comparative example. The reason thereof is considered to be that the crystal grain boundary of the first ferroelectric film 24b, which is one of causes for a leak path, is embedded with the amorphous PZT at the time of forming the second ferroelectric film 24c.

Figure 7:
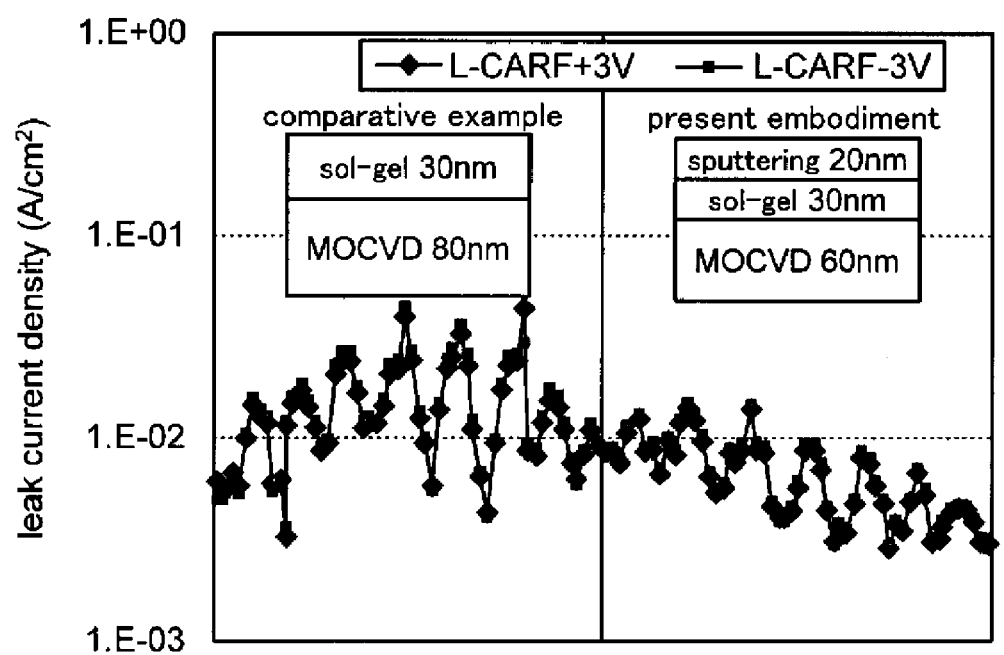
FIG. 7 is a graph obtained by checking leak current densities of a plurality of separated capacitors.

In contrast, FIG. 7 is a graph obtained by checking leak current densities in 56 points in the surface of the silicon substrate in the case where a plurality of square planer capacitors was separately formed. Here, length of one side of each capacitor was 50 μm.

Note that the comparative example in FIG. 7 shows values obtained from the sample, in which only the first ferroelectric film 24b was formed, and the second ferroelectric film 24c formed by the sputtering method was omitted. Furthermore, a plurality of capacitors was formed separately from one another in this sample.

As shown in FIG. 7, even in the case where the capacitors are formed separately from one another in this manner, the leak current density in the present embodiment was lower than that in the comparative example.

Figure 8:
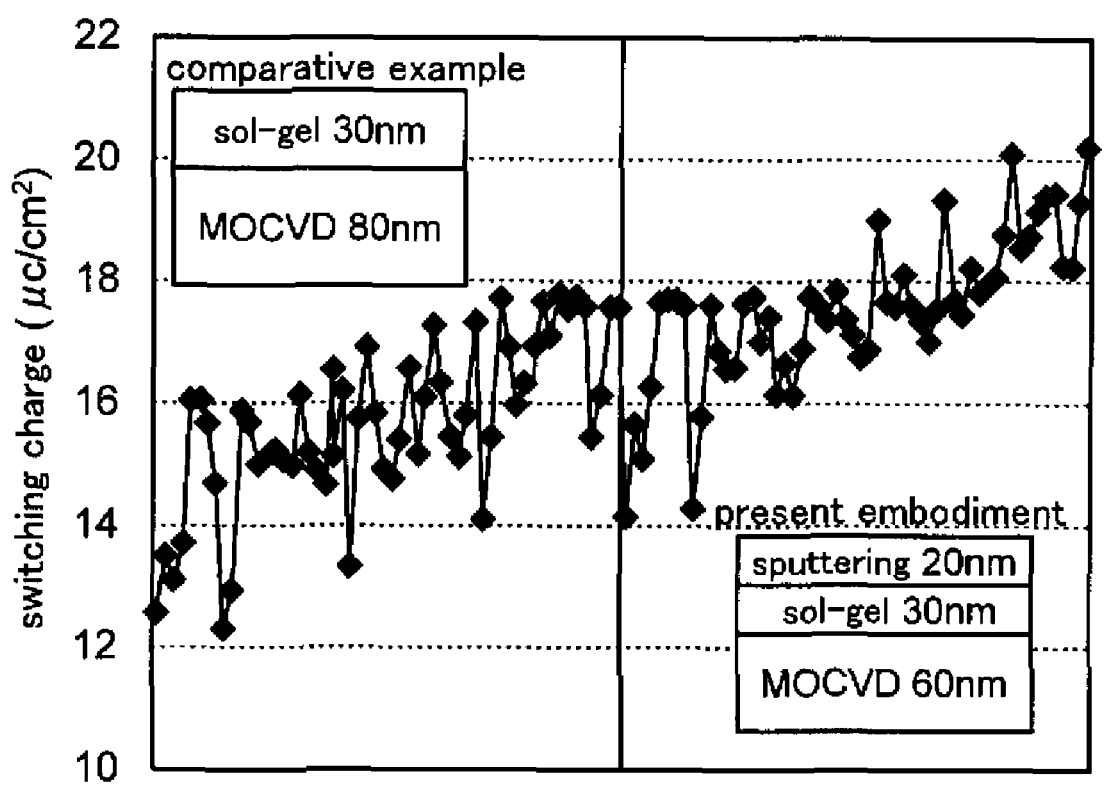
FIG. 8 is a graph obtained by checking the switching charge of the capacitors in a case where films are formed up to the metal wirings of a fifth layer.

FIG. 8 is a graph obtained by studying the switching charge described in FIG. 3 in the case where layers were formed up to fifth layer metal wirings.

As shown in FIG. 8, even in the case where films were formed up to the fifth layer metal wirings employed in an actual product, the switching charge in the present embodiment was larger than that in the comparative example.

Figure 9:
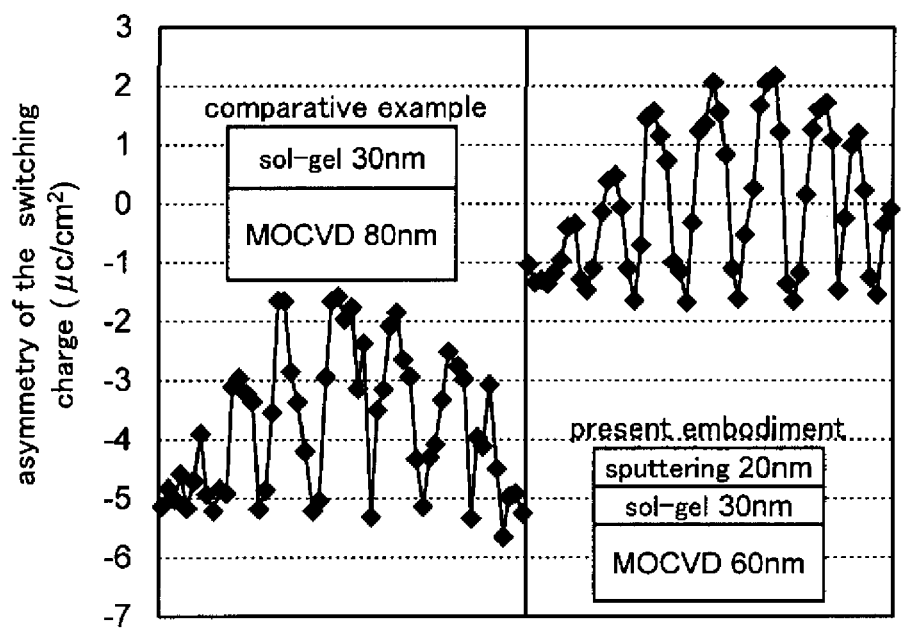
FIG. 9 is a graph obtained by checking asymmetry of the switching charge of the capacitors in a case where films are formed up to the metal wirings of the fifth layer.
Figure 10:
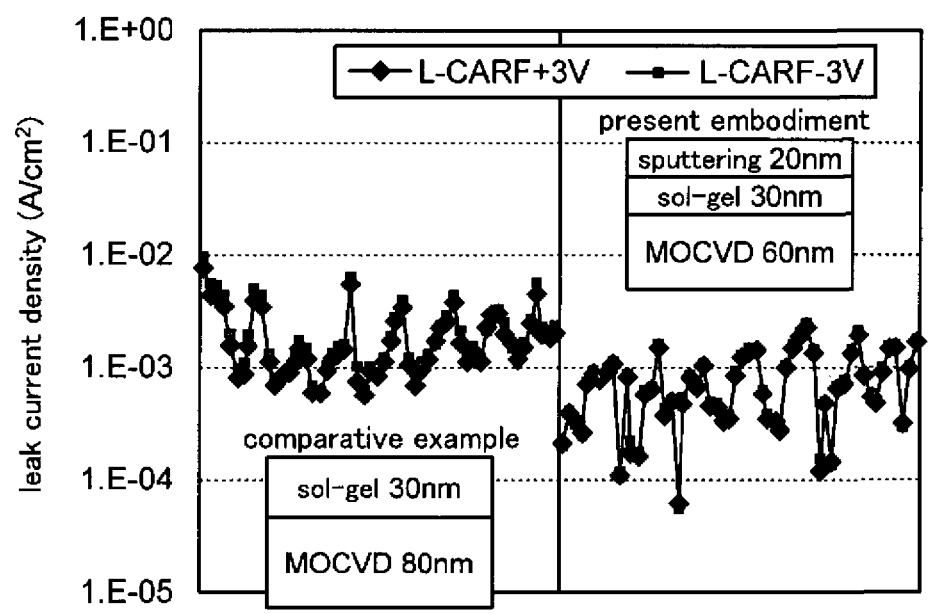

FIG. 9 is a graph obtained by studying the asymmetry of the switching charge described in FIG. 5 in the case where films were formed up to the fifth layer metal wirings.

As shown in FIG. 9, the asymmetry in the present embodiment was closer to zero than that of the comparative example regardless of whether or not films were formed up to the fifth layer metal wirings.

Figure 10:
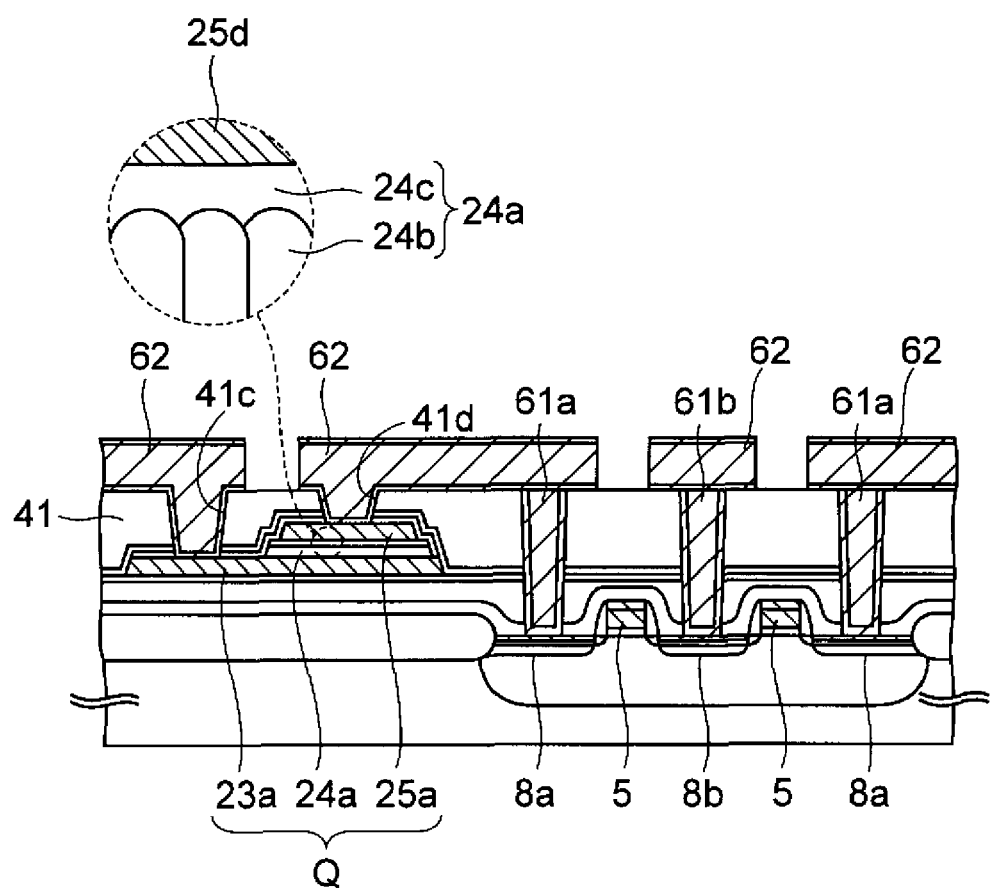
FIG. 10 is a graph obtained by checking leak current densities in a case where films are formed up to the metal wirings of the fifth layer.

FIG. 10 is a graph obtained by studying the leak current densities described in FIG. 7 in the case where films were formed up to the fifth layer metal wirings.

As shown in FIG. 10, even in the case where the capacitors are formed separately from one another, the leak current density in the present embodiment was smaller than that in the comparative example.

Figure 11:
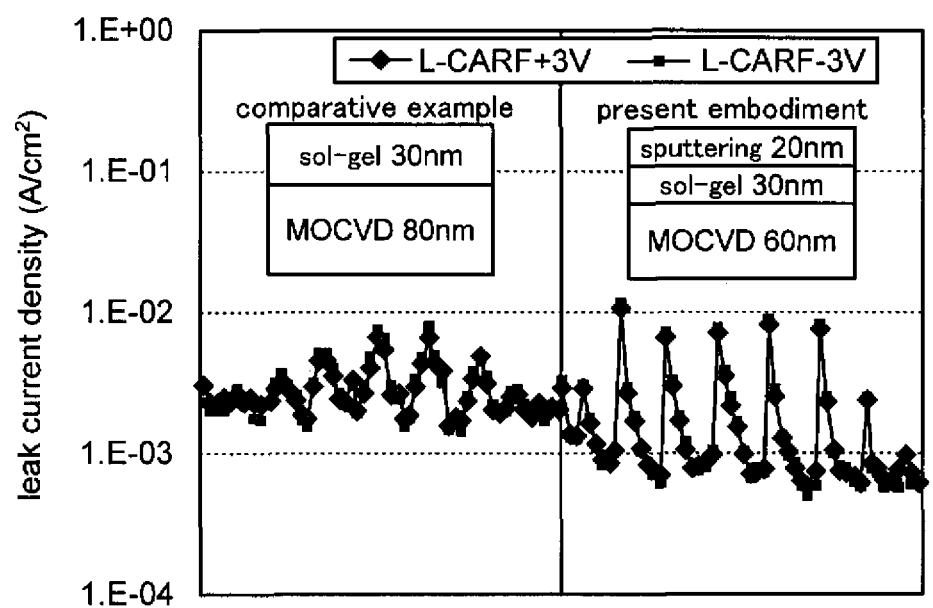
FIG. 11 is a graph obtained by checking leak current densities in a case where a plurality of capacitors are integrally formed.

FIG. 11 is a graph obtained by studying the leak current densities described in FIG. 6 in the case where films were formed up to the fifth layer metal wirings.

As shown in FIG. 11, in the case where a plurality of capacitors was integrally formed, the leak current density was larger than that in the comparative example in some points. The reason thereof is considered to be the unevenness of collective etching (see FIG. 20) on the capacitors in the periphery of the silicon substrate. At points other than these points, the leak current density in the present embodiment was smaller than that in the comparative example. Thus, the effect of forming the second ferroelectric film 24c by the sputtering method was observed.

Figure 12:
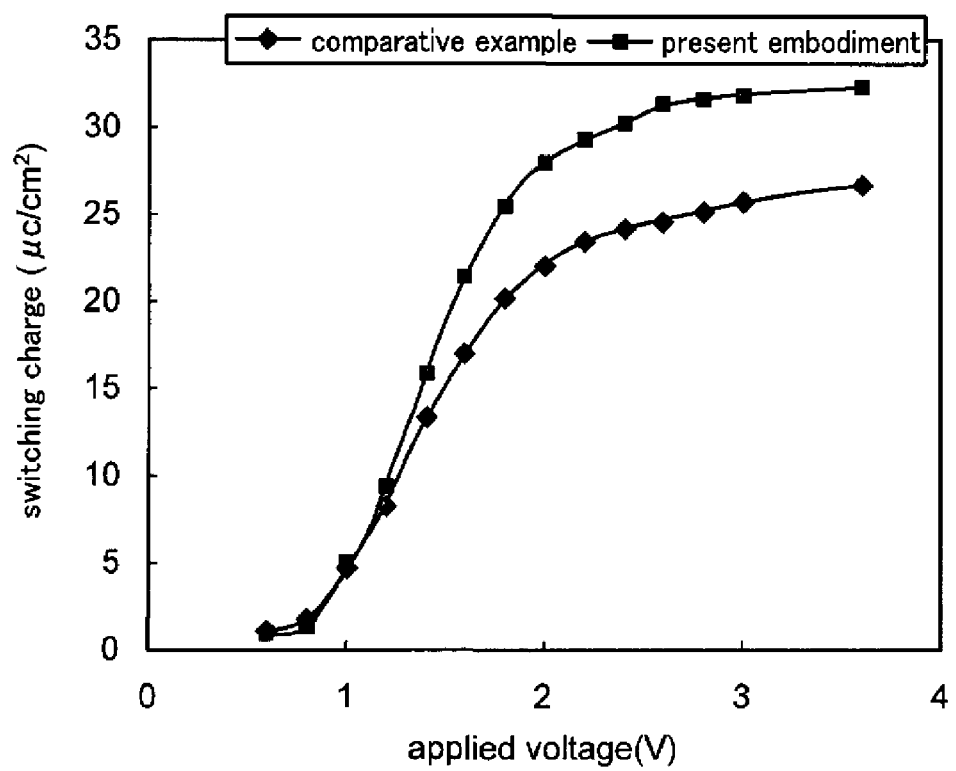
FIG. 12 is a graph obtained by checking a relationship between a voltage applied to a capacitor and switching charge in a case where a plurality of capacitors are formed separately from one another.

FIG. 12 is a graph obtained by checking a relationship between the voltage applied to the capacitor and switching charge in the case where films were formed up the fifth layer metal wirings. Note that the voltage applied to the capacitor is defined as a voltage applied between the upper and lower electrodes 25a and 23a.

In addition, this study was carried out on a plurality of capacitors formed separately from one another. Moreover, the results of the study on the sample in which the second ferroelectric film 24c was not formed are also shown as a comparative example.

As shown in FIG. 12, in the present embodiment, the switching charge higher than that in the comparative example was obtained at voltages ranging from a low voltage to a saturation voltage. In addition, the graph of the present invention show steeper gradient than that of the comparative example. From these results, it was confirmed that the second ferroelectric film 24c formed by the sputtering method as in the case of the present embodiment was suitable for next-generation FeRAM capable of operating at a low voltage.

Figure 13:
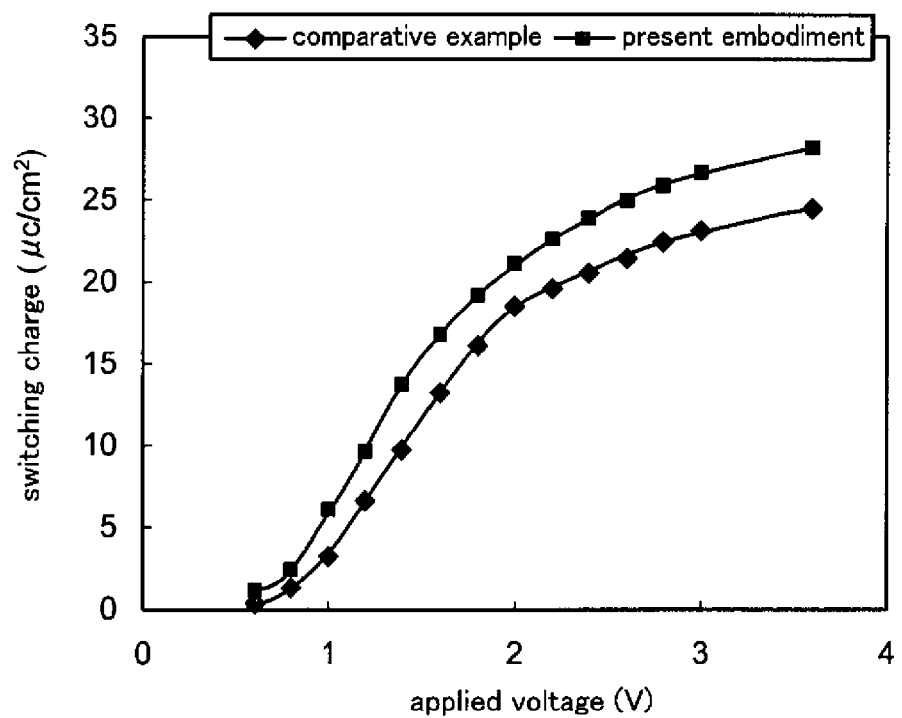
FIG. 13 is a graph obtained by checking a relationship between a voltage applied to a capacitor and switching charge in a case where a plurality of capacitors are integrally formed.

In contrast, FIG. 13 is a graph obtained by carrying out the same study as that shown in FIG. 12 on the sample in which 5152 capacitors are integrally formed.

As shown in FIG. 13, even in the case where the capacitors are integrally formed, the switching charge in the present embodiment was larger than that in the comparative example.

As described by referring to FIGS. 3 to 13, the characteristics of each capacitor of the present embodiment, in which the second ferroelectric film 24c was formed by the sputtering method, were superior to those of the comparative example. The reason thereof is considered to be as follows.

That is, in the comparative example, the interface between the auxiliary ferroelectric film 24e formed by the sol-gel method and the first conductive metal oxide film 25d cannot be controlled. For this reason, a paraelectric layer due to interdiffusion of these films 24e and 25d is thickly formed in the interface, and the voltage to be applied to the ferroelectric film 24 is applied to the paraelectric layer. As a result, net voltage applied to the ferroelectric film 24 is decreased. That is, if a film formed by the sol-gel method is used as an uppermost layer of the capacitor dielectric film 24a, a voltage is unnecessarily absorbed in the interface between the upper electrode 25a and the capacitor dielectric film 24a.

On the other hand, in the present embodiment, instead of an auxiliary ferroelectric film 24e formed by the sol-gel method, the second ferroelectric film 24c formed by the sputtering method is used for the uppermost layer of the capacitor.

Thereby, it is made possible to control the interface between the upper electrode 25a and the capacitor dielectric film 24a, and thus the paraelectric layer formed in the interface is made thin. As a result, it is made possible that the bulk of the voltage applied to the capacitor is applied to the capacitor dielectric film 24a, and thereby the ferroelectric characteristics, such as the switching charge, the leak current density and the asymmetry of the capacitor, become favorable as shown in the results of each of the studies in FIGS. 3 to 13.

(3) Third Embodiment

FIGS. 14A to 14L are cross-sectional views showing processes for manufacturing a semiconductor device according to a third embodiment of the present invention. Note that, in FIGS. 14A to 14L, the same reference numerals as those of the second embodiment denote elements described in the second embodiment, and descriptions thereof will be omitted below.

In the step of FIG. 2C of the second embodiment, the third conductive plugs 36a were formed by polishing the glue film 35 and the plug conductive film 36 by the CMP method.

However, the polishing speeds of the slurry used in this CMP for the glue film 35 and the plug conductive film 36 are faster than that of the base insulating film 15. Therefore, it is difficult to align heights of the respective upper surfaces of the third conductive plugs 36a and the base insulating film 15 at the time when the CMP is finished.

Figure 14A:
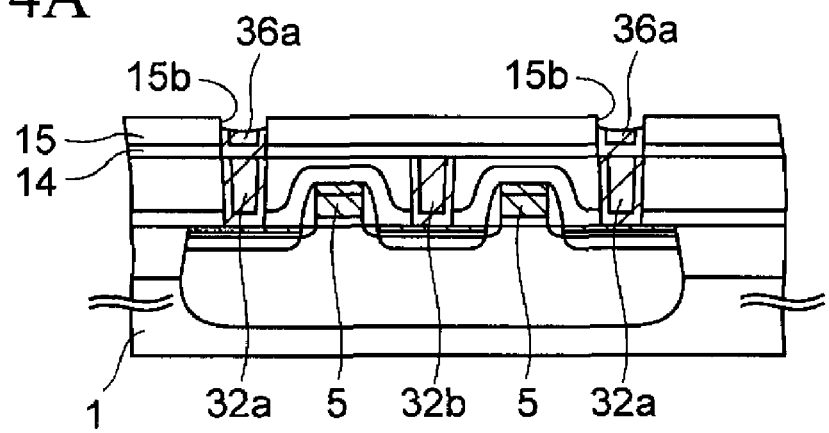
FIGS. 14A to 14L are cross-sectional views showing processes of manufacturing a semiconductor device according to a third embodiment of the present invention.

Consequently, as shown in FIG. 14A, recesses 15b are actually formed in the base insulating film 15 after the above-described CMP is completed, and the height of each upper surface of the third conductive plug 36a is made lower than that of the base insulating film 15. The depth of each recess 15b is 20 to 50 nm, and is typically about 50 nm.

However, when such recesses 15b are present, the crystalline orientation of the lower electrodes 23a and the capacitor dielectric films 24a is disturbed, and this causes a problem that ferroelectric characteristics of the capacitor dielectric films 24a are deteriorated.

To solve this problem, following steps are carried out in the present embodiment.

Figure 14B:
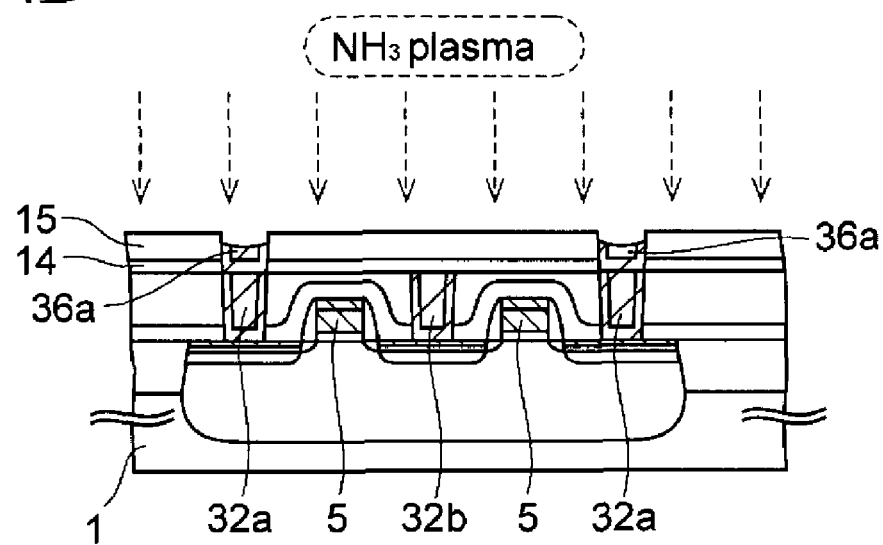

Firstly, as shown in FIG. 14B, ammonia plasma processing is carried out on the base insulating film 15 to bond an NH group with oxygen atom on the surface of the base insulating film 15.

Equipment used for this ammonia plasma processing is, for example, a parallel plate-type plasma processing equipment having an opposing electrode in a position away from the silicon substrate 1 by approximately 9 mm (350 mils). Then, this processing is carried out in the following manner. Specifically, while maintaining the substrate temperate at 400° C. under the pressure of 266 Pa (2 Torr), an ammonia gas is supplied to the inside of a chamber with a flow rate of 350 sccm, and high frequency power of 13.56 MHz and 350 kHz are respectively supplied, for 60 seconds, to the silicon substrate 1 with power of 100 W and to the above-described opposing electrode with power of 55 W.

Figure 14C:
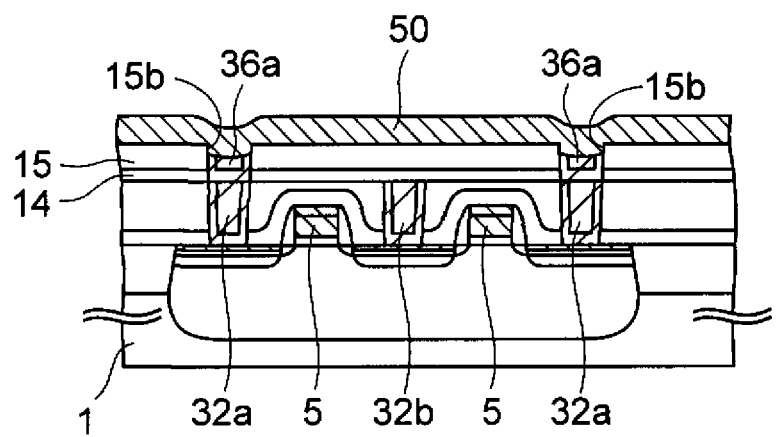

Subsequently, as shown in FIG. 14C, a titanium film is formed with a thickness of 100 to 300 nm, for example approximately 100 nm, as a planarization conductive film 50 on the base insulating film 15 and the third conductive plugs 36a, and the recesses 15b are completely embedded with this planarization conductive film 50.

The film-forming conditions for the planarization conductive film 50 are not particularly limited. In the present embodiment, by using a sputtering equipment in which a distance between a silicon substrate 1 and a titanium target is set to be 60 mm, the planarization conductive film 50 is formed under the following conditions. Specifically, under the argon atmosphere of the pressure of 0.15 Pa, sputtering DC power at 2.6 kW is applied for 35 seconds, and the substrate temperature is room temperature (20° C.)

In addition, since the ammonia plasma processing (see FIG. 14B) is carried out in advance to bond the NH group with each oxygen atom on the surface of the base insulating film 15 before the planarization conductive film 50 is formed, titanium atoms deposited on the base insulating film 15 are not easily captured by the oxygen atoms on the surface of the base insulating film 15. As a result, the titanium atoms can freely move on the surface of the base insulating film 15. Thus, it is made possible to form the planarization conductive film 50 formed of titanium, whose crystalline orientation is strongly self-aligned in a (002) direction.

Note that the planarization conductive film 50 is not limited to the titanium film, and any one of a tungsten film, a silicon film, and a copper film may be formed as the planarization conductive film 50.

After that, RTA with a substrate temperature of 650° C. is carried out on the planarization conductive film 50 in the nitrogen atmosphere to nitride the planarization conductive film 50 made of titanium, and thereby the planarization conductive film 50 is made of titanium nitride whose crystalline orientation is aligned in a (111) direction.

Here, due to the recesses 15b formed in the base insulating film 15 in the circumference of the third conductive plugs 36a, a concave portion is formed in the upper surface of the above-described planarization conductive film 50. However, when such a concave portion is formed, crystallinity of a ferroelectric film to be formed later above the planarization conductive film 50 may possibly be deteriorated.

Figure 14D:
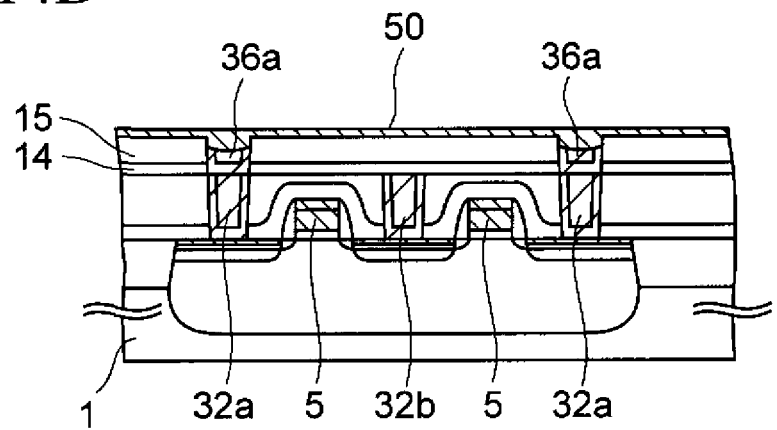

To deal with this problem, in the present embodiment, as shown in FIG. 14D, the upper surface of the planarization conductive film 50 is polished and planarized by the CMP method, and the above-described concave portion is removed. The slurry used in this CMP is not particularly limited. In the present embodiment, SSW2000 manufactured by Cabot Microelectronics Corporation is used as the slurry.

Incidentally, due to polishing error, the thickness of the planarization conductive film 50 after CMP varies within the surfaces of the silicon substrate or among a plurality of silicon substrates. Considering such variations, in the present embodiment, a target value of the thickness of the planarization conductive film 50 after CMP is set to be 50 to 100 nm, and more preferably 50 nm, by controlling a polishing time.

Incidentally, after CMP is carried out on the planarization conductive film 50 as described above, the crystals in a vicinity of the upper surface of the planarization conductive film 50 are in a deformed state due to polishing. However, when the capacitor lower electrode is formed above the planarization conductive film 50 of which crystals are thus deformed, the lower electrode is affected by the deformation, and crystallinity of the lower electrode is deteriorated. This leads to deterioration of the ferroelectric characteristics of the ferroelectric film thereon.

Figure 14E:
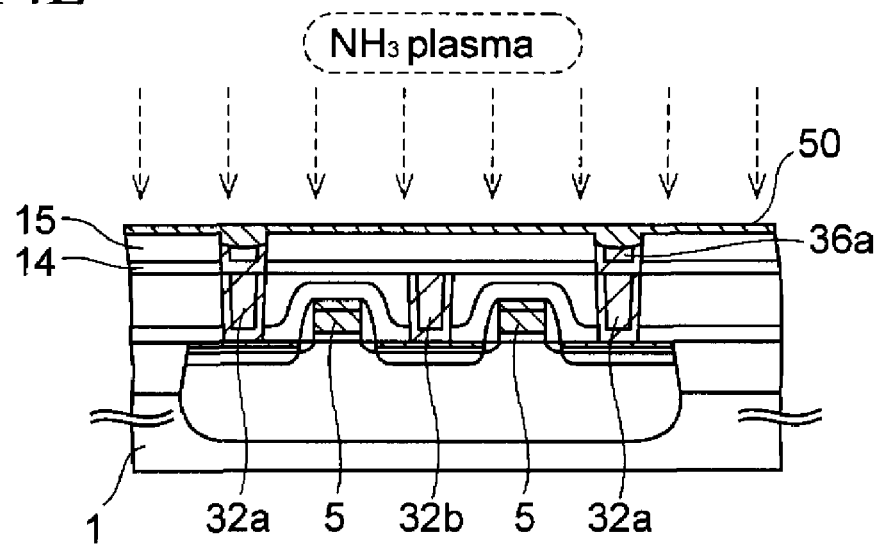

To avoid such an inconvenience, in the next step, as shown in FIG. 14E, the upper surface of the planarization conductive film 50 is exposed to ammonia plasma so that the deformation of the crystals of the planarization conductive film 50 would not affect the film thereon.

Figure 14F:
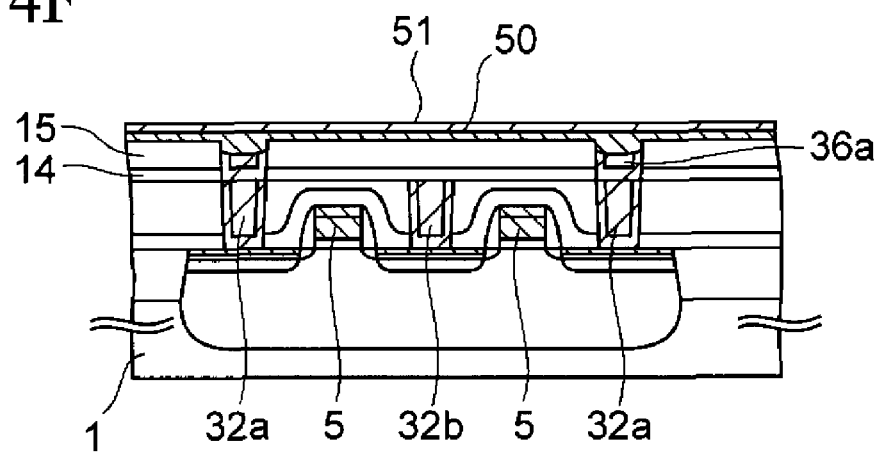

Next, as shown in FIG. 14F, an iridium film is formed as a conductive adhesion film 51 by the sputtering method on the planarization conductive film 50 in which the deformation of the crystals is resolved by the above-described ammonia plasma processing. The conductive adhesion film 51 functions as a film which enhances adhesion strength between upper and lower films. It is desirable that a thickness of the conductive adhesion film 51 be formed as thin as possible, for example, 20 nm or less, and more preferably 5 to 10 nm.

Figure 14G:
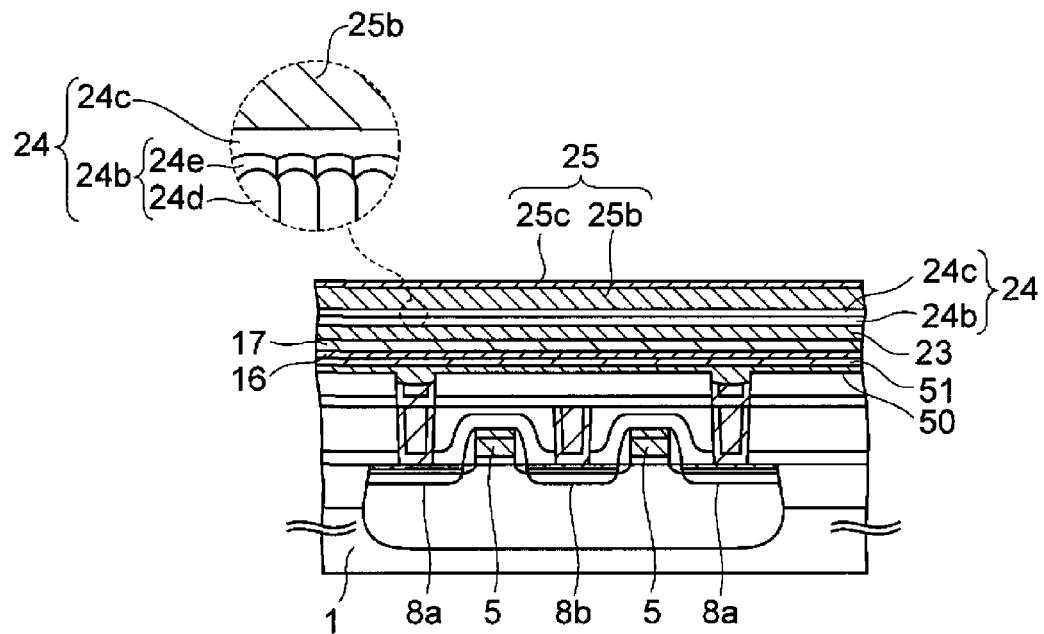

Next, films 16, 17, and 23 to 25 are stacked as shown in FIG. 14G by carrying out the steps of FIGS. 2E to 2L described in the second embodiment.

Incidentally, in this step, as in the case of the second embodiment, the first ferroelectric film 24b is constructed from the main ferroelectric film 24d and the auxiliary ferroelectric film 24e. Of these films 24d and 24e, the main ferroelectric film 24d is formed by the MOCVD method, and the auxiliary ferroelectric film 24e is formed by the sol-gel method.

Then, by forming the second ferroelectric film 24c on the first ferroelectric film 24b by the sputtering method, the ferroelectric film 24 having the favorable ferroelectric characteristics as in FIGS. 3 to 13 is formed.

As the conductive metal oxide film 25b, a laminated film formed of the first and second conductive metal oxide films 25d and 25e (see FIG. 2K) made of iridium oxide is formed by the sputtering method. Of these films 25d and 25e, the first conductive metal oxide film 25d is already crystallized at the time of forming thereof, and the oxygen loss in the ferroelectric film 24c is compensated by carrying out RTA in the atmosphere containing an oxidizing gas after forming the first conductive metal oxide film 25d, by using the same conditions as those of the second embodiment.

Figure 14H:
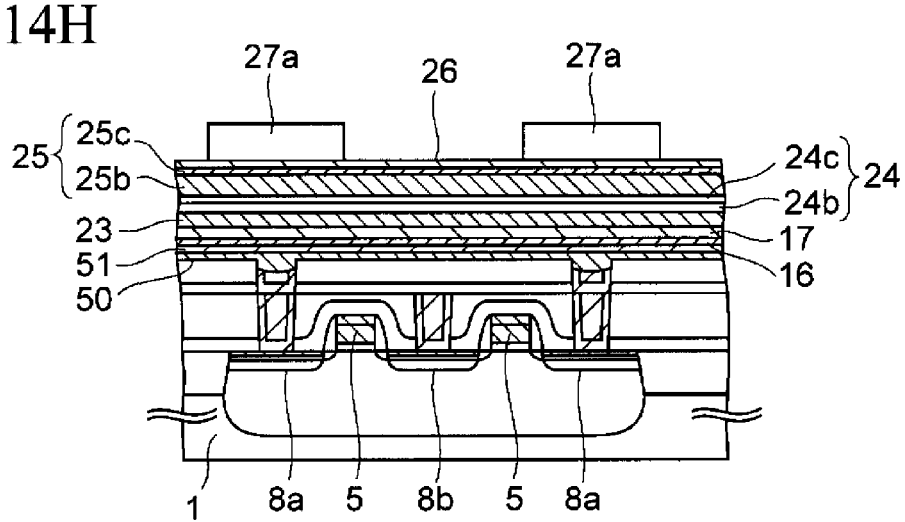

Subsequently, by carrying out the steps described in FIGS. 2M and 2N, as shown in FIG. 14H, a first mask material layer 26 and second hard masks 27a are formed on the second conductive film 25.

Figure 14I:
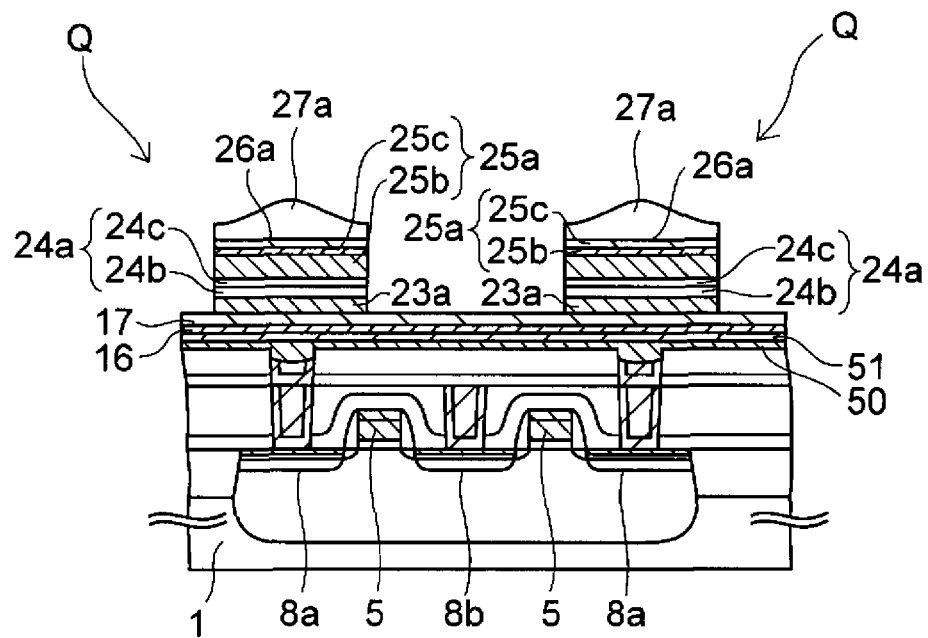

Next, as shown in FIG. 14I, the first mask material layer 26 is etched by using the second hard masks 27a as masks to form first hard masks 26a.

After that, portions of the second conductive film 25, the ferroelectric film 24, and the first conductive film 23 which are not covered with the first and second hard masks 26a and 27a are dry-etched. By this etching, capacitors Q each provided with a lower electrode 23a, a capacitor dielectric film 24a, and an upper electrode 25a are formed.

In this etching, as in the case of the first embodiment, the mixed gas of HBr and oxygen is used as an etching gas for the first and second conductive films 23 and 25, while the mixed gas of chlorine and argon is used as an etching gas for the ferroelectric film 24.

Figure 14J:
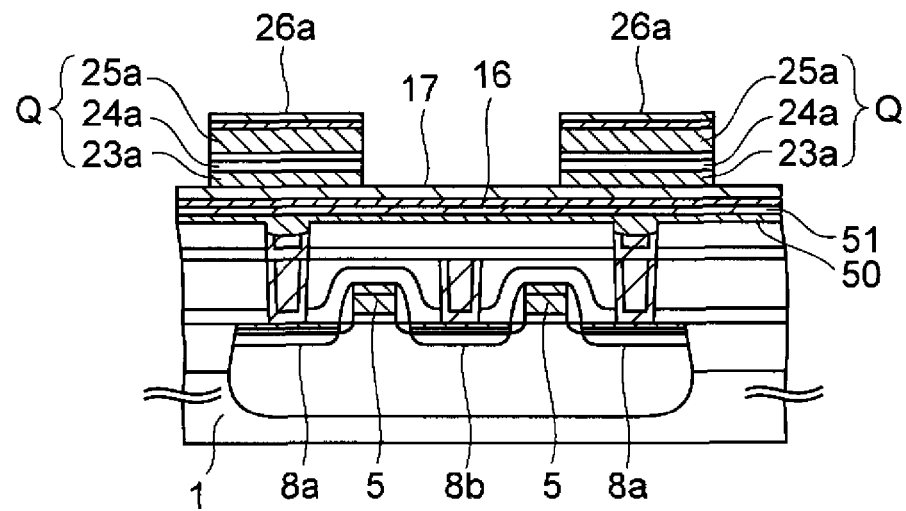

Subsequently, as shown in FIG. 14J, the second hard mask 27a made of silicon oxide is removed by wet etching using the mixed solution of hydrogen peroxide, ammonia, and water as an etching solution. Incidentally, the second hard masks 27a may be removed by dry etching.

Figure 14K:
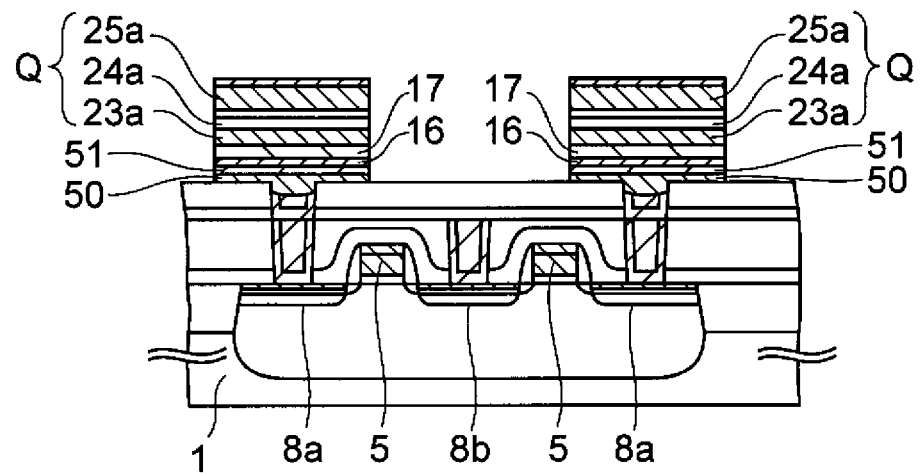

Next, steps for obtaining a cross-sectional structure shown in FIG. 14K will be described.

Firstly, by using the first hard masks 26a as masks, the conductive oxygen barrier film 17, the base conductive film 16, the conductive adhesion film 51, and the planarization conductive film 50 are etched, and these films are left only under each capacitor Q. This etching is carried out by dry etching, and the mixed gas of argon and chlorine, for example, is used as an etching gas therefor.

In addition, the first hard masks 26a are also etched by this etching gas. Thereby, the first hard masks 26a are removed at the time when this etching is finished, and the upper surfaces of the respective upper electrodes 25a are exposed.

Figure 14L:
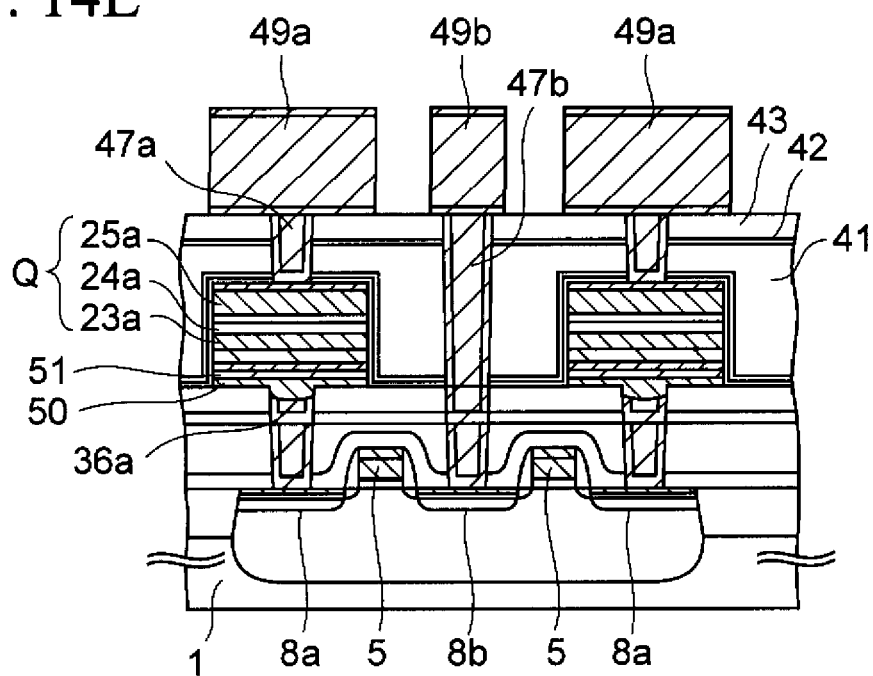

Thereafter, a basic structure of the semiconductor device according to the present embodiment as shown in FIG. 14L is completed by carrying out the steps of FIGS. 2R to 2X described in the first embodiment.

According to the above-described present embodiment, as described with reference to FIG. 14C, the recesses 15b formed in the circumference of the third conductive plugs 36a by CMP are embedded with the planarization conductive film 50, and the planarization conductive film 50 is further planarized by carrying out CMP.

With this process, the lower electrode 23a (see FIG. 14L) formed above the planarization conductive film 50 is made preferably flat, and thus the crystalline orientation of the lower electrodes 23a is made preferable. Moreover, the crystalline orientation of the capacitor dielectric films 24a is improved by an effect of the crystalline orientation of the lower electrodes 23a, and ferroelectric characteristics of the capacitor dielectric films 24a, such as switching charge, are improved.

(4) Fourth Embodiment

Figure 15:
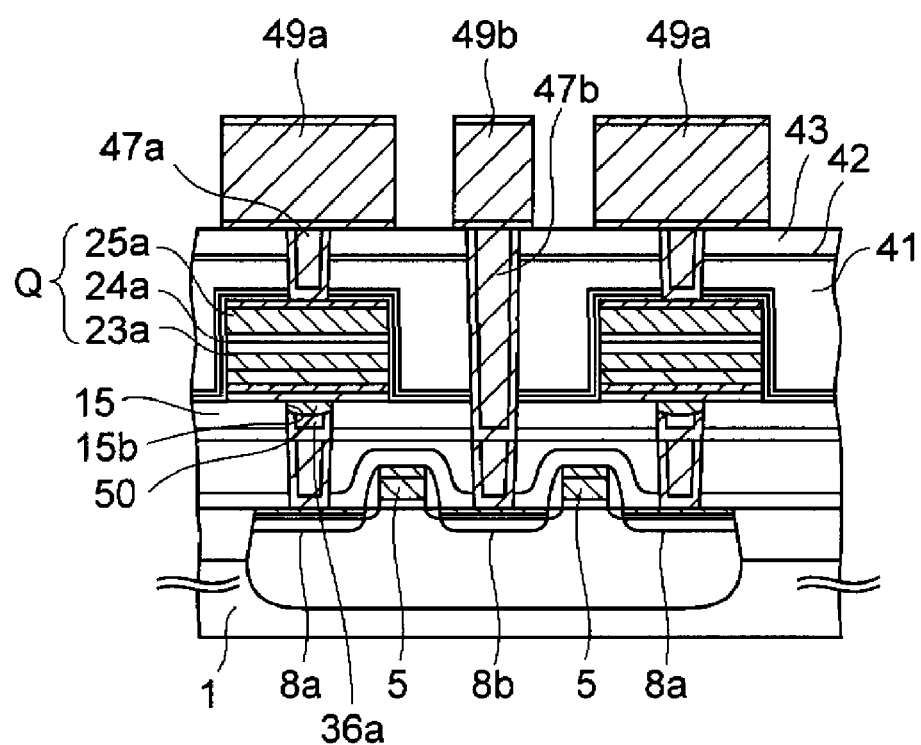
FIG. 15 is a cross-sectional view of a semiconductor device according to a fourth embodiment of the present invention.

FIG. 15 is a cross-sectional view of a semiconductor device according to the present embodiment.

The present embodiment is different from the second embodiment in that, in the present embodiment, a planarization conductive film 50 is removed from an upper surface of a base insulating film 15 in the CMP step of FIG. 14D, and that the planarization conductive film 50 is left only on the third conductive plug 36a in the recess 15b. Except for this point, the present embodiment is the same as the second embodiment.

Even when the planarization conductive film 50 is completely removed from the upper surface of the base insulating film 15 by CMP, the thin film thickness of the planarization conductive film 50 allows the amount of over polishing at the time of CMP to be less. Thus, a concave portion is hardly formed on the upper surface of the planarization conductive film 50 left in the recess 15b. Accordingly, the upper surfaces of the planarization conductive film 50 and of the base insulating film 15 constitute a flat and continuous plane, so that crystallinity of lower electrodes 23a and that of capacitor dielectric films 24a is made favorable.

(5) Fifth Embodiment

Figure 16A:
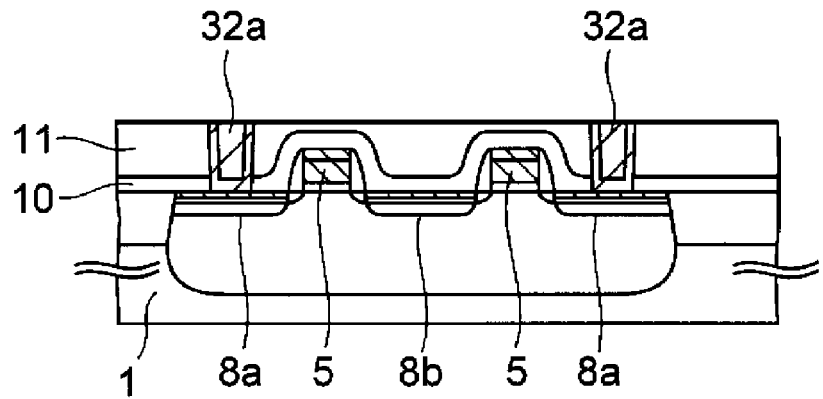
FIGS. 16A to 16Q are cross-sectional views showing processes of manufacturing a semiconductor device according to a fifth embodiment of the present invention.
Figure 16B:
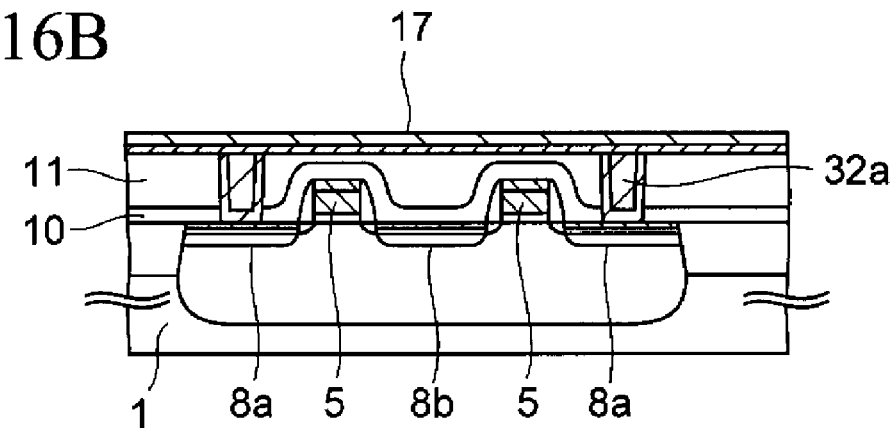
Figure 16C:
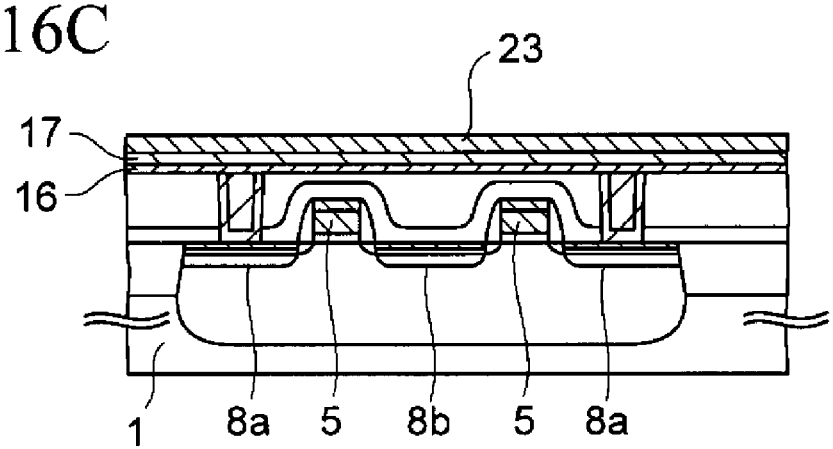
Figure 16D:
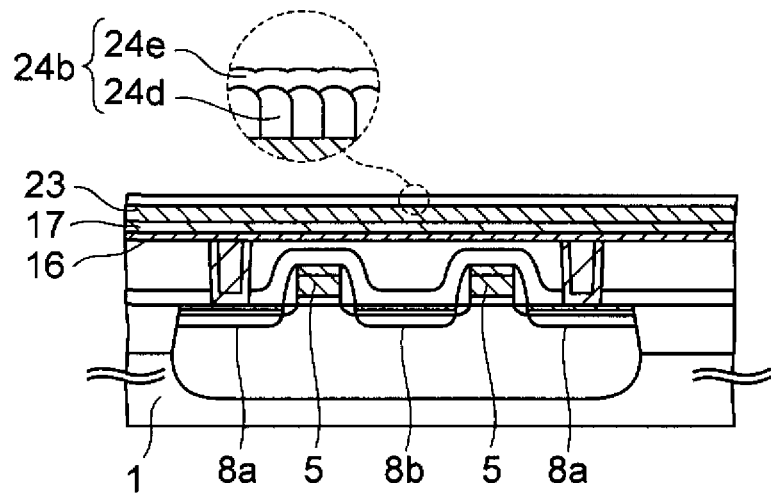
Figure 16E:
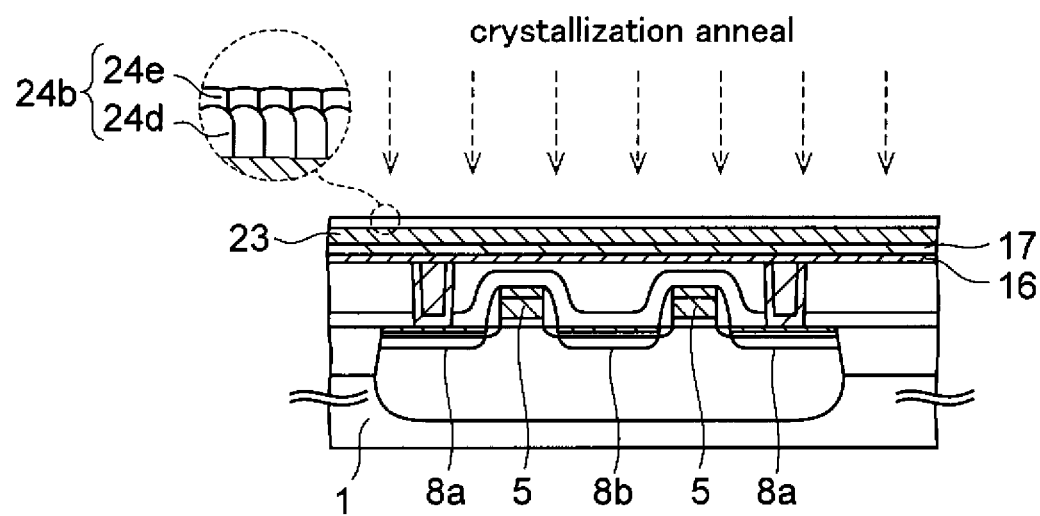
Figure 16F:
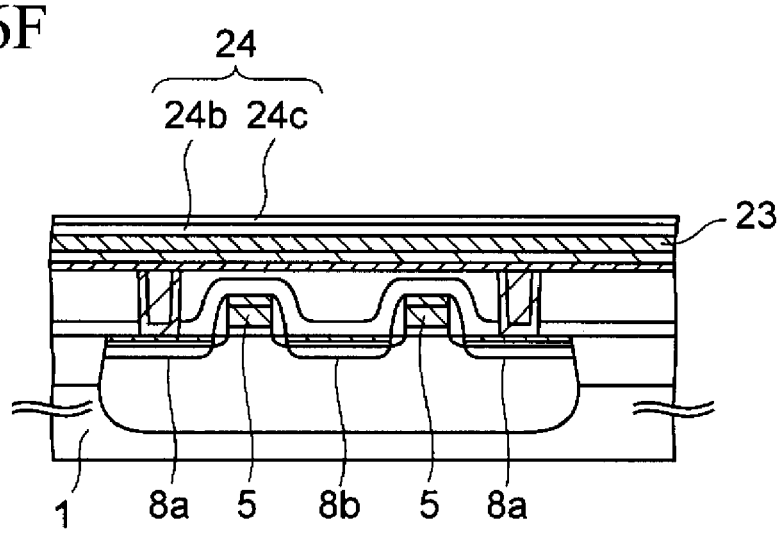
Figure 16G:
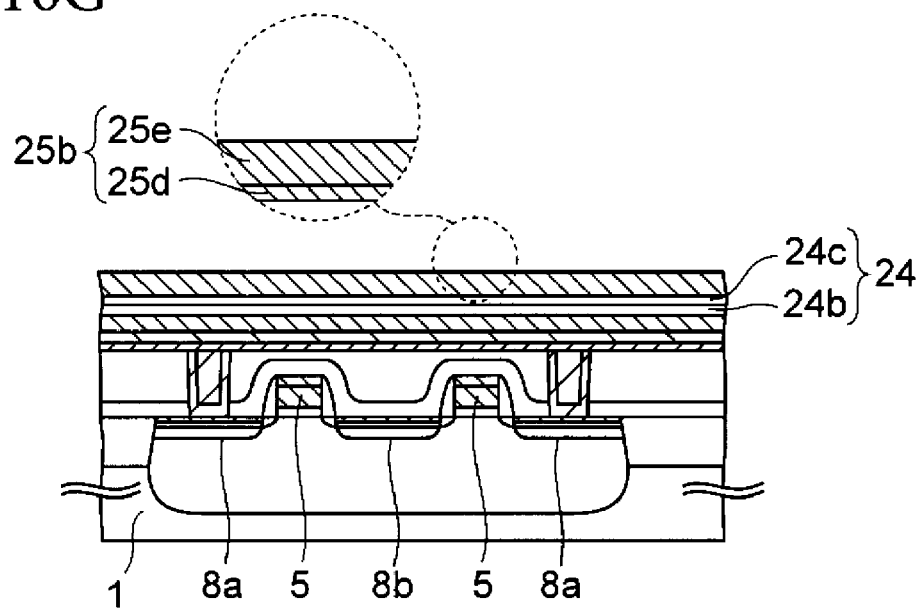
Figure 16H:
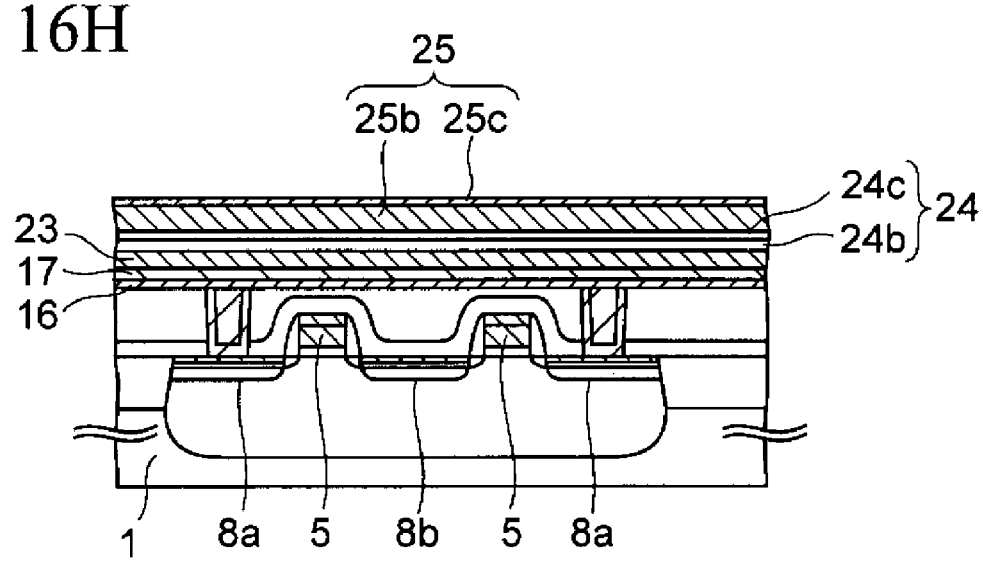
Figure 16I:
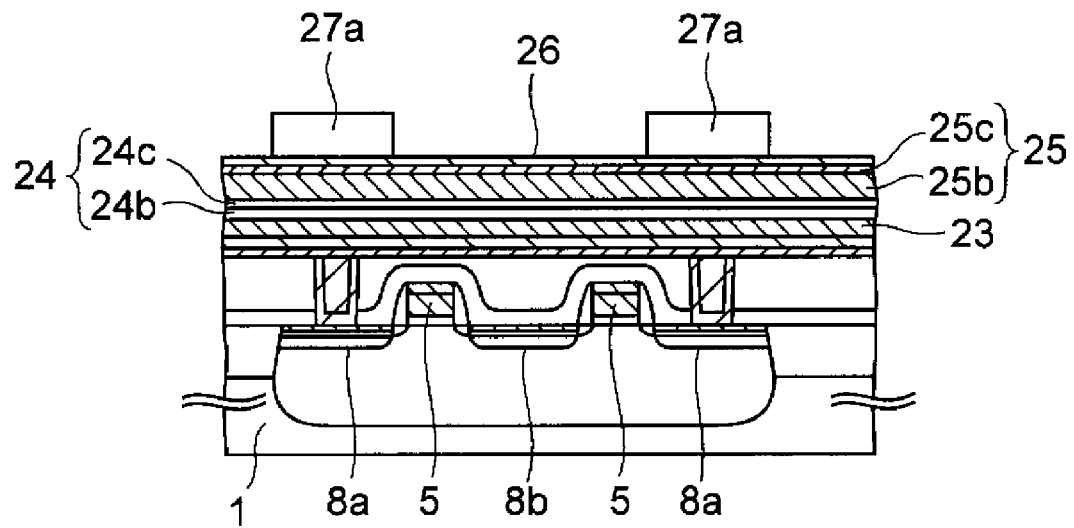
Figure 16J:
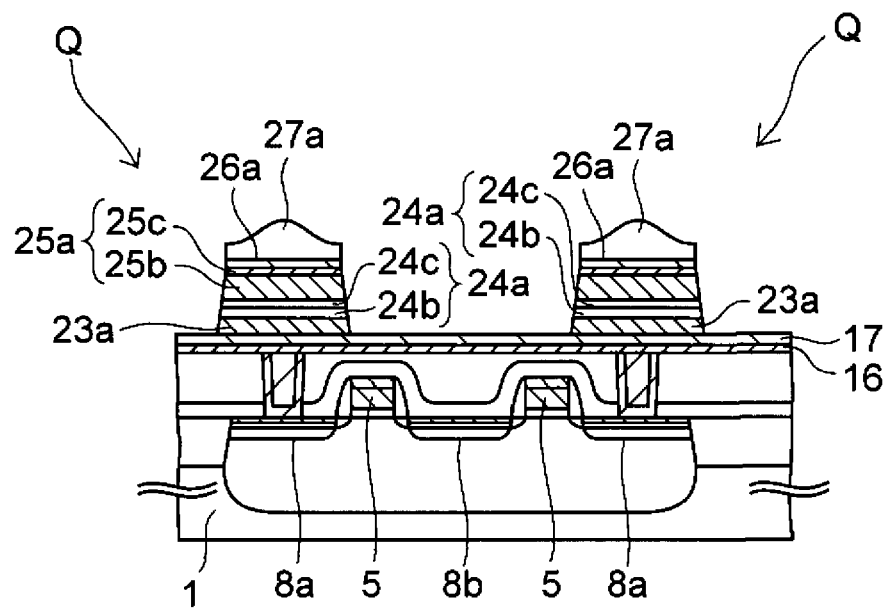
Figure 16K:
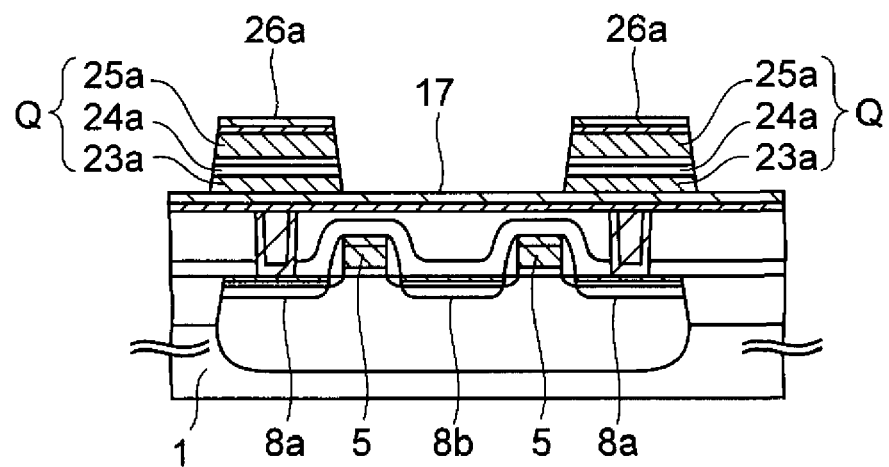
Figure 16L:
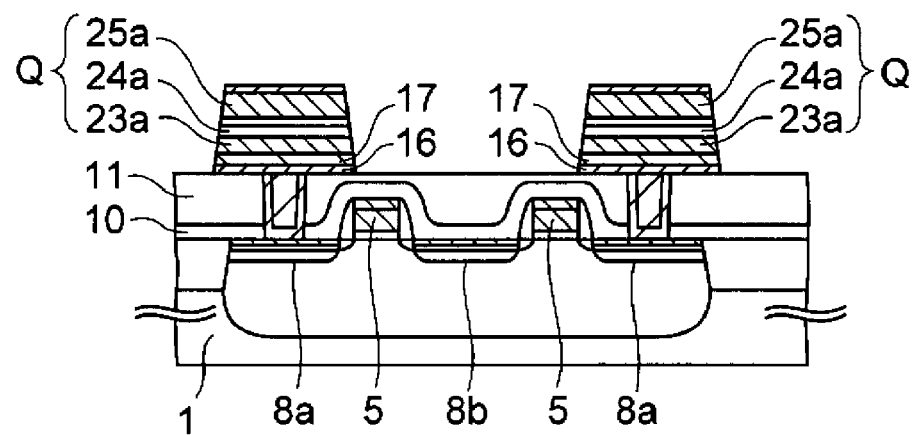
Figure 16M:
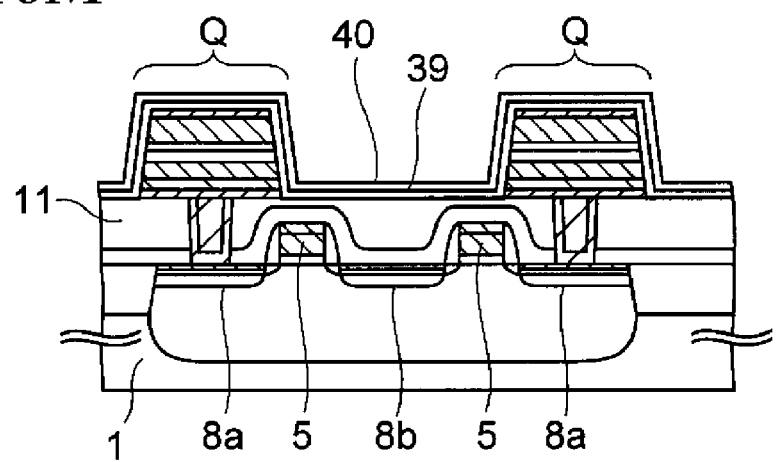
Figure 16N:
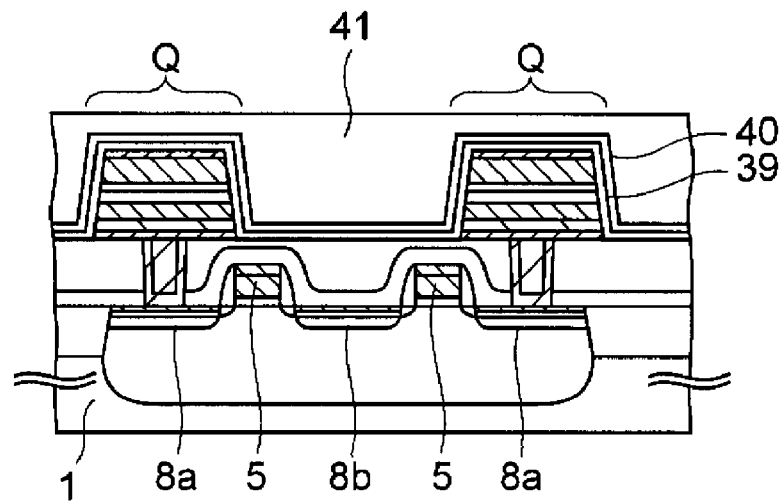
Figure 16O:
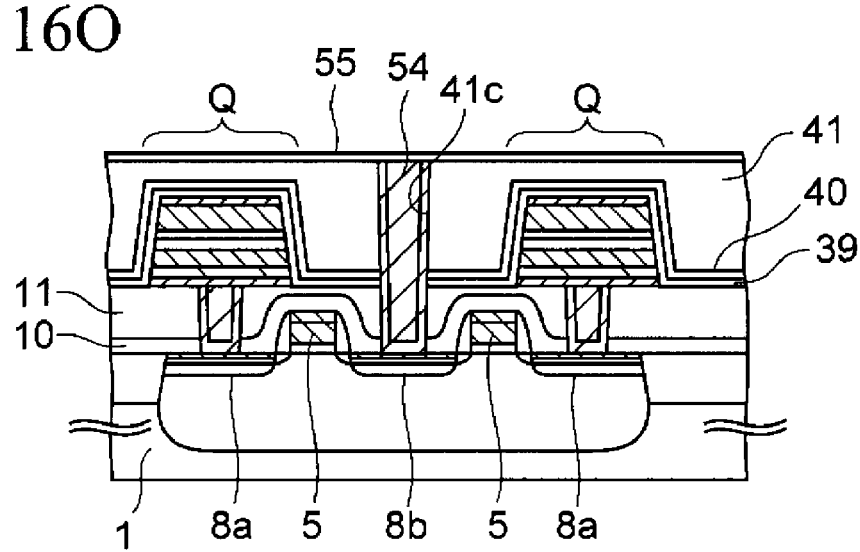
Figure 16P:
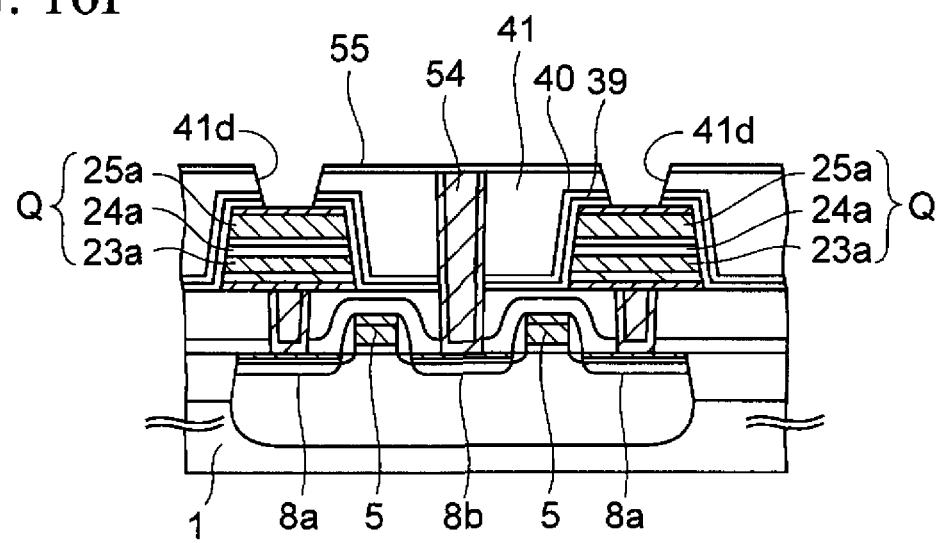
Figure 16Q:
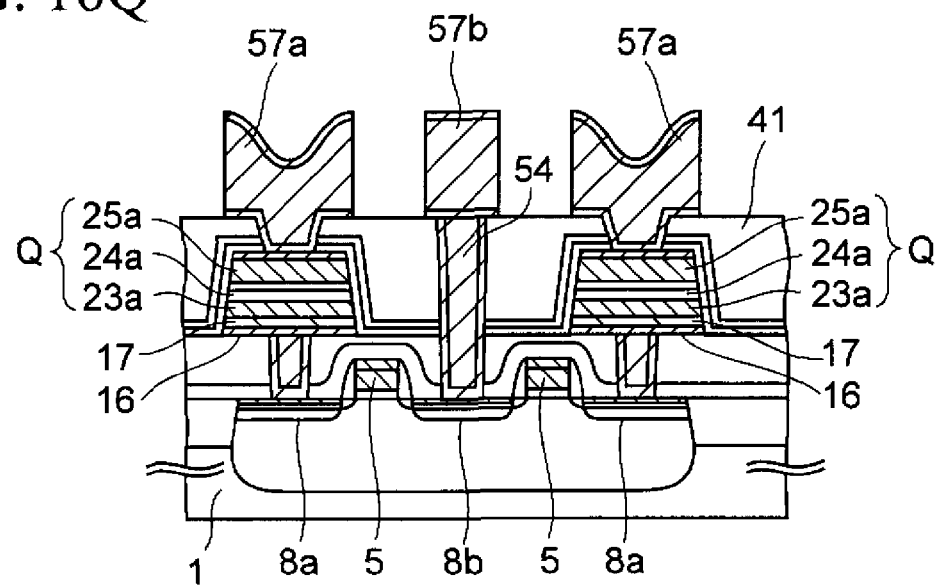

FIGS. 16A to 16Q are cross-sectional views showing processes for manufacturing a semiconductor device according to the present embodiment. Note that, in FIGS. 16A to 16Q, the same reference numerals as those of the second embodiment denote elements described in the second embodiment, and descriptions thereof will be omitted below.

Firstly, steps for obtaining a cross-sectional structure shown in FIG. 16A will be described.

By carrying out the steps described in FIG. 2A in the second embodiment, a cover insulating film 10 and a first interlayer insulating film 11 are formed on a silicon substrate 1. Then, these insulating films are patterned to form a contact hole on the first source/drain region 8a.

Furthermore, after a glue film and a tungsten film are sequentially formed in each contact hole, the excessive glue film and tungsten film on the first interlayer insulating film 11 are polished and removed by the CMP method, and theses films are left only in the contact holes as first conductive plugs 32a.

Next, as shown in FIG. 16B, a titanium film is formed with a thickness of approximately 20 nm on each of the first interlayer insulating film 11 and the first conductive plugs 32a, and this titanium film is set to be a base conductive film 16.

Note that ammonia plasma processing may be carried out on each of the upper surfaces of the first interlayer insulating film 11 and the first conductive plugs 32a before the base conductive film 16 is formed. By carrying out this ammonia plasma processing, titanium atoms deposited on the first interlayer insulating film 11 are not easily captured by oxygen atoms on the surface of the insulating film 11. Therefore, the titanium atoms can freely move on the surface of the first interlayer insulating film 11, and thus the base conductive film 16 made of titanium, whose crystalline orientation is strongly self-aligned in a (002) direction, can be formed.

After that, RTA is carried out on the base conductive film 16 in the nitrogen atmosphere with a substrate temperature of 650° C. and a processing time of 60 seconds. With this process, the base conductive film 16 made of titanium is nitrided, and thus the base conductive film 16 is made of titanium nitride whose crystalline orientation is aligned in a (111) direction.

Furthermore, a titanium aluminum nitride film is formed with a thickness of 100 nm as a conductive oxygen barrier film 17 on the base conductive film 16 by a reactive sputtering method.

Next, as shown in FIG. 16C, an iridium film is formed with a thickness of approximately 100 nm on the conductive oxygen barrier film 17 by the sputtering method. This iridium film is used as a first conductive film 23. Incidentally, the film-forming conditions for the first conductive film 23 are described in the second embodiment by referring to FIG. 2G, and the description thereof will be omitted herein.

Subsequently, as shown in FIG. 16D, the main ferroelectric film 24d made of PZT, and the auxiliary ferroelectric film 24e made of PLZT are formed by carrying out the same steps as those shown in FIG. 2H of the second embodiment. As described in the second embodiment, the main ferroelectric film 24d is formed with a thickness of about 80 nm by the MOCVD method, and the auxiliary ferroelectric film 24e is formed with a thickness of about 20 nm by the sol-gel method for the purpose of embedding the unevenness of the upper surface of the main ferroelectric film 24d.

These main ferroelectric film 24d and the auxiliary ferroelectric film 24e constitute the first ferroelectric film 24b.

Next, as shown in FIG. 16E, crystallization anneal is carried out on the auxiliary ferroelectric film 24e in an oxygen-containing atmosphere in order to crystallize the auxiliary ferroelectric film 24e. The conditions for this crystallization anneal are described by referring to FIG. 2I in the second embodiment, and the description thereof will be omitted herein.

Next, as shown in FIG. 16F, a PZT film is formed with a thickness of 1 to 50 nm, more preferably 10 to 30 nm, as a second ferroelectric film 24c on the first ferroelectric film 24b by the sputtering method.

With the steps described above, the ferroelectric film 24 constructed from the first and second ferroelectric films 24b and 24c is formed on the first conductive film 23.

As described in the first embodiment, the second ferroelectric film 24c is formed for the purpose of planarizing the upper surface of the ferroelectric film 24. For this reason, it is preferable that a thickness of the second ferroelectric film 24c be made thinner than that of the first ferroelectric film 24b so as to burden the first ferroelectric film 24b with the most of the ferroelectric characteristics.

Next, as shown in FIG. 16G, by carrying out the same steps as those of FIG. 2K of the second embodiment, a conductive metal oxide film 25b is formed on the ferroelectric film 24. As described in the second embodiment, the conductive metal oxide film 25b is formed of a first conductive metal oxide film 25d which is crystallized at the time of forming thereof, and an amorphous second conductive metal oxide film 25e. After the first conductive metal oxide film 25d is formed, RTA is carried out on the first conductive metal oxide film 25d in the atmosphere containing an oxidizing gas, so that the oxygen loss in the ferroelectric film 24 is compensated, and that the first conductive metal oxide film 25d is completely crystallized. The conditions for this RTA are described in the second embodiment, and the description thereof will be omitted.

Next, as shown in FIG. 16H, an iridium film is formed with a thickness of 50 to 100 nm as a conductivity enhancing film 25c on the conductive metal oxide film 25b by the sputtering method, and this conductivity enhancing film 25c and the conductive metal oxide film 25d are together set to be a second conductive film 25.

Next, as shown in FIG. 16I, a first mask material layer 26 made of titanium nitride is formed on the second conductive film 25 by the sputtering method.

In addition, a silicon oxide film is formed on the first mask material layer 26 by the plasma CVD method using a TEOS gas, and the silicon oxide film is patterned into second hard masks 27a.

Subsequently, as shown in FIG. 16J, the first mask material layer 26 is etched by using the second hard masks 27a as masks, and thereby first hard masks 26a are formed.

Next, portions of the second conductive film 25, the ferroelectric film 24, and the first conductive film 23 which are not covered with the first and second hard masks 26a and 27a are dry-etched. By this etching, capacitors Q provided with a lower electrode 23a, a capacitor dielectric film 24a, and an upper electrode 25a are formed.

Incidentally, the conditions for this dry etching are described in the second embodiment with reference to FIG. 2O, and the description thereof will be omitted.

In addition, even when the above-described dry etching is carried out, the conductive oxygen barrier film 17 is left on the entire surface of the base conductive film 16 without being etched.

Next, as shown in FIG. 16K, the second hard masks 27a are removed by wet etching or dry etching. In the case of wet etching, the mixed solution of hydrogen peroxide, ammonia and water is used as an etching solution.

Subsequently, steps for obtaining a cross-sectional structure shown in FIG. 16L will be described.

Firstly, by using the first hard masks 26a as masks, the base conductive film 16 and the conductive oxygen barrier film 17 are dry-etched by using the mixed gas of argon and chlorine as an etching gas, and these films are left only under each capacitor Q.

Since the first hard masks 26a are also etched by the etching gas, the first hard masks 26a are removed at the time when the etching is finished, and the upper surface of each upper electrode 25a is exposed.

Next, as shown in FIG. 16M, to protect each capacitor Q from reductants such as hydrogen, an alumina film is formed with a thickness of approximately 20 nm as a first capacitor protective insulating film 39 on the entire upper surface of the silicon substrate 1.

Then, to recover damages received in the capacitor dielectric film 24a due to dry etching (see FIG. 16J) at the time of forming the capacitor Q and at the time of forming the first capacitor protective insulating film 39 by the sputtering method, recovery anneal is carried out on the capacitor dielectric films 24a in the atmosphere containing oxygen. This recovery anneal is carried out for approximately 60 minutes under the condition with a substrate temperature of 550 to 700° C., for example 650° C., in a furnace.

After that, an alumina film is formed with a thickness of approximately 20 nm on the first capacitor protective insulating film 39 by the CVD method, and this alumina film is set to be a second capacitor protective insulating film 40.

Next, as shown in FIG. 16N, a silicon oxide film is formed as a second interlayer insulating film 41 on the second capacitor protective insulating film 40 by the plasma CVD using the TEOS gas as a reactant gas. In the reactant gas, an oxygen gas and a helium gas are also included. In addition, the second interlayer insulating film 41 has a thickness of 1500 nm on the planarized surface of the silicon substrate 1.

Instead of the silicon oxide film, an insulating inorganic film may be formed as the second interlayer insulating film 41.

Thereafter, the surface of the second interlayer insulating film 41 is polished and planarized by the CMP method.

Next, steps for obtaining a cross-sectional structure shown in FIG. 16O will be described.

Firstly, the surface of the second interlayer insulating film 41 is exposed to $N_2O$ plasma. Thereby, moisture remaining in the second interlayer insulating film 41 is removed, and moisture is prevented from again absorbed into the second interlayer insulating film 41.

Note that $N_2$ plasma processing may be carried out as this dehydration processing.

Next, the cover insulating film 10, the first and second interlayer insulating films 11 and 41, and the first and second capacitor protective insulating films 39 and 40 are patterned. Thereby, a first hole 41c is formed in these insulating films on the second source/drain region 8b.

Then, after a glue film and a tungsten film are sequentially formed in the first hole 41c, the excessive glue film and tungsten film on the second interlayer insulating film 41 are polished and removed by the CMP method, and these films are left as a second conductive plug 54 only in the first hole 41c.

The second conductive plug 54 constitutes one part of a bit line, and is electrically connected to the second source/drain region 8b.

Incidentally, the second conductive plug 54 is mainly formed of tungsten which is easily oxidized. For this reason, contact defect is easily caused when the second conductive plug 54 is oxidized during the manufacturing processes.

To deal with this problem and to prevent the second conductive plug 54 from being oxidized, a silicon oxynitride film is formed with a thickness of approximately 100 nm on each of the upper surfaces of the second interlayer insulating film 41 and the second conductive plug 54. This silicon oxynitride film is set to be an antioxidant insulating film 55.

Next, as shown in FIG. 16P, the first and second capacitor protective insulating films 39 and 40, the second interlayer insulating film 41, and the antioxidant insulating film 55 are patterned. Thereby, second holes 41d are formed in these insulating films on the upper electrode 25a.

After the second hole 41d is formed, in order to recover damages received in the capacitor dielectric film 24a during the above steps, anneal may be carried out in the atmosphere containing oxygen. Even when such anneal is carried out, the oxidation of the second conductive plug 54 is prevented by the antioxidant insulating film 55.

After that, the antioxidant insulating film 55 is etched back and removed.

Next, as shown in FIG. 16Q, a metal laminated film is formed on each of the upper surfaces of the second interlayer insulating film 41 and the second conductive plug 54 by the sputtering method. This metal laminated film is then pattered into a metal wiring 57a and a conductive pad 57b used for a bit line.

The metal laminated film is configured by forming films in the order of, for example, a titanium film with a thickness of 60 nm, a titanium nitride film with a thickness of 30 nm, a copper-containing aluminum film with a thickness of 400 nm, and a titanium film with a thickness of 5 nm, and a titanium nitride film with a thickness of 70 nm.

By these steps, a basic structure of the semiconductor device according to the present embodiment is completed.

In the above-described embodiment, the third conductive plugs 36a and the base insulating film 15 formed in the second embodiment are not formed. Thus, the steps can be made simpler than those of the second embodiment.

Furthermore, the second conductive plug 54 constituting one part of the bit line has only one stage on the second source/drain region 8b. Hence, the semiconductor of the present embodiment is made simpler than that of the second embodiment in which the two stage conductive plugs 32b and 47b are formed.

As described above, according to the present invention, costs for forming a semiconductor device can be reduced, since the first ferroelectric film is formed by the film-forming method including the step of forming a film by the sol-gel method. In addition, the ferroelectric characteristics of the capacitor can be improved by forming the second ferroelectric film by the sputtering method.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor device, comprising:
    a semiconductor substrate;
    an interlayer insulating film formed over the semiconductor substrate; and
    a capacitor formed on the interlayer insulating film,
    wherein the capacitor including a lower electrode, a capacitor dielectric film made of a ferroelectric material, and an upper electrode,
    wherein the capacitor dielectric film includes a first ferroelectric film and a second ferroelectric film formed on the first ferroelectric film,
    wherein the first ferroelectric film includes a first film and a second film formed on the first film, the second film being thinner than the first film and burying an unevenness of an upper surface of the first film, and
    wherein the second ferroelectric film being doped with an additive element and being thinner than the first ferroelectric film.

2. The semiconductor device according to claim 1,
    wherein the first film being not doped with the additive element.

3. The semiconductor device according to claim 2, wherein an unevenness of an upper surface of the second film is smaller than the unevenness of the first film.

4. The semiconductor device according to claim 1, wherein the additive element is any one of elements of strontium, calcium, niobium, iridium and lanthanum.

5. The semiconductor device according to claim 1, wherein the first film is formed by any one of a MOCVD method and a MOD method, and the second film is formed by a sol-gel method.

6. The semiconductor device according to claim 5, wherein the second ferroelectric film is formed by a sputtering method.

* * * * *